(12) United States Patent
Oszinda et al.

(10) Patent No.: US 11,322,655 B2
(45) Date of Patent: May 3, 2022

(54) METHOD FOR PRODUCING AN OPTOELECTRONIC COMPONENT, AND OPTOELECTRONIC COMPONENT

(71) Applicant: Osram OLED GmbH, Regensburg (DE)

(72) Inventors: Thomas Oszinda, Penang (MY); Attila Molnar, Penang (MY); Fabian Kopp, Penang (MY)

(73) Assignee: OSRAM OLED GmbH, Regensburg (DE)

( * ) Notice: Subject to any disclaimer, the term of this patent is extended or adjusted under 35 U.S.C. 154(b) by 181 days.

(21) Appl. No.: 16/635,187

(22) PCT Filed: Jul. 5, 2018

(86) PCT No.: PCT/EP2018/068270
§ 371 (c)(1),
(2) Date: Jan. 30, 2020

(87) PCT Pub. No.: WO2019/025117
PCT Pub. Date: Feb. 7, 2019

(65) Prior Publication Data
US 2021/0091269 A1    Mar. 25, 2021

(30) Foreign Application Priority Data

Aug. 1, 2017   (DE) .................... 10 2017 117 414.1

(51) Int. Cl.
*H01L 33/32* (2010.01)
*H01L 33/62* (2010.01)
(Continued)

(52) U.S. Cl.
CPC .......... *H01L 33/38* (2013.01); *H01L 33/0093* (2020.05); *H01L 33/22* (2013.01);
(Continued)

(58) Field of Classification Search
CPC ....... H01L 33/46; H01L 33/22; H01L 33/382; H01L 33/38; H01L 33/0093; H01L 2933/0016; H01L 2933/0025; H01L 33/44
See application file for complete search history.

(56) References Cited

U.S. PATENT DOCUMENTS 9,478,707 B2 * 10/2016 Guenard ............... H01L 27/142
2011/0198609 A1    8/2011 Huang
(Continued)

FOREIGN PATENT DOCUMENTS

CN        104701434 A      6/2015
DE    102008038852 A1    12/2009
(Continued)

OTHER PUBLICATIONS

German search report issued for corresponding DE application No. 10 2017 117 414.1, dated Apr. 10, 2018, 11 pages (for informational purposes only).
(Continued)

*Primary Examiner* — Savitri Mulpuri
(74) *Attorney, Agent, or Firm* — Viering, Jentschura & Partner mbB

(57) ABSTRACT

Optoelectronic components may include a semiconductor layer sequence on an auxiliary carrier where the sequence includes at least one n-doped layer, at least one p-doped layer, and an active layer therebetween. A first insulation layer is arranged over a surface of the n-doped layer. A first and second metallization are arranged for contacting the p-doped and n-doped layers, and the metallizations are connected to each other. The first and second metallizations are spatially separated from one another. A second insulation layer electrically insulates the first and second metallizations.

17 Claims, 52 Drawing Sheets

(51) Int. Cl.
*H01L 33/38* (2010.01)
*H01L 33/46* (2010.01)
*H01L 33/00* (2010.01)
*H01L 33/22* (2010.01)

(52) U.S. Cl.
CPC ...... *H01L 33/46* (2013.01); *H01L 2933/0016* (2013.01); *H01L 2933/0025* (2013.01)

(56) References Cited

U.S. PATENT DOCUMENTS

| | | |
|---|---|---|
| 2012/0138969 A1 | 6/2012 | Moon et al. |
| 2012/0305967 A1 | 12/2012 | Yeh |
| 2015/0155331 A1* | 6/2015 | Guenard ............... H01L 33/005 257/93 |
| 2016/0172342 A1 | 6/2016 | Wu et al. |
| 2016/0218240 A1 | 7/2016 | Bouvier et al. |
| 2016/0218247 A1 | 7/2016 | Huang et al. |
| 2017/0012175 A1 | 1/2017 | Wang et al. |
| 2018/0315738 A1 | 11/2018 | Bono et al. |
| 2018/0331251 A1 | 11/2018 | Scholz et al. |

FOREIGN PATENT DOCUMENTS

| | | |
|---|---|---|
| DE | 112013007218 T5 | 4/2016 |
| DE | 102015119353 A1 | 5/2017 |
| EP | 2533313 A2 | 12/2012 |
| WO | 2013189949 A1 | 12/2013 |
| WO | 2017068029 A1 | 4/2017 |

OTHER PUBLICATIONS

International search report issued for corresponding PCT application No. PCT/EP2018/068270, dated Oct. 23, 2018, 14 pages (for informational purposes only).

German Office Action issued for the corresponding German patent application No. 11 2018 003 935.8, dated Oct. 19, 2021, 102 pages (for informational purposes only).

* cited by examiner

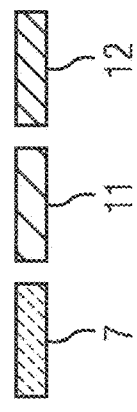
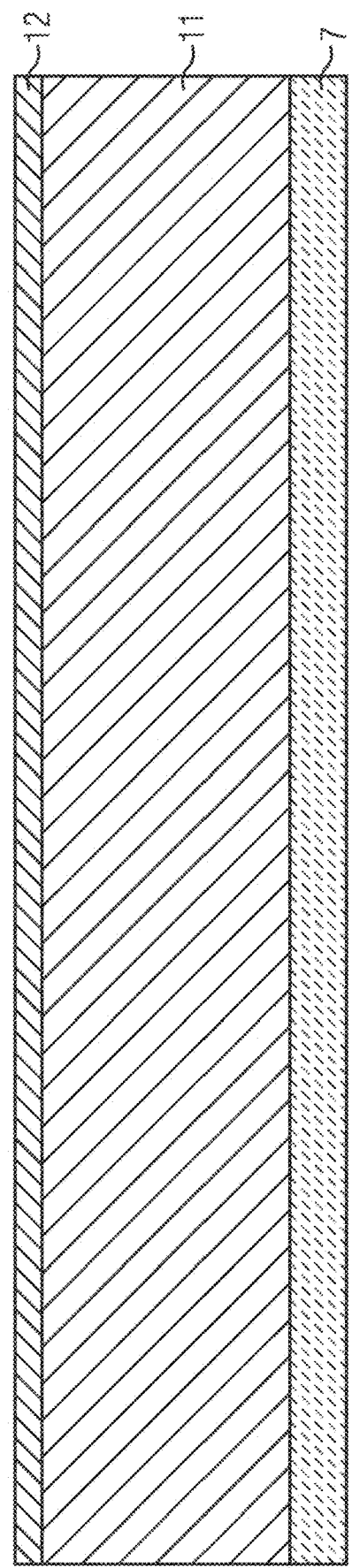
FIG 1

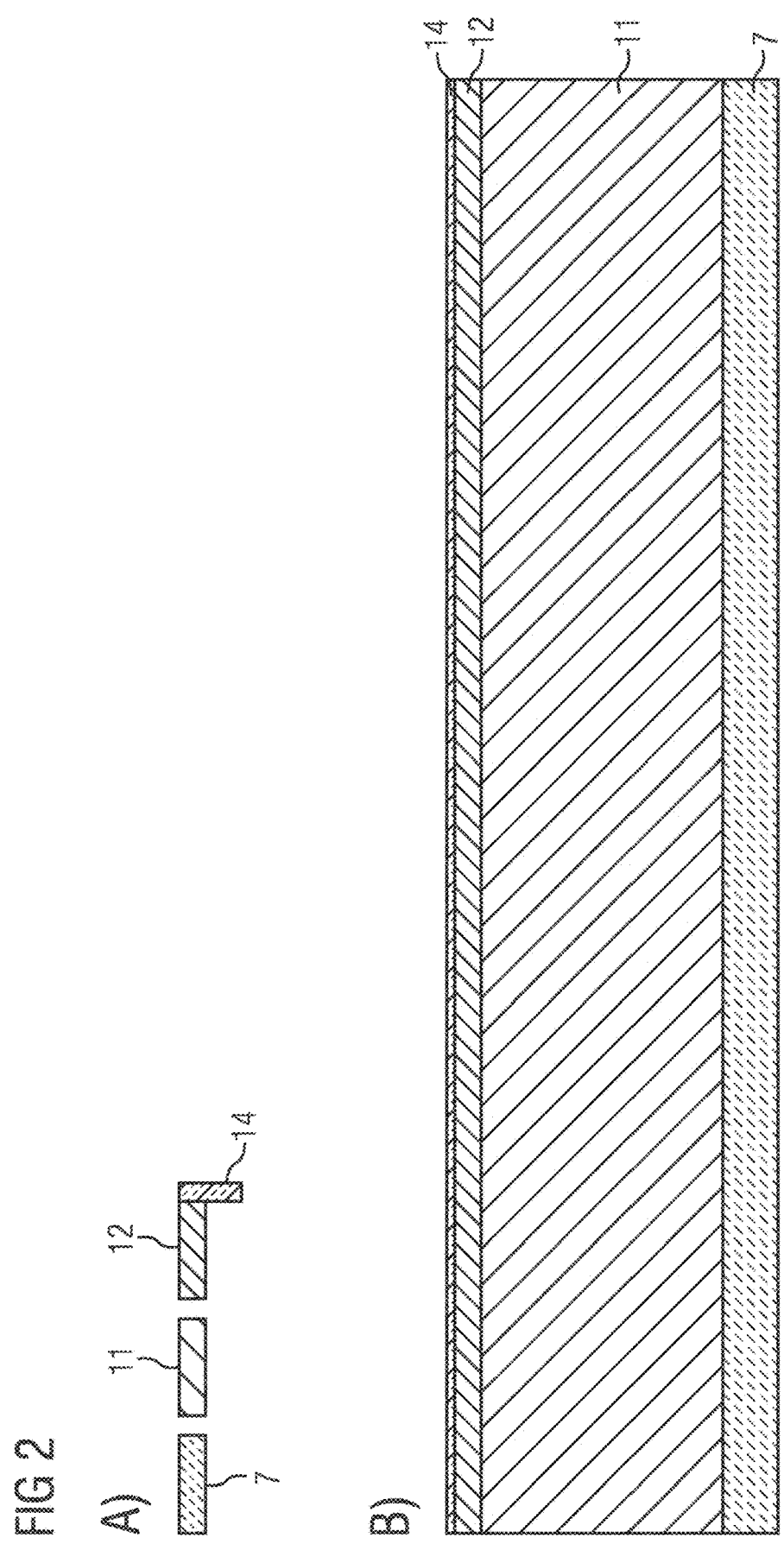

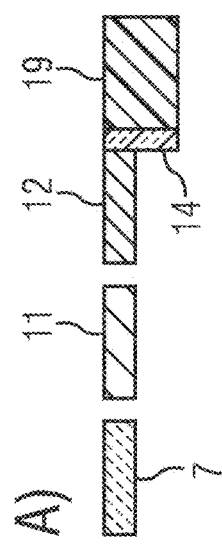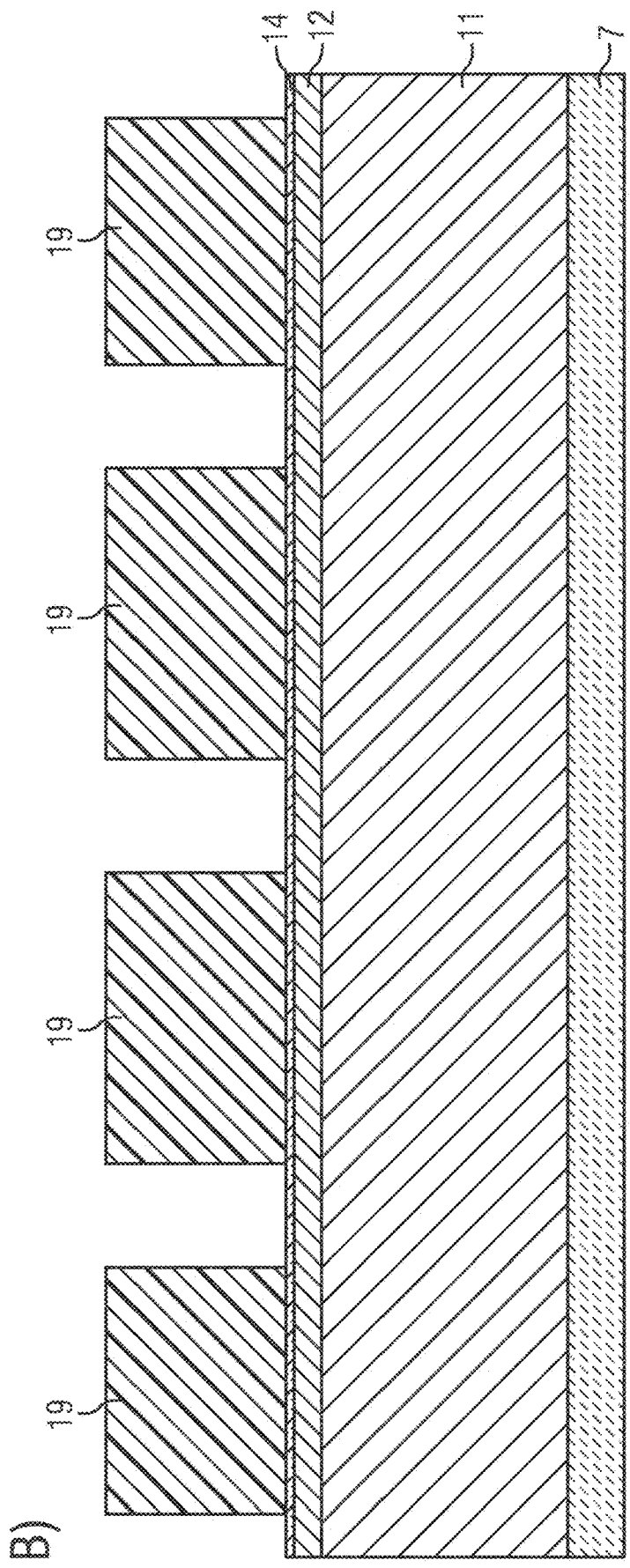

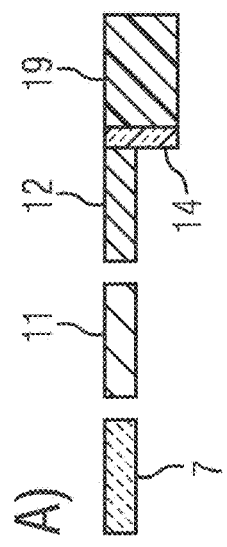
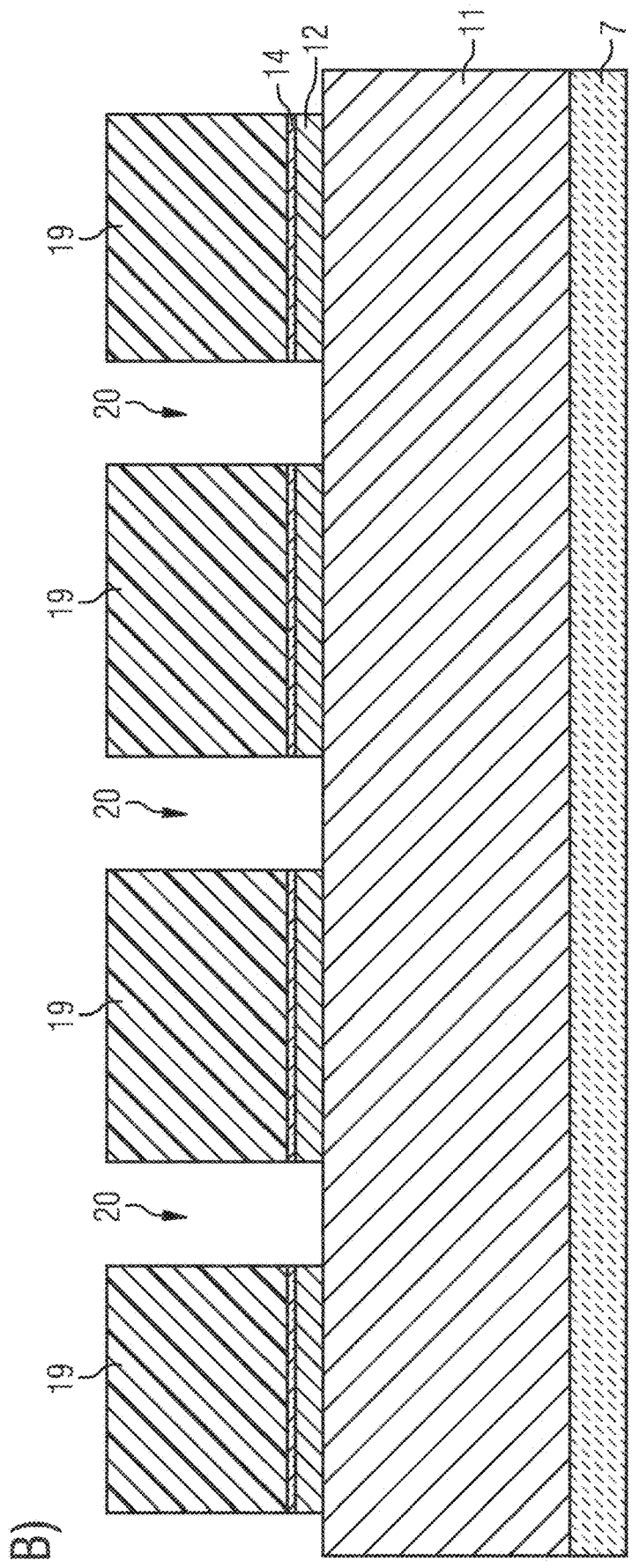
FIG 4

FIG 6
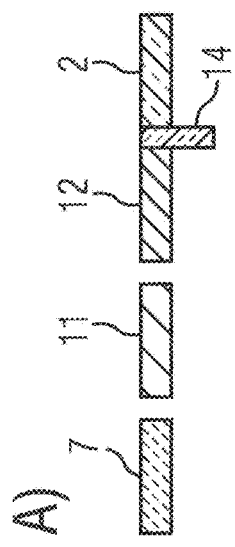
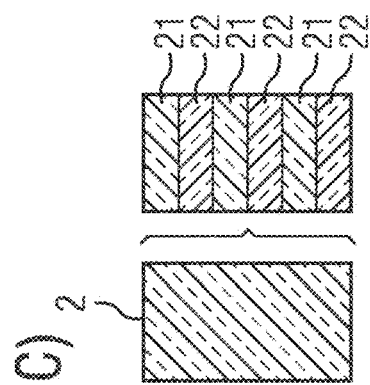
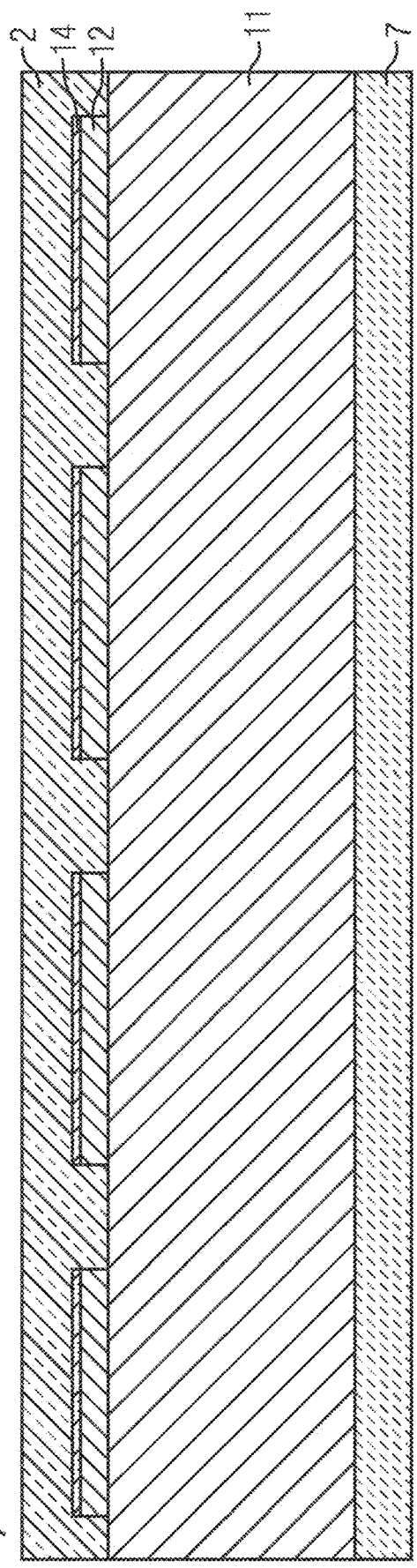

FIG 7
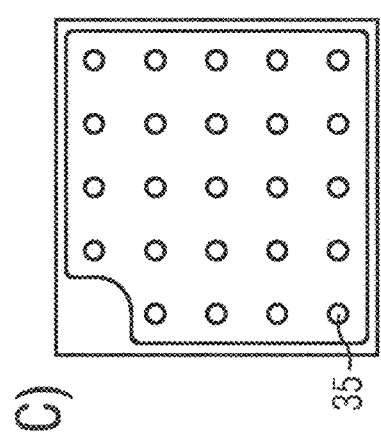
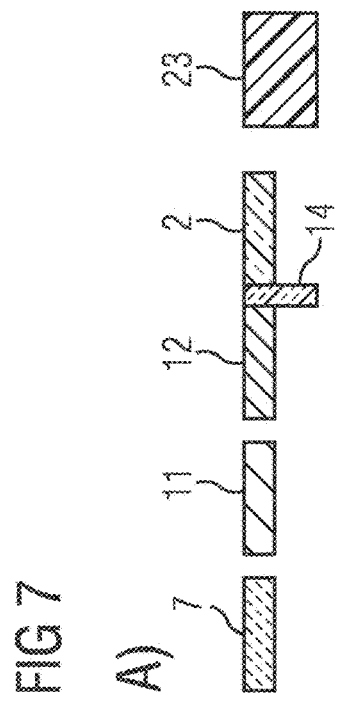
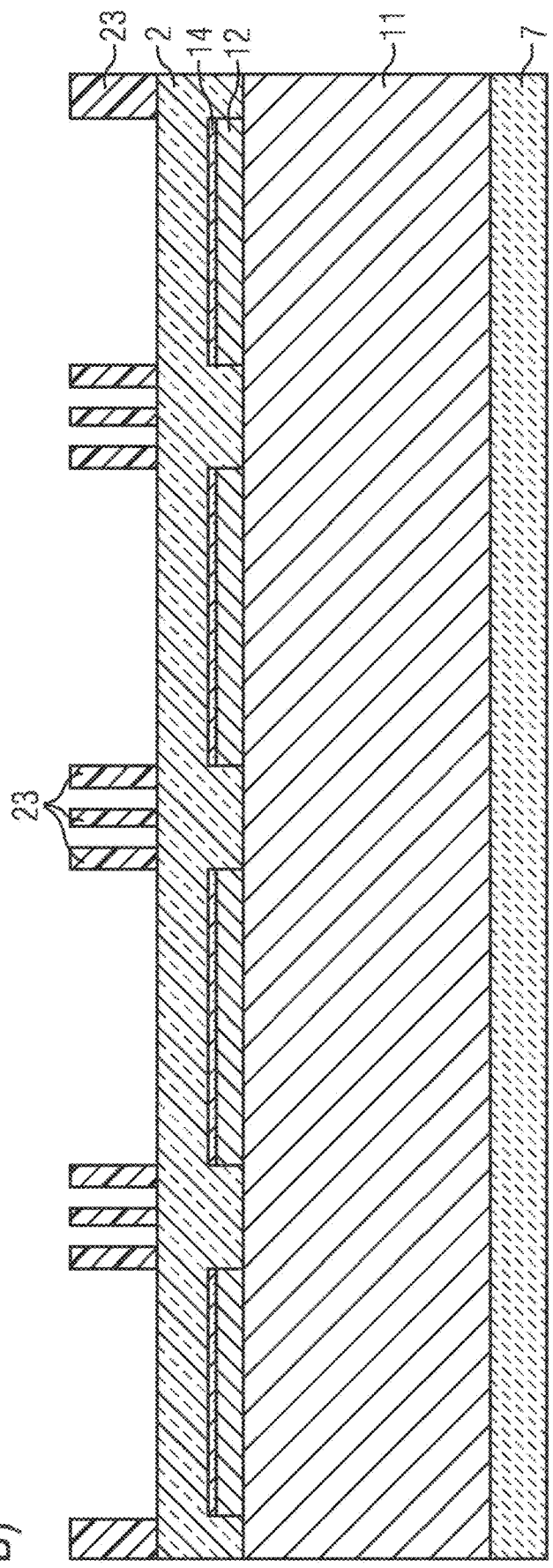

FIG 8
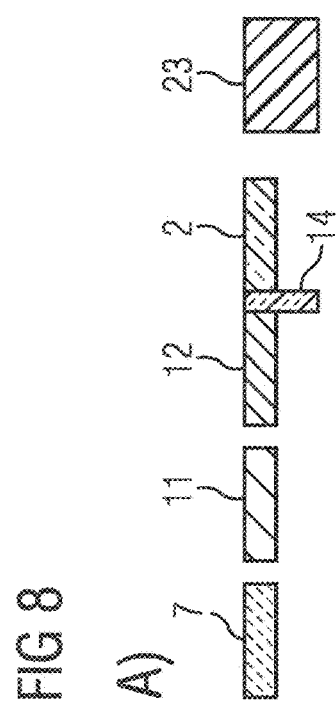
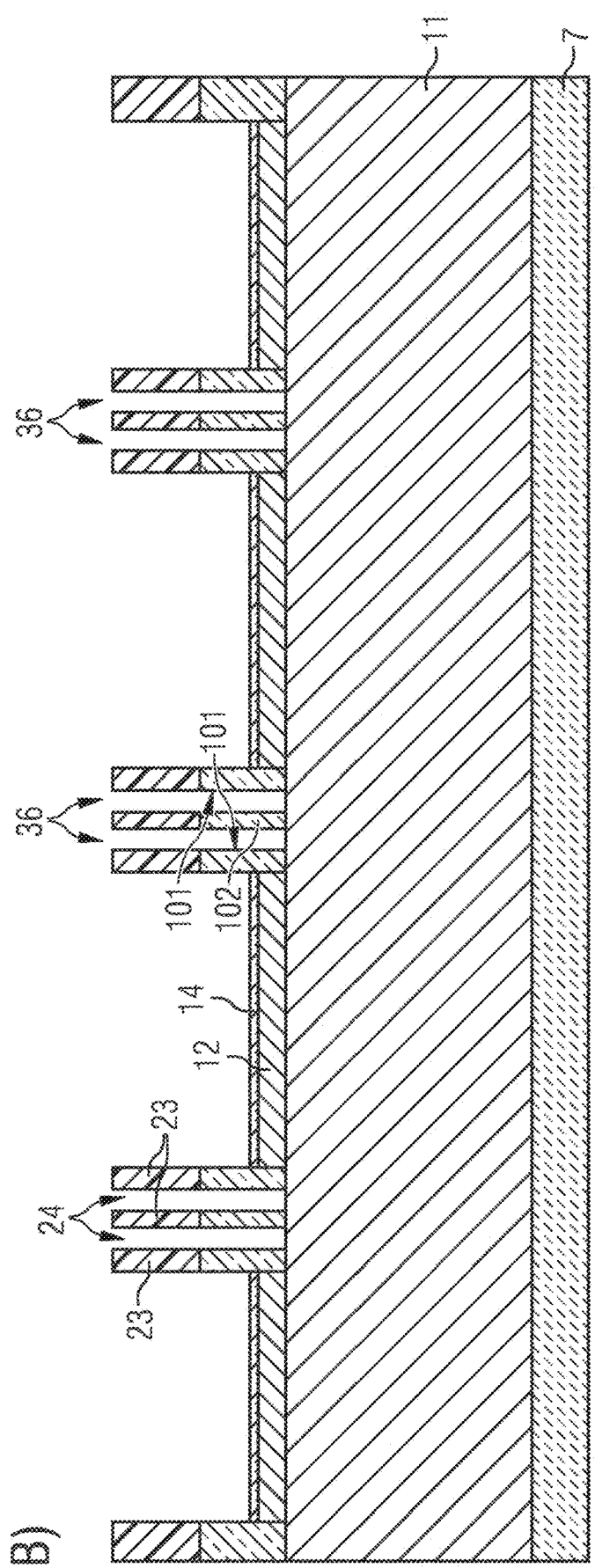

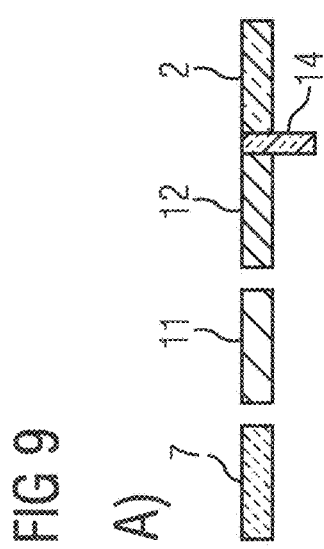
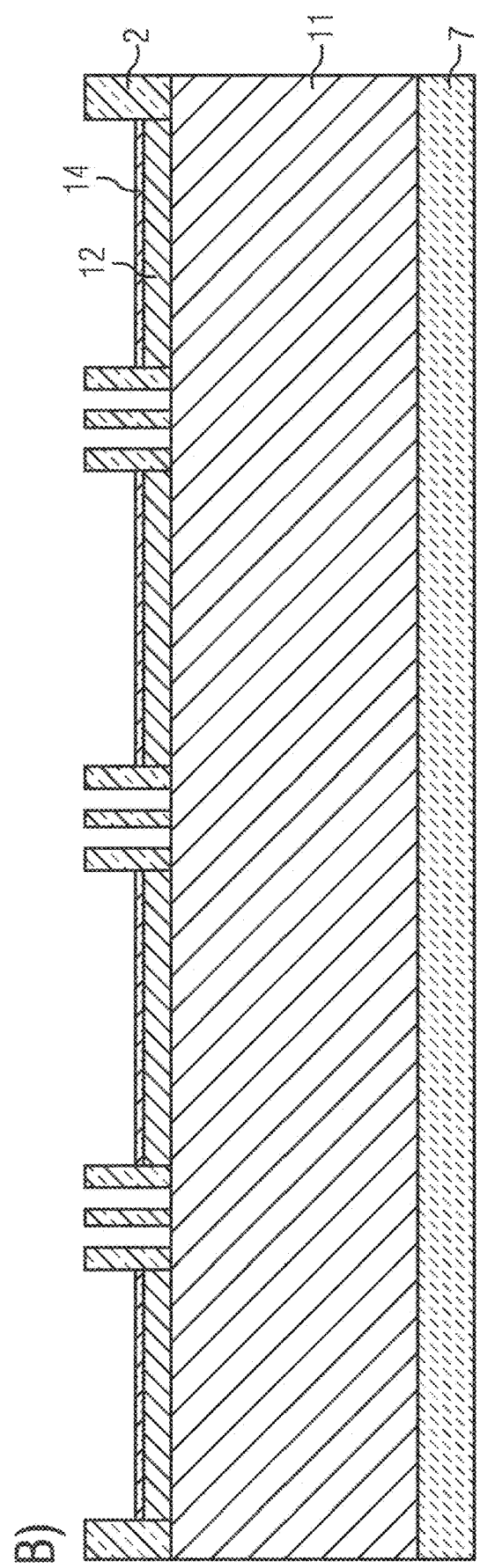

FIG 10
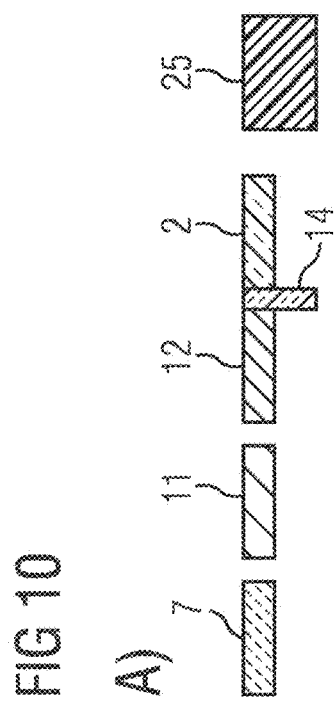
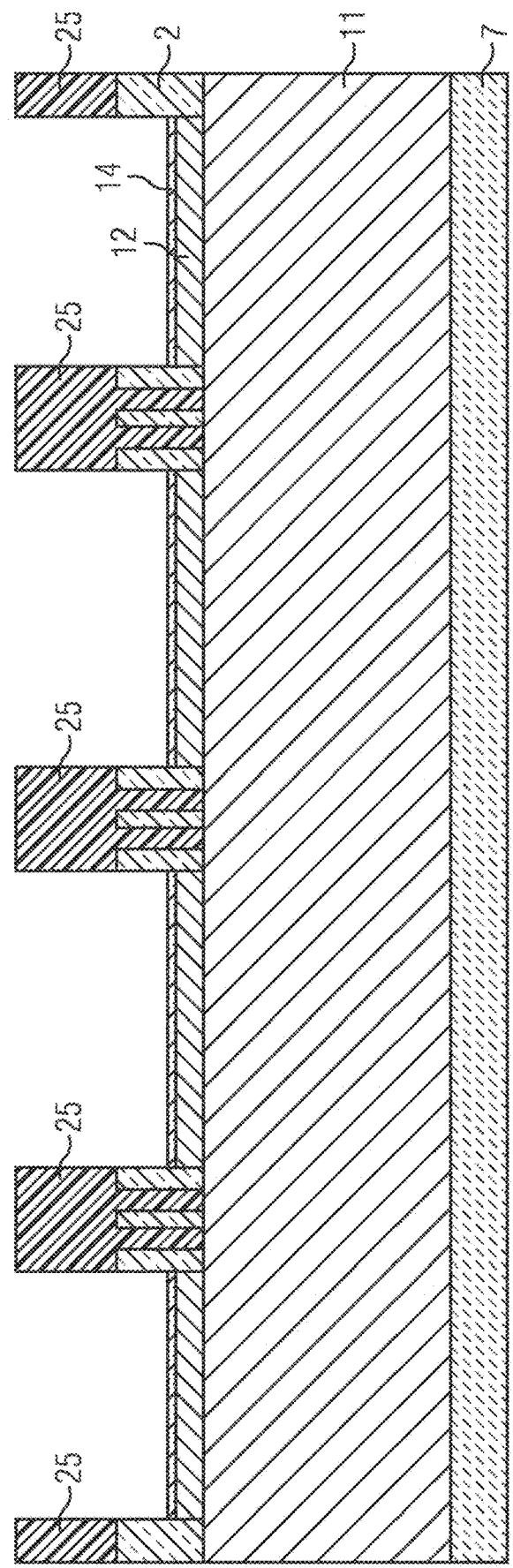

FIG 11
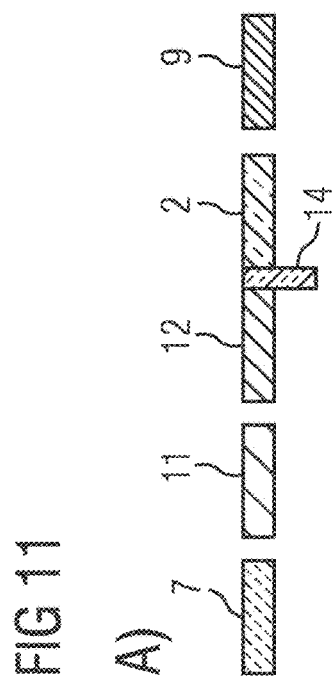
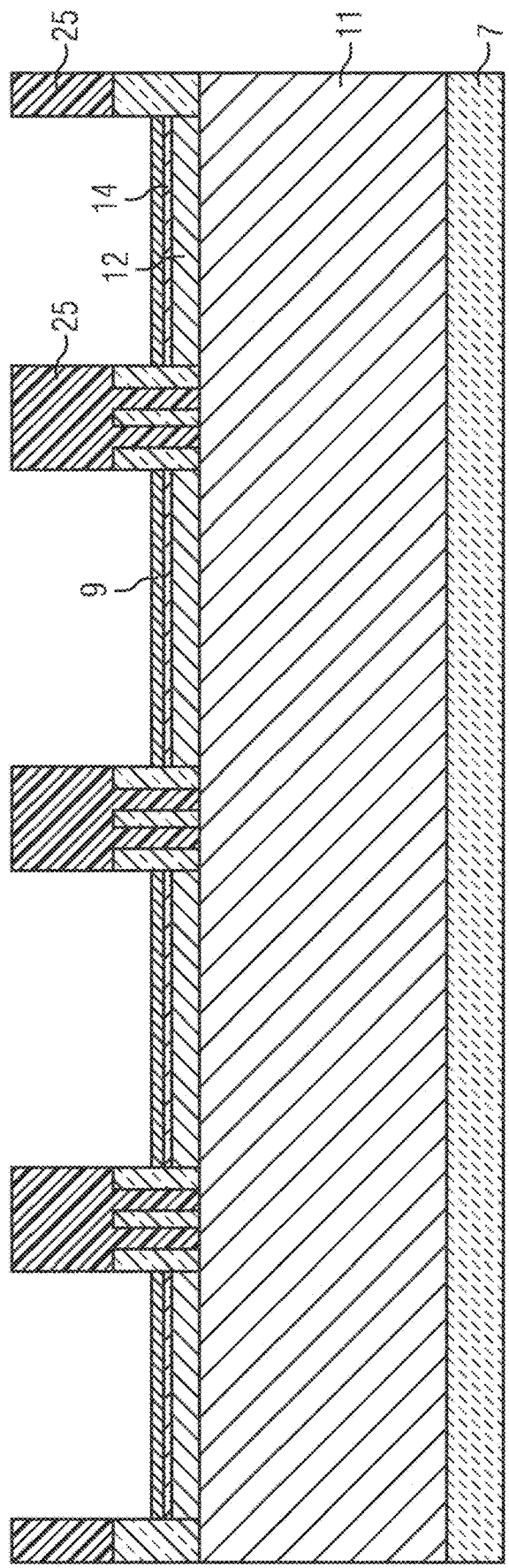

FIG 12
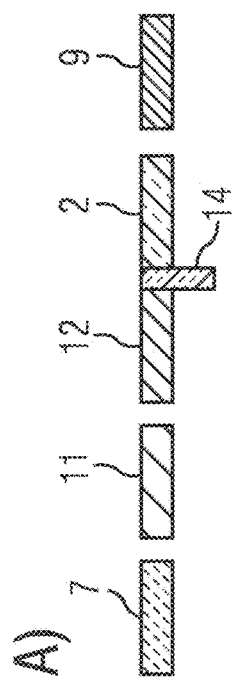
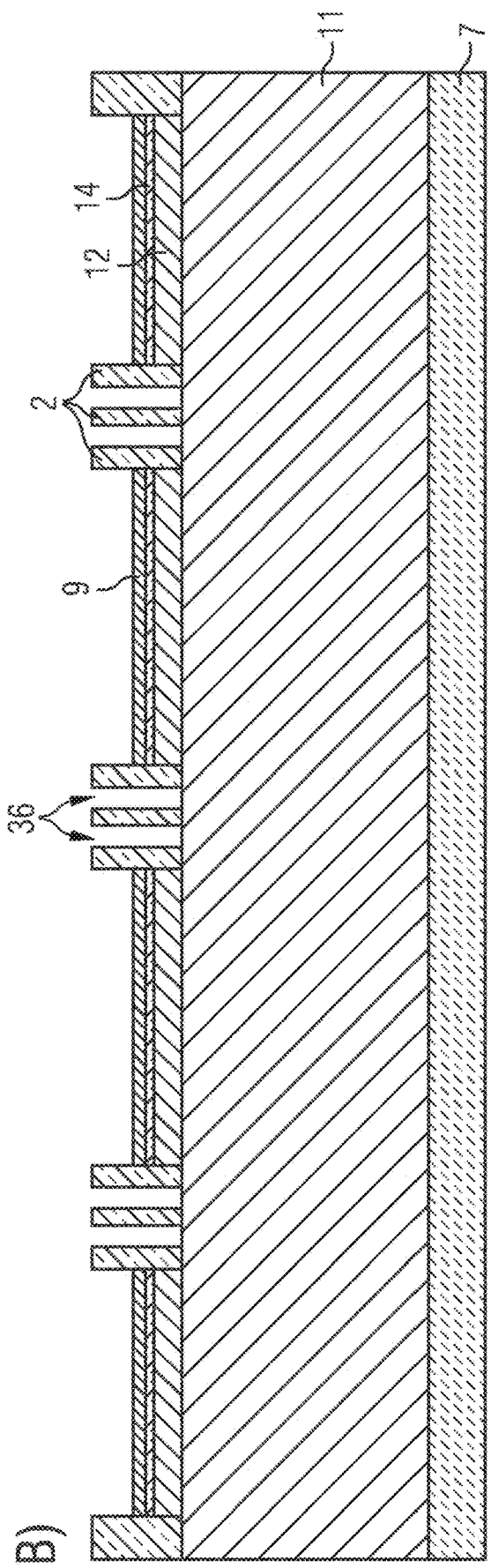

FIG 14
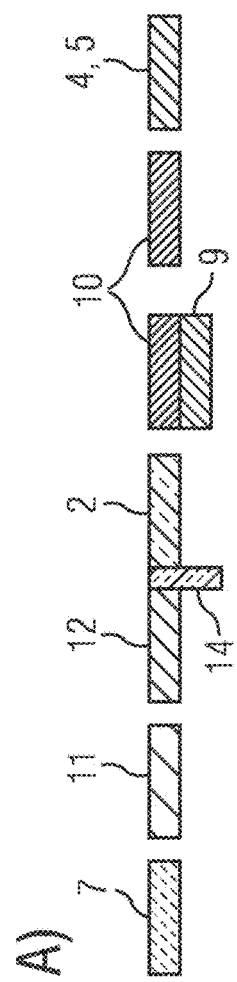
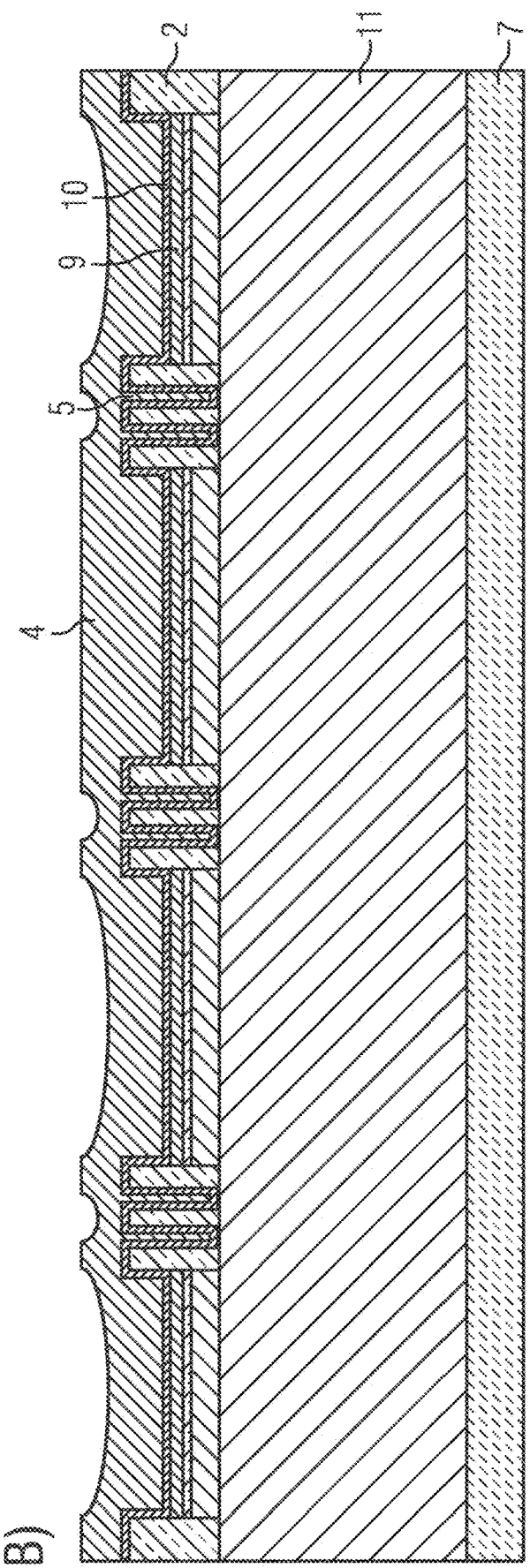

FIG 15
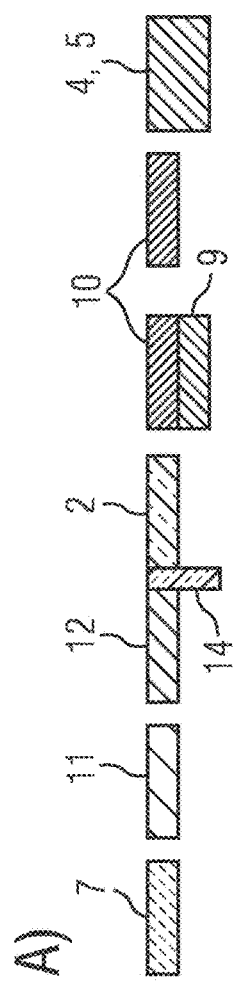
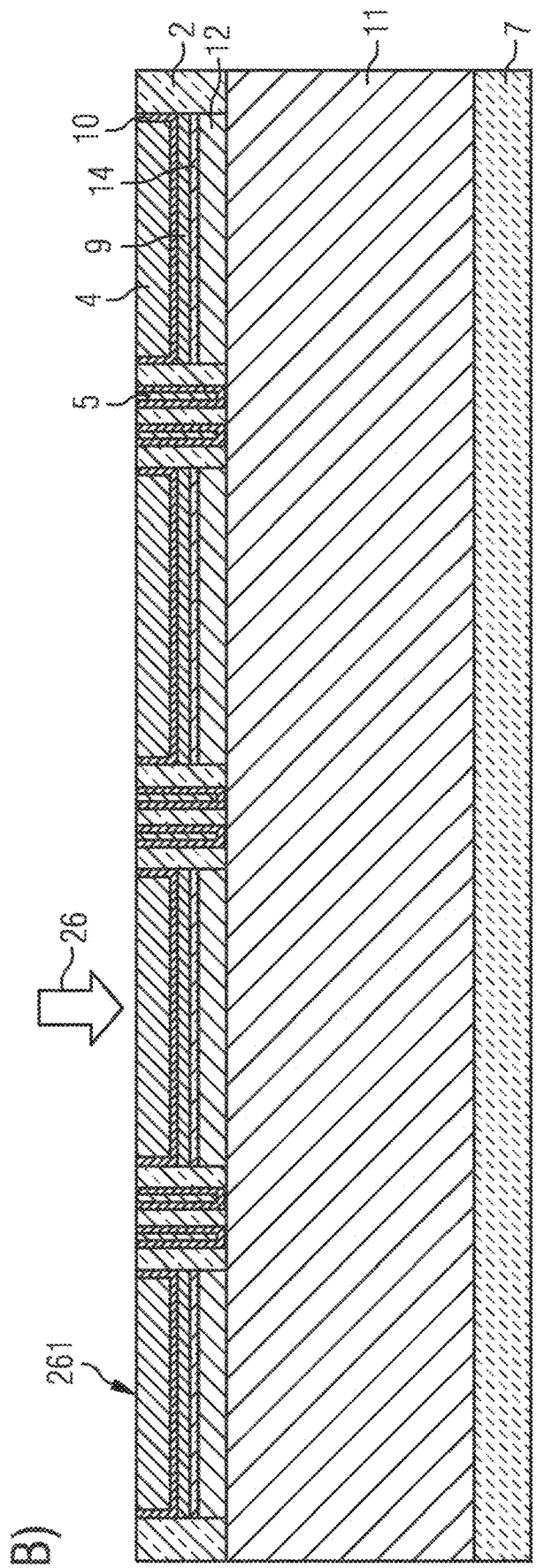

FIG 16
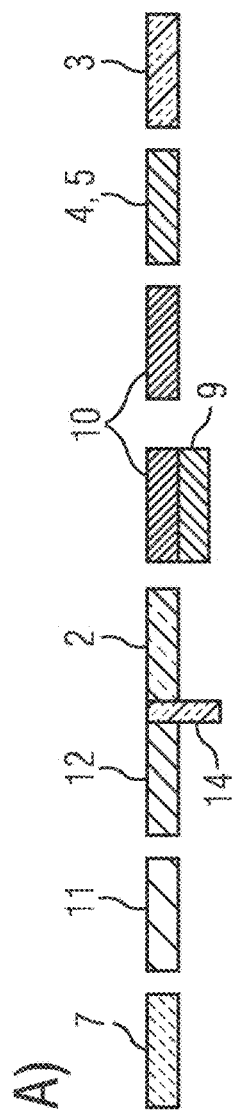
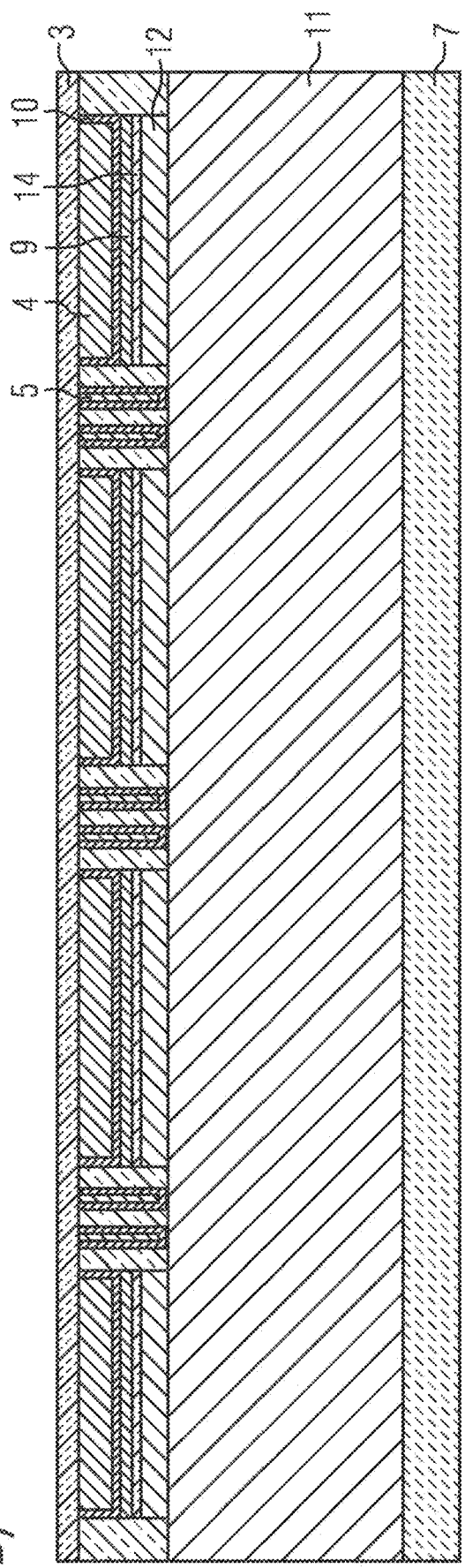

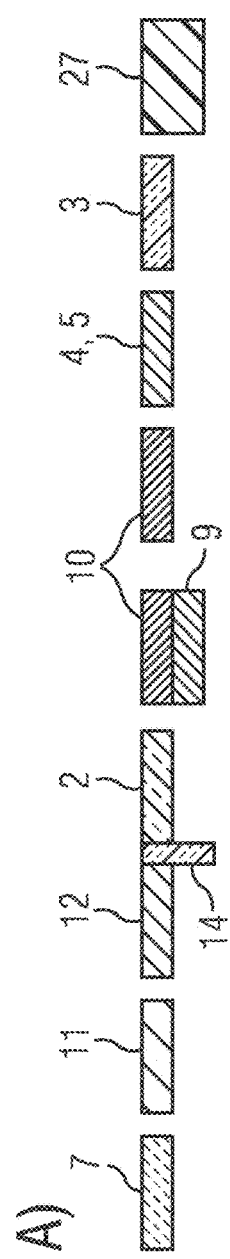
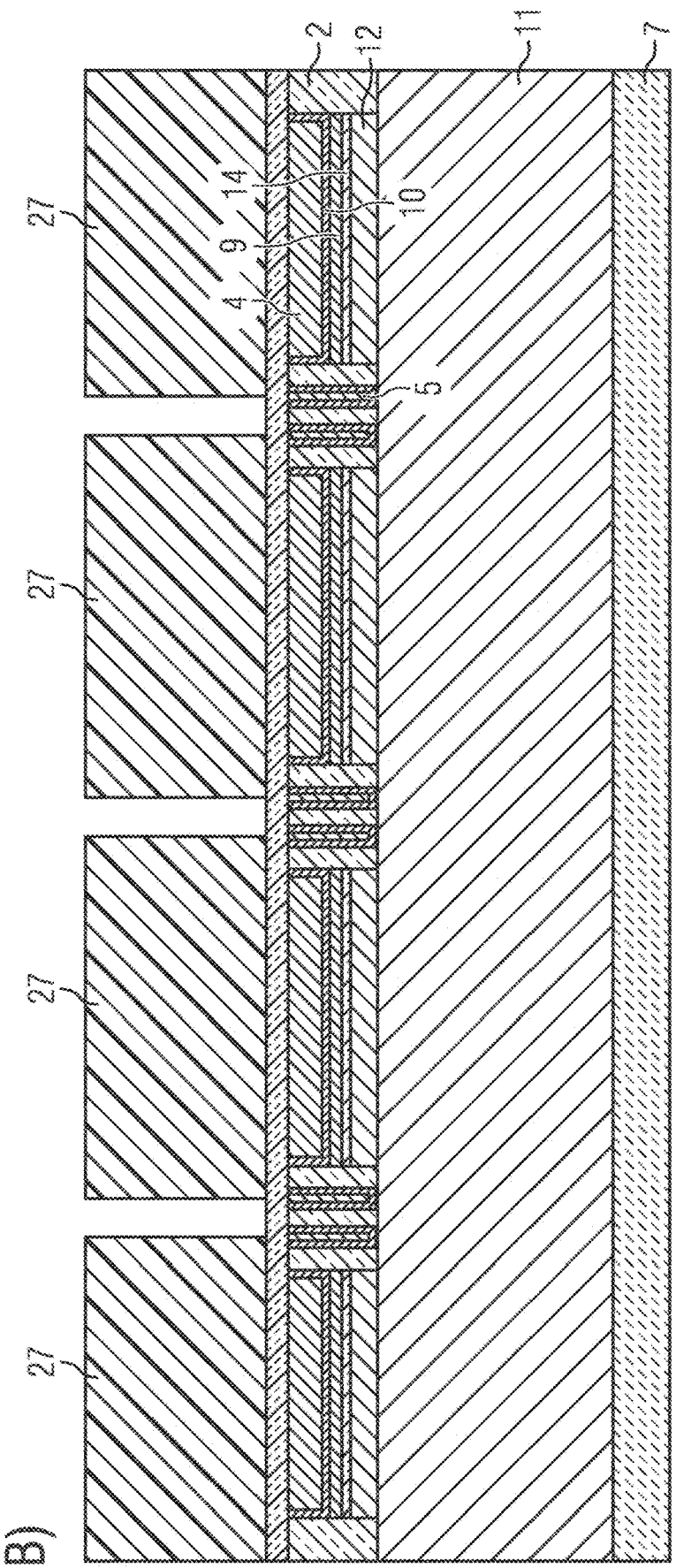

FIG 18
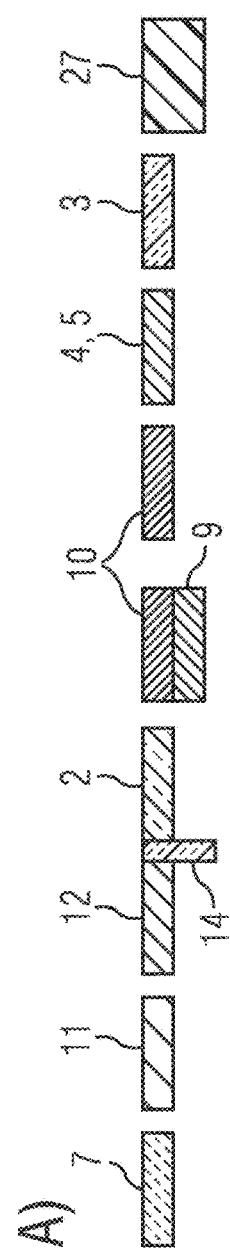
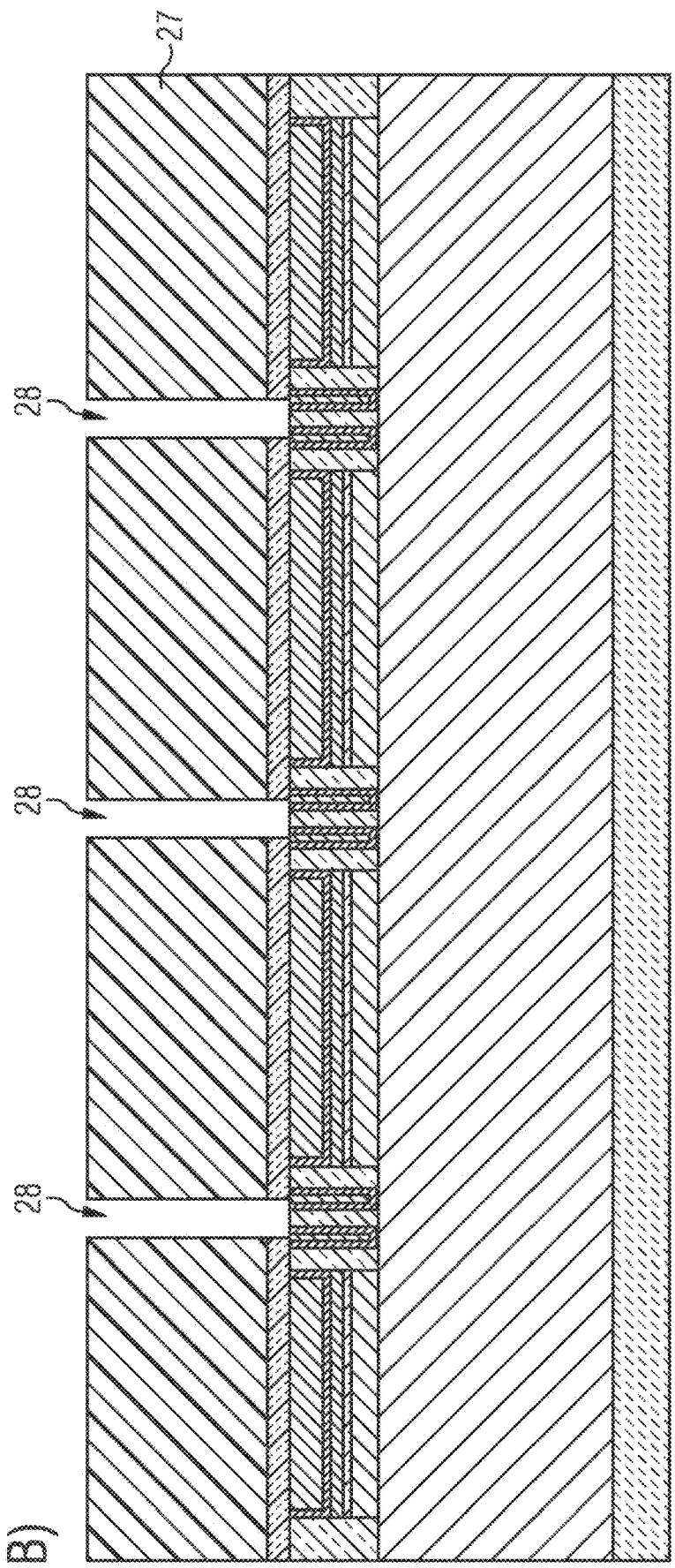

FIG 19
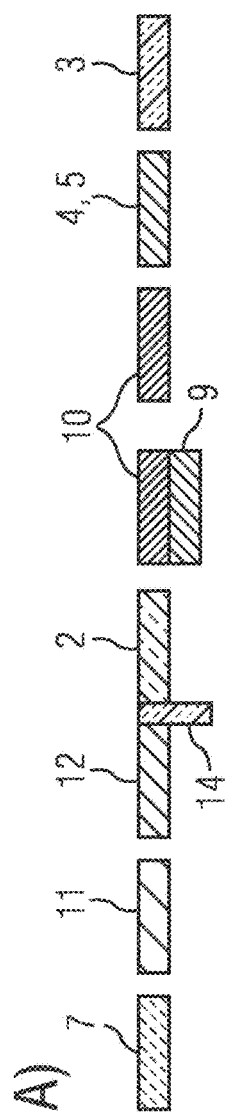
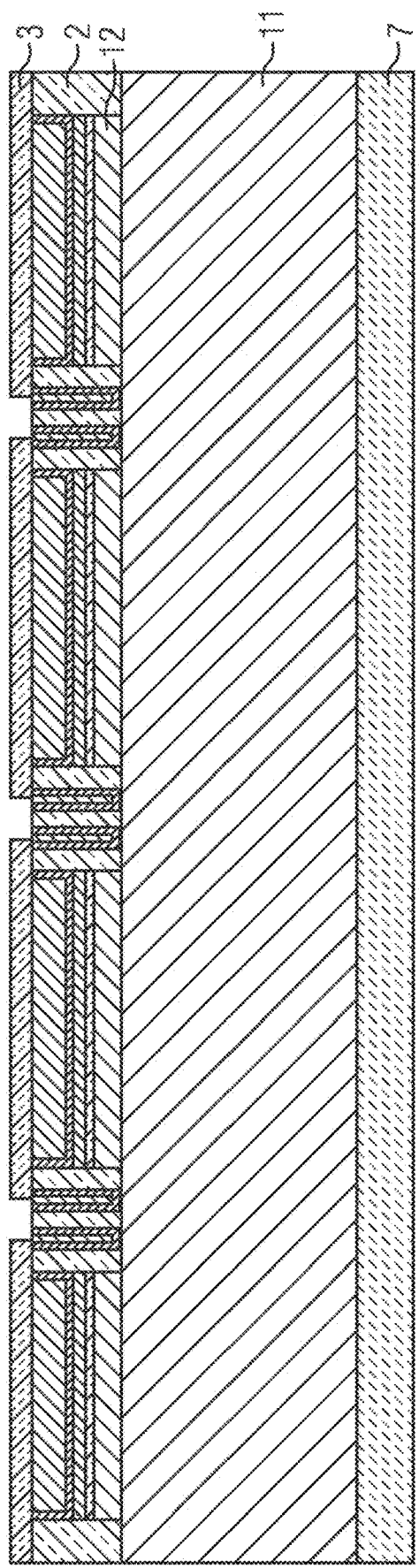

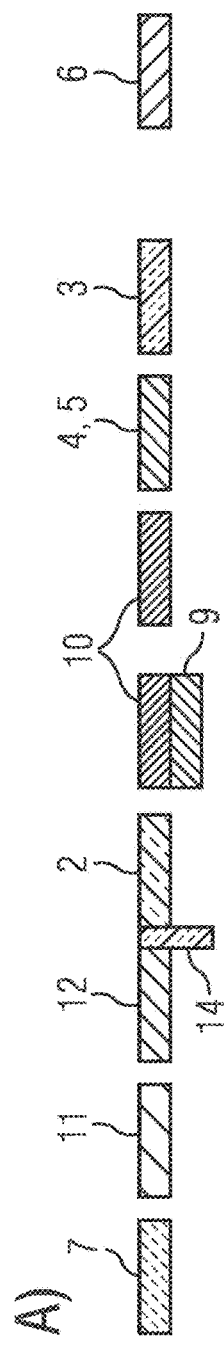
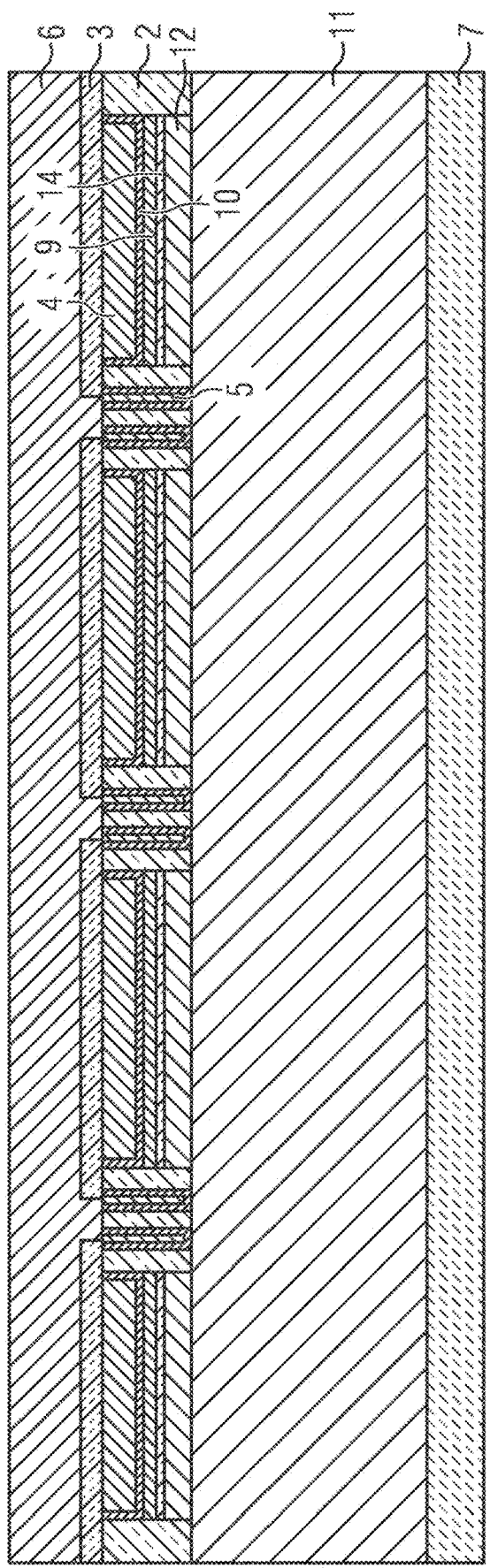
FIG 20

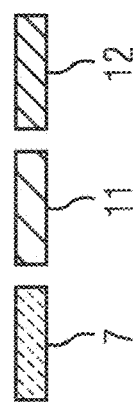
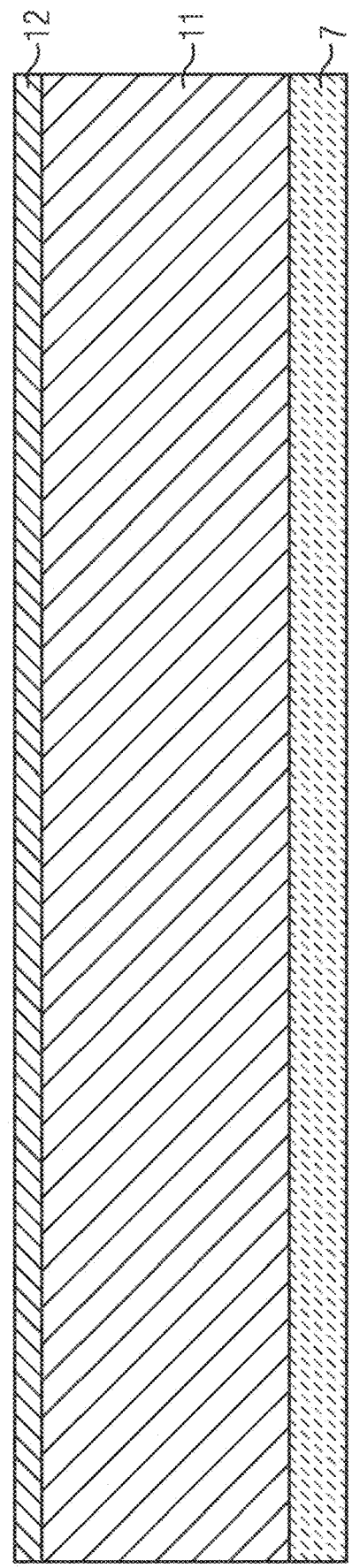
FIG 27

FIG 28
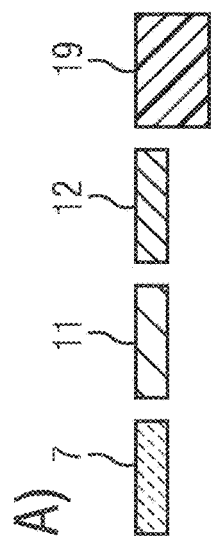
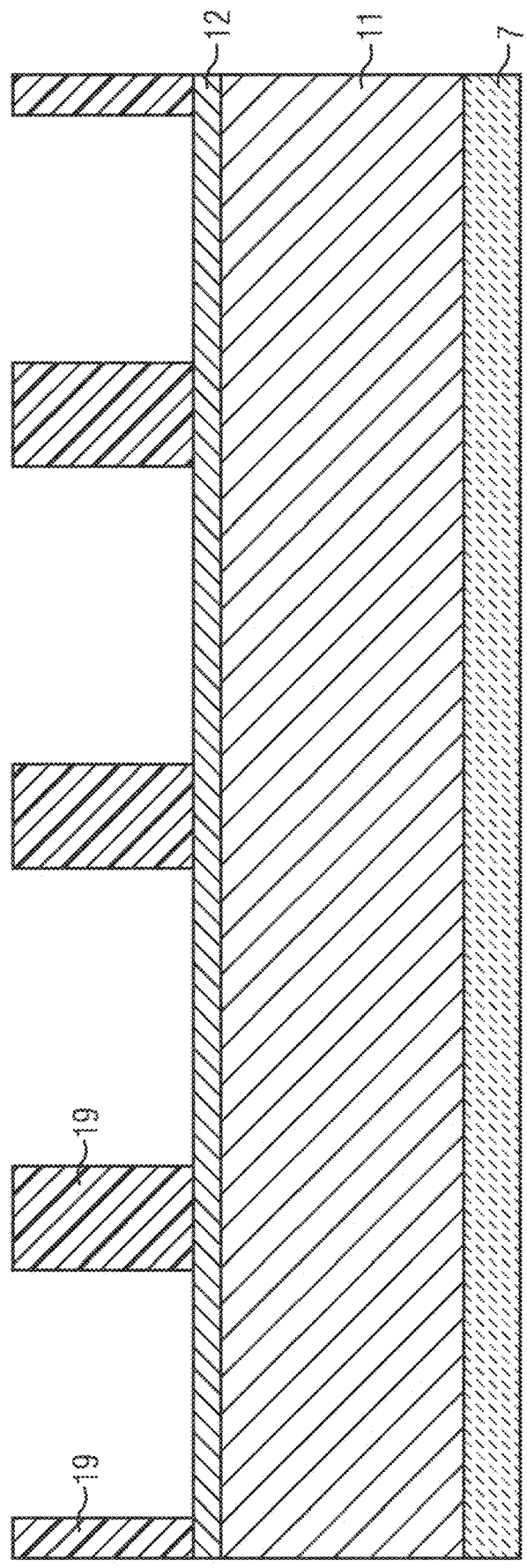

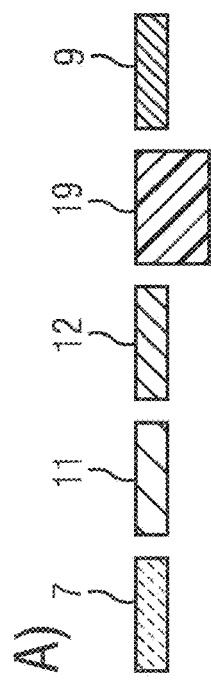
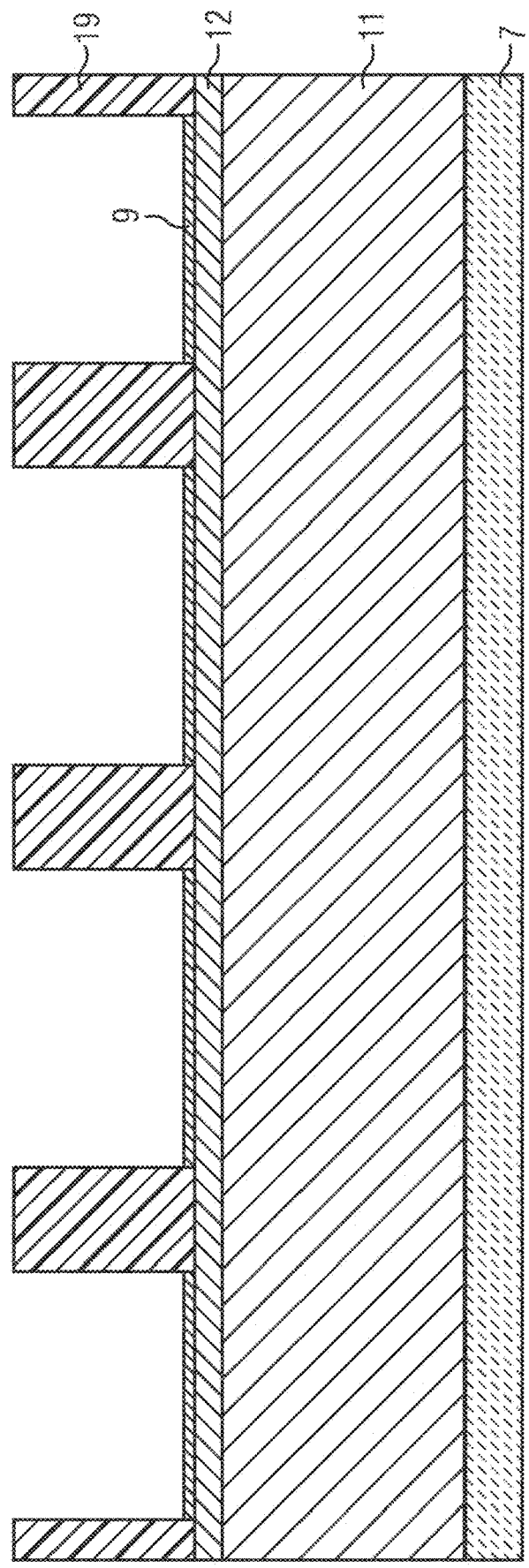
FIG 29

FIG. 30
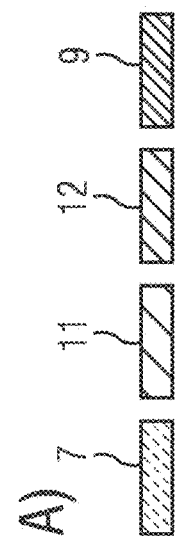
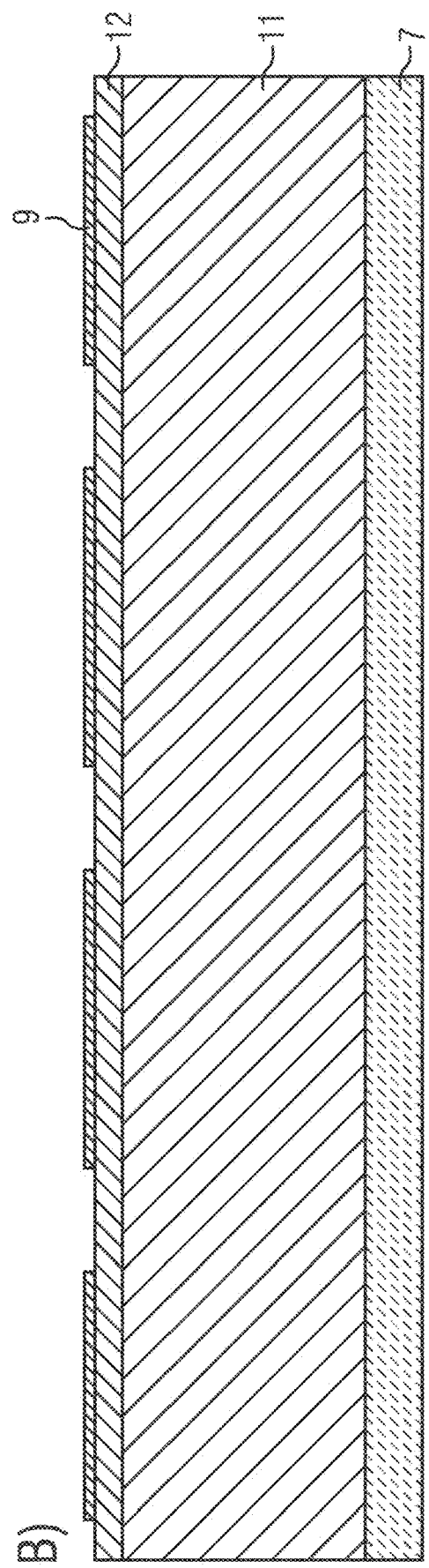

FIG 32
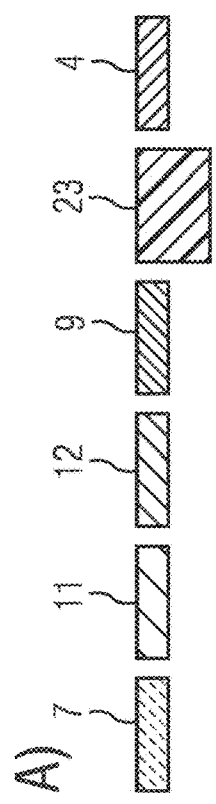
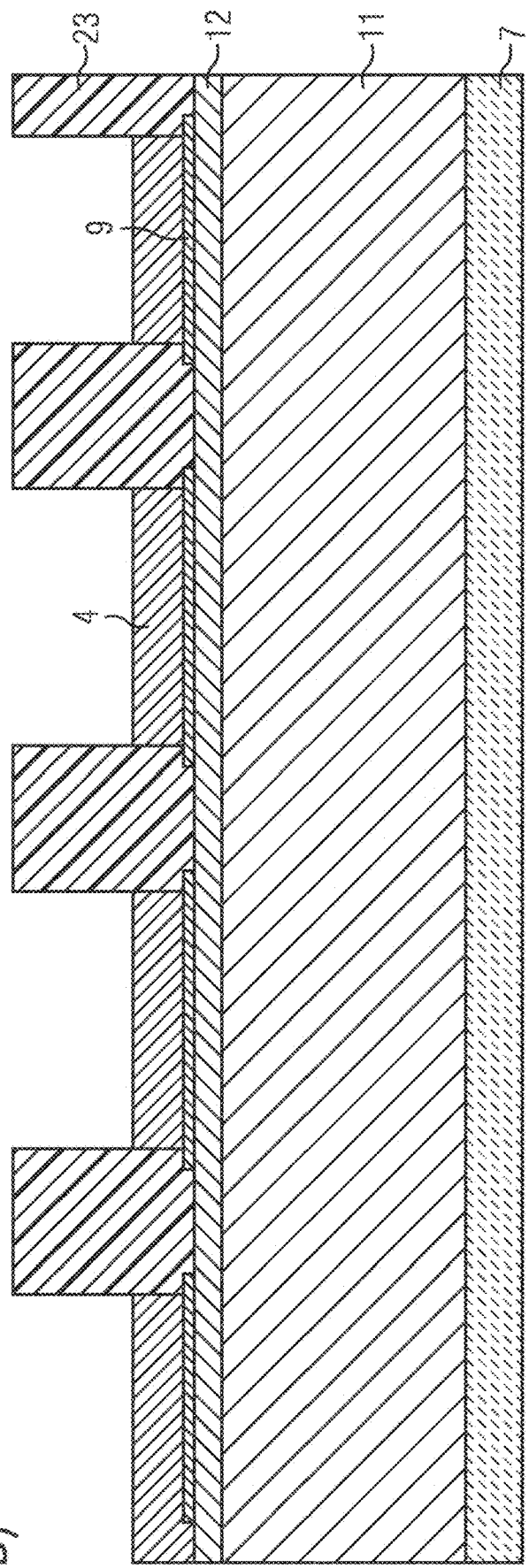

FIG 33
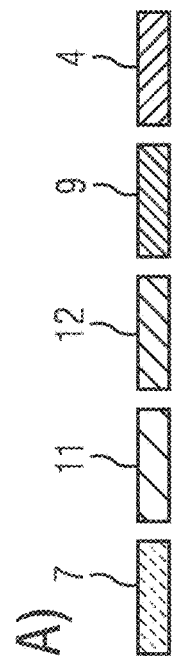
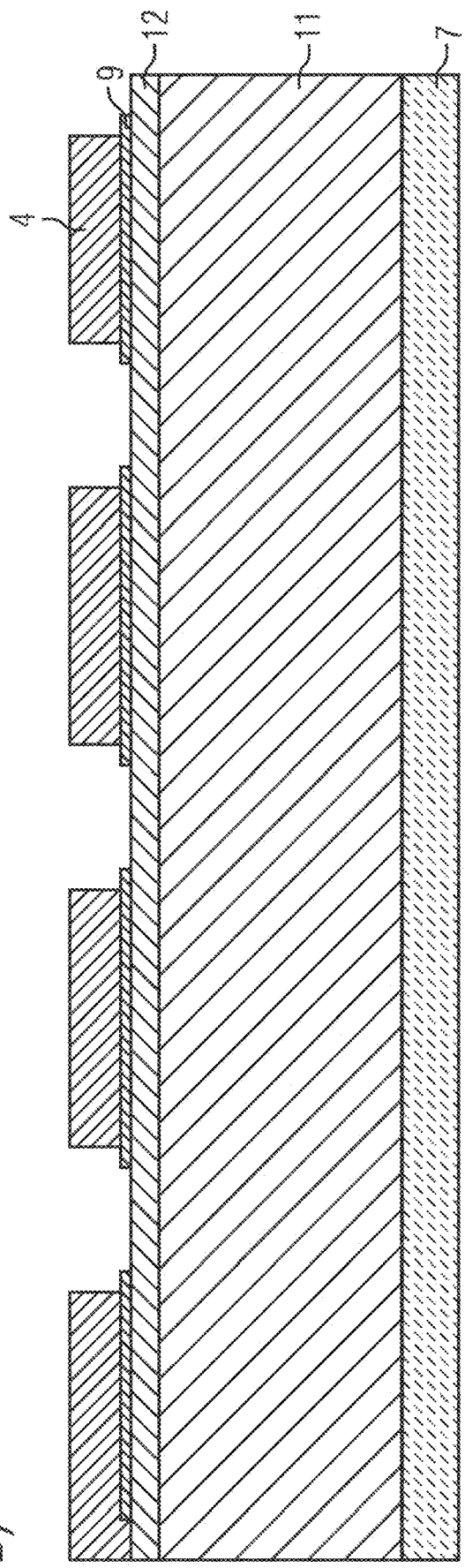

FIG 34
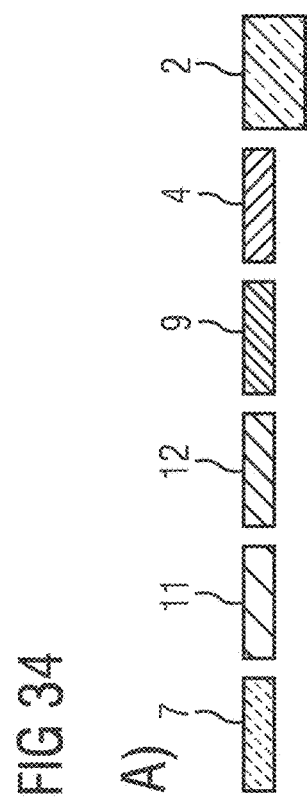
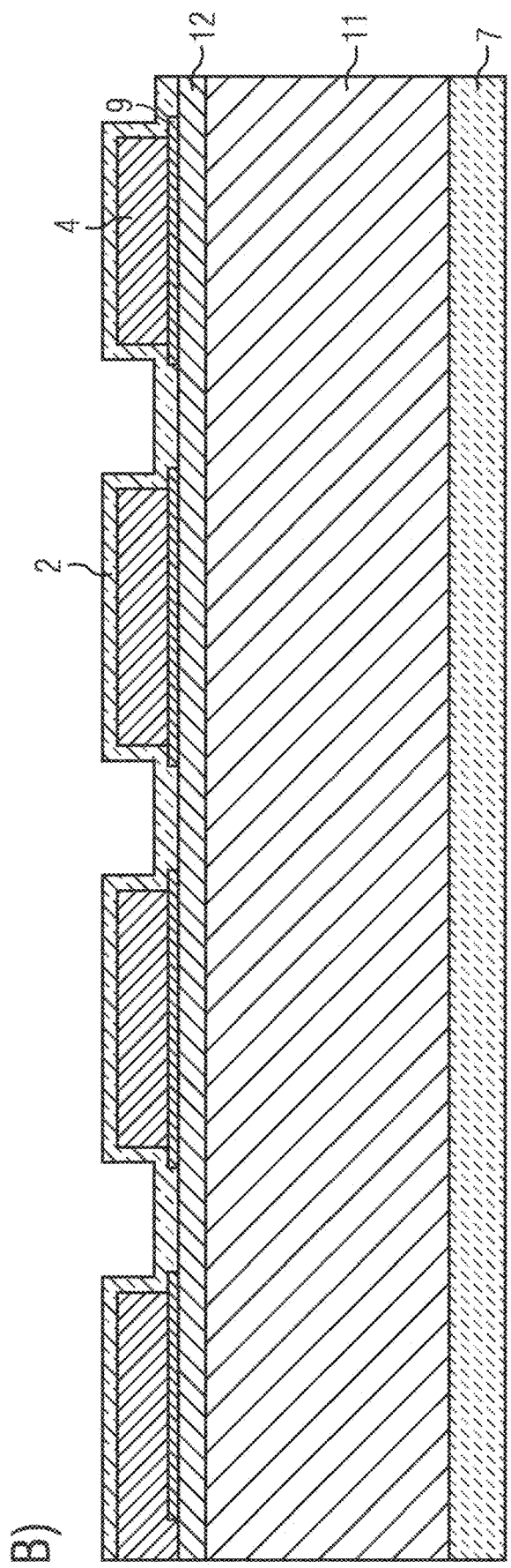

FIG 35
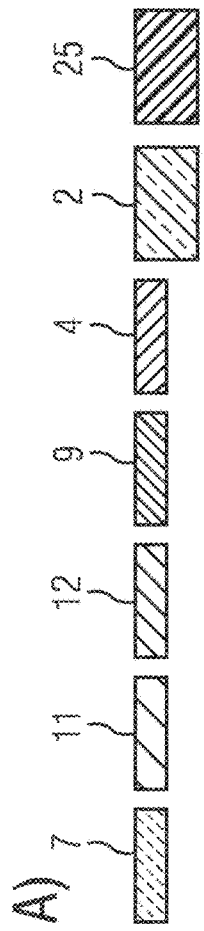
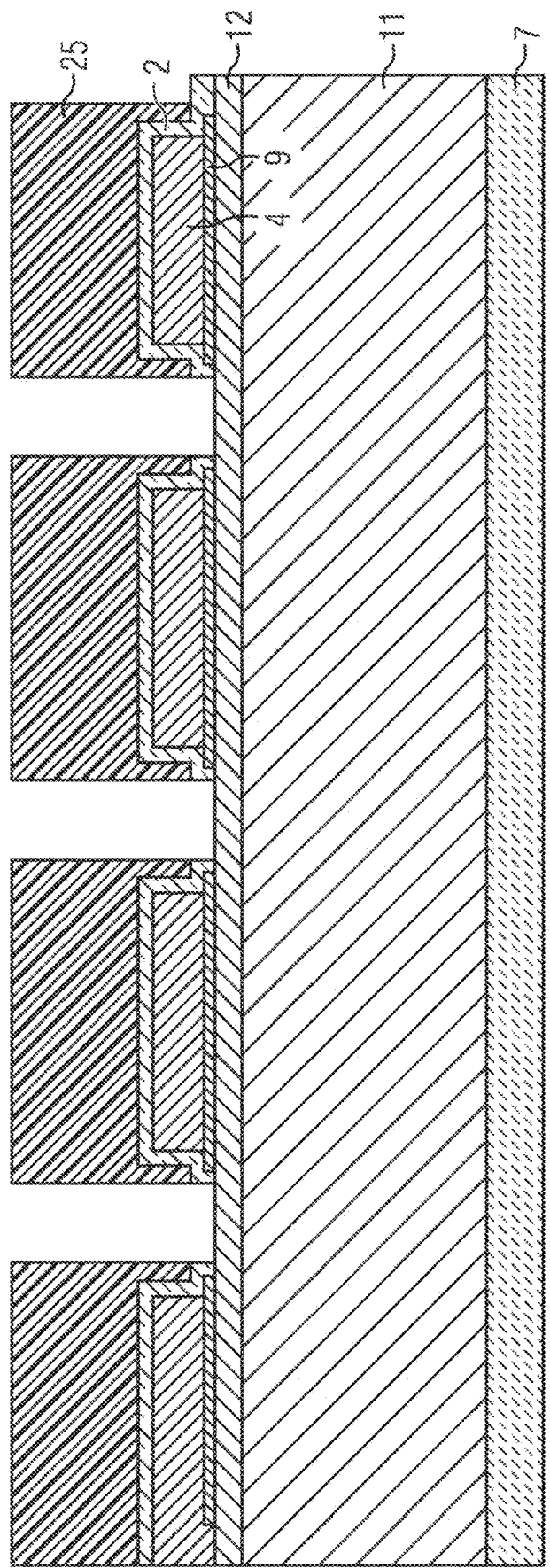

FIG 36
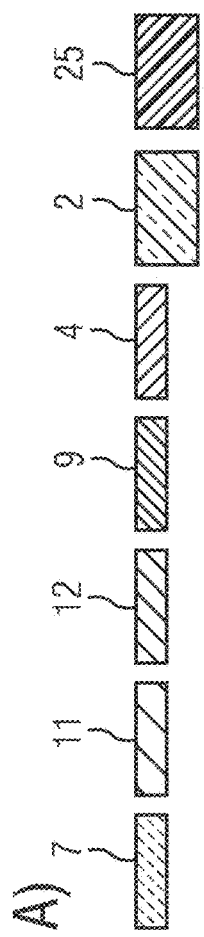
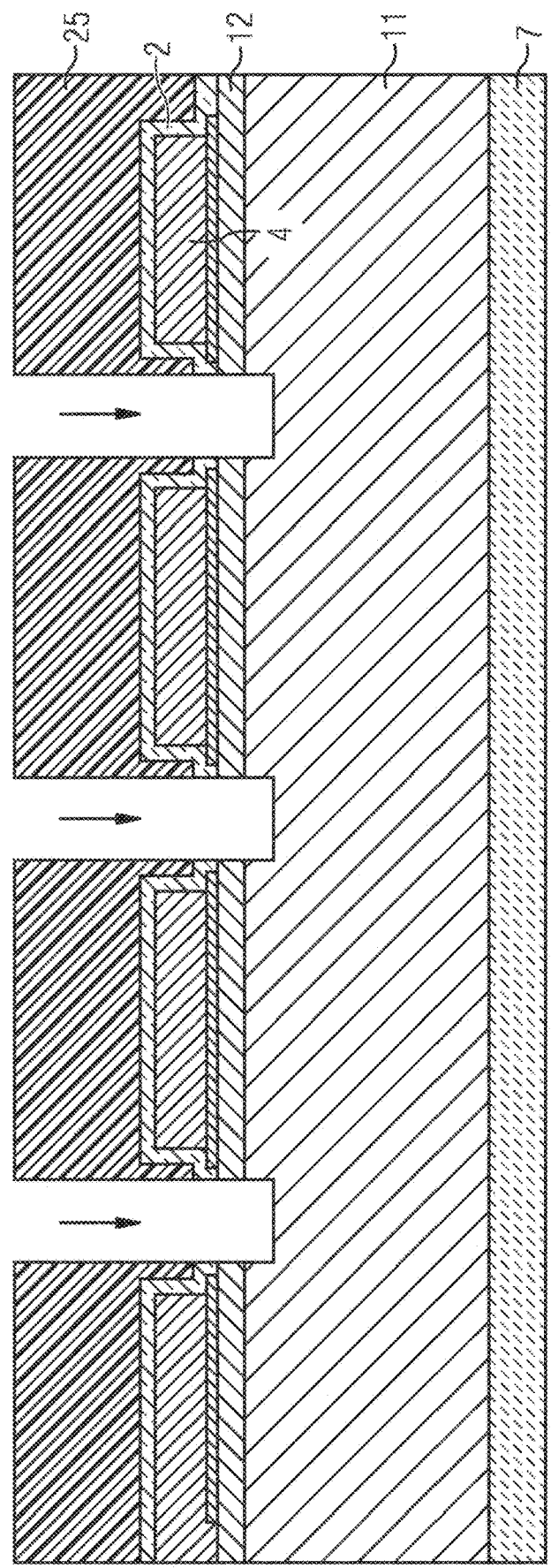

FIG 37
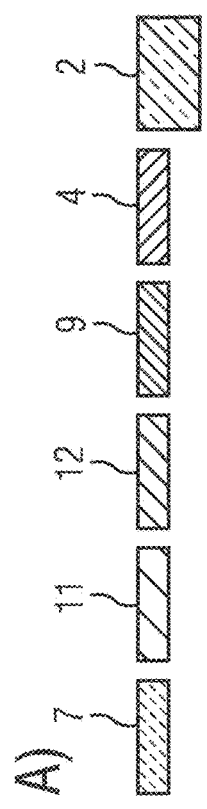
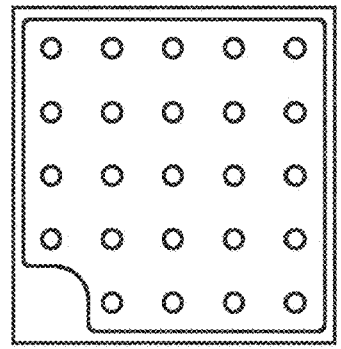
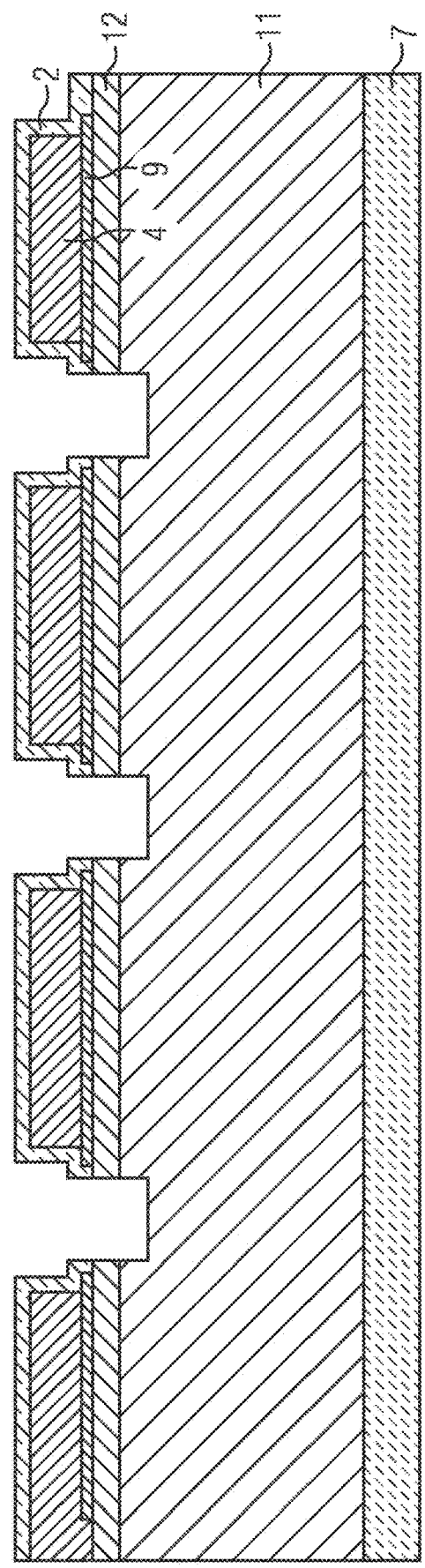

FIG 38
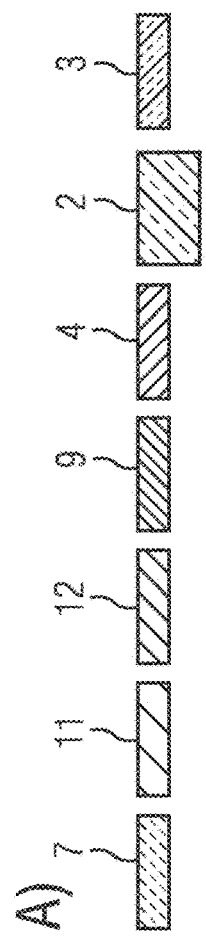
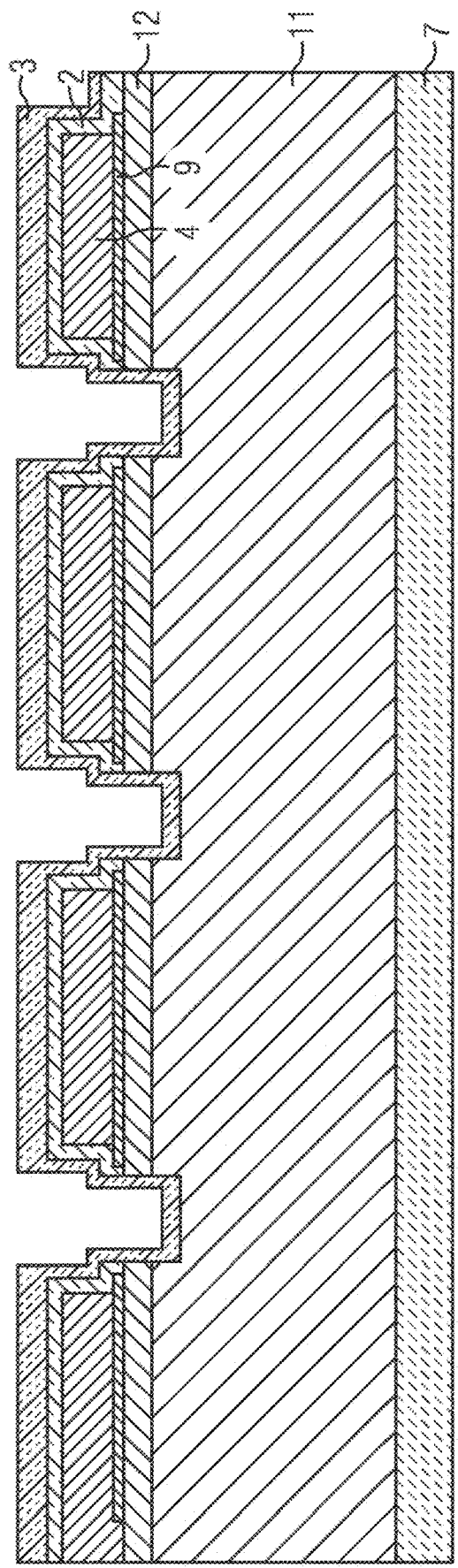

FIG 39
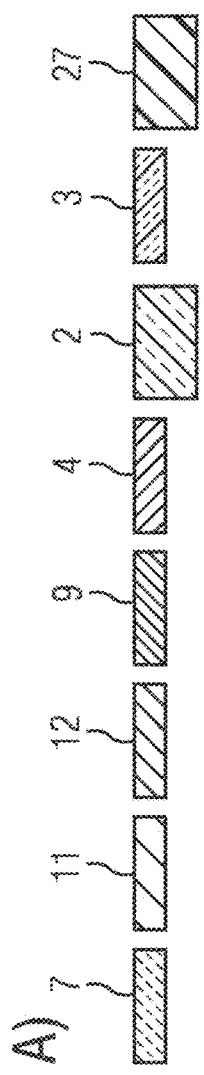
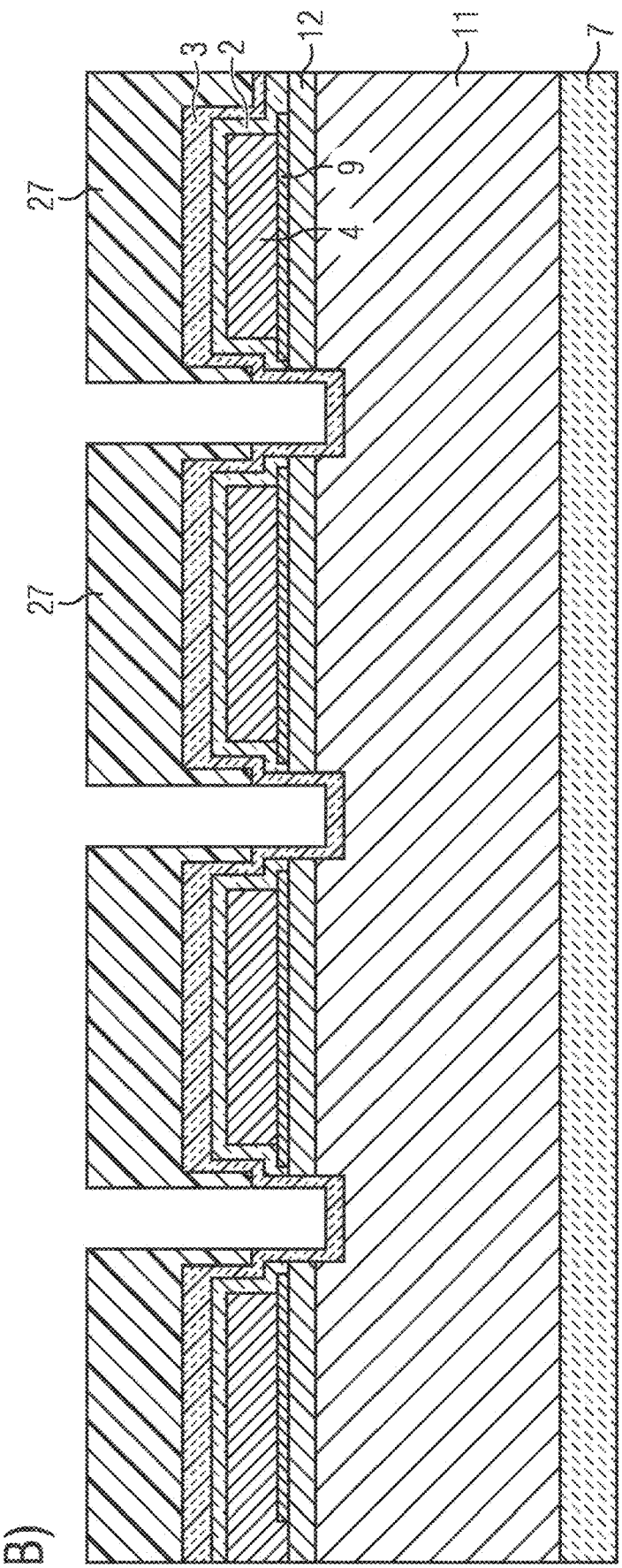

FIG 40
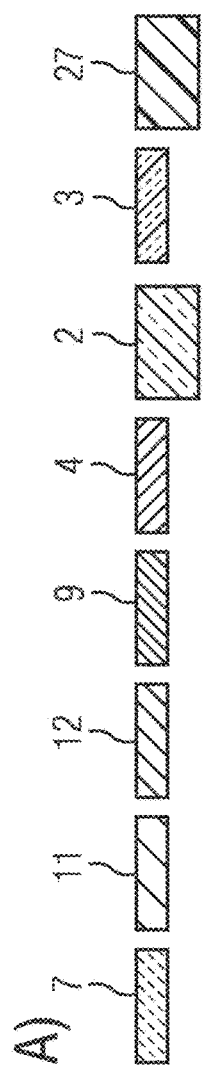
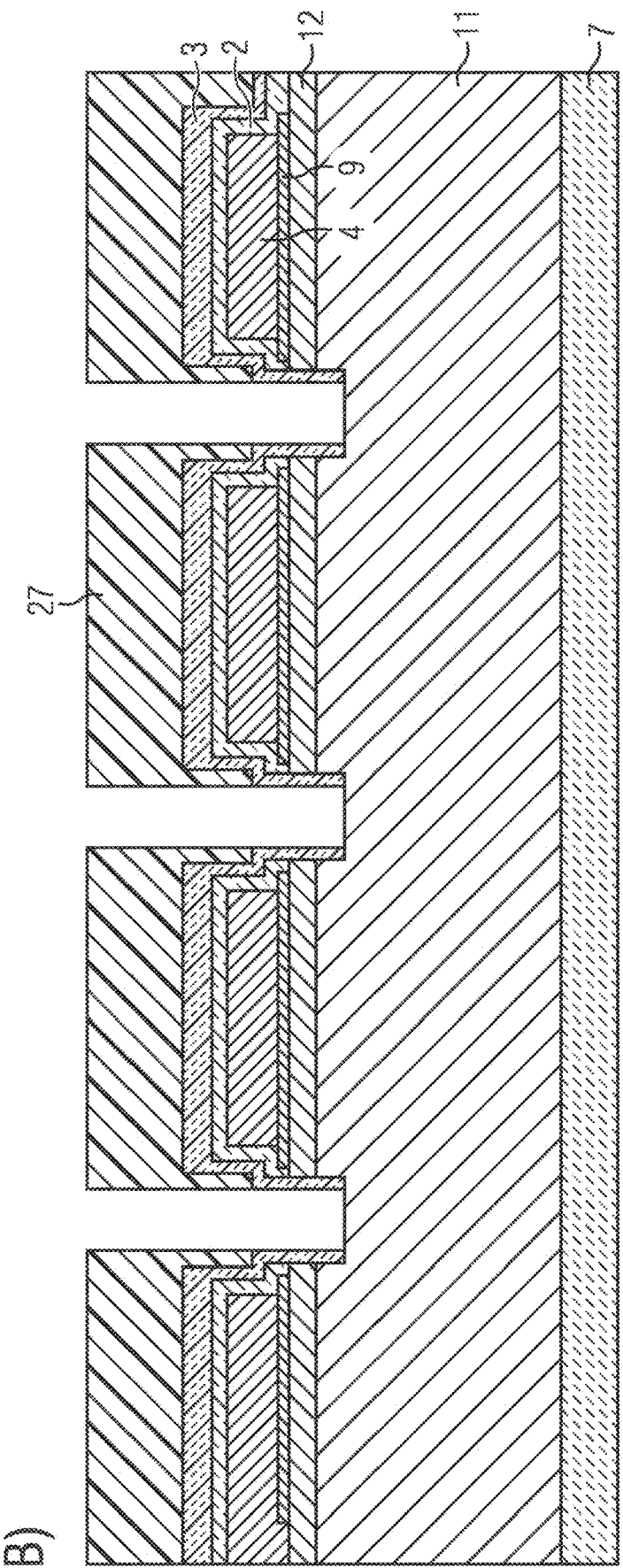

FIG 41
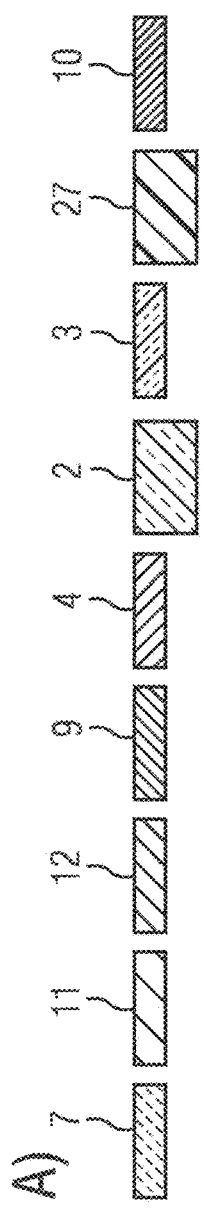
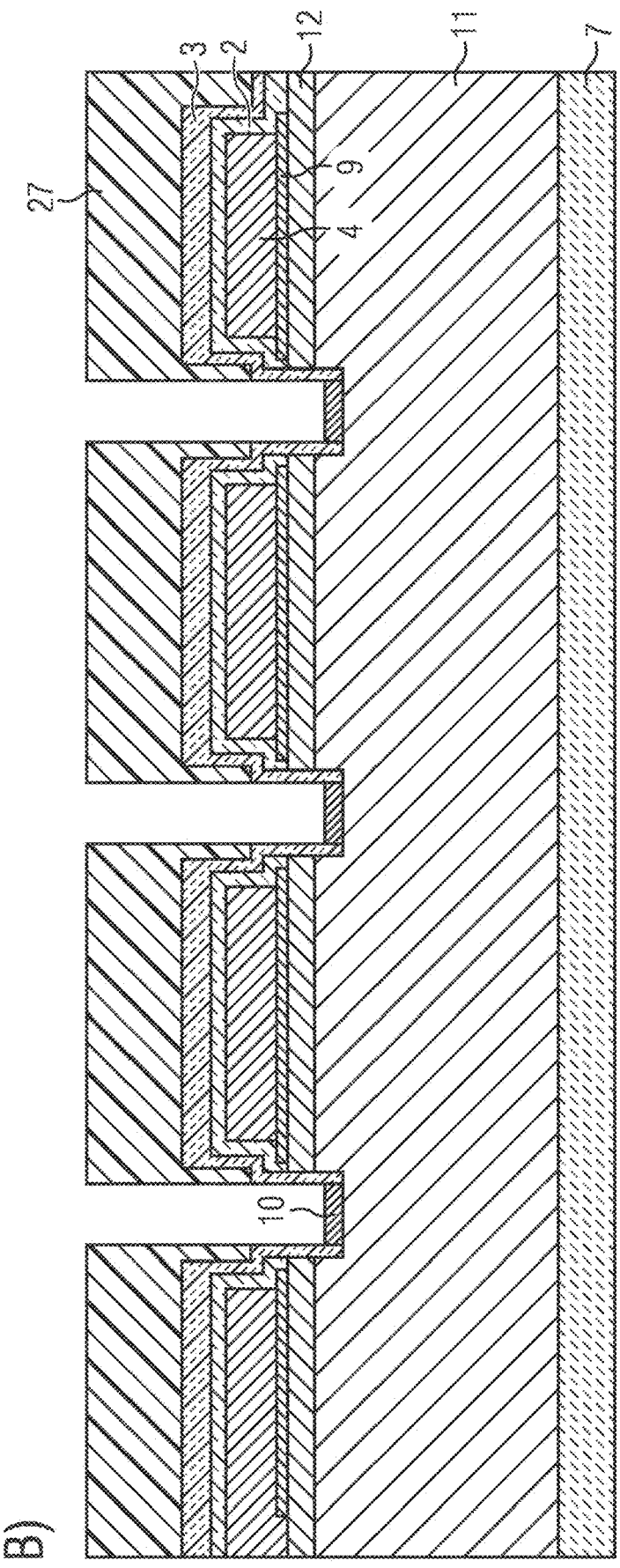

FIG 44
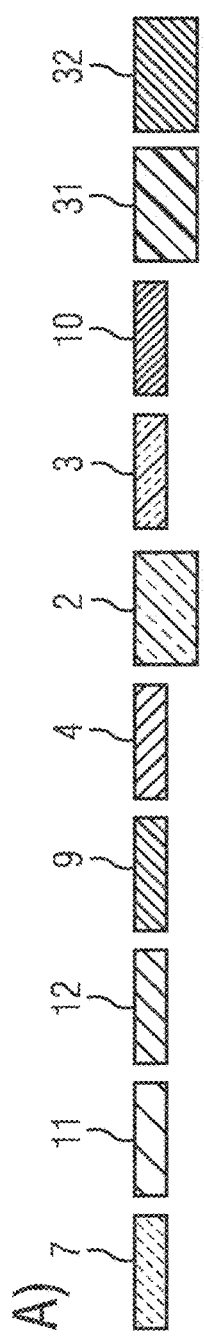
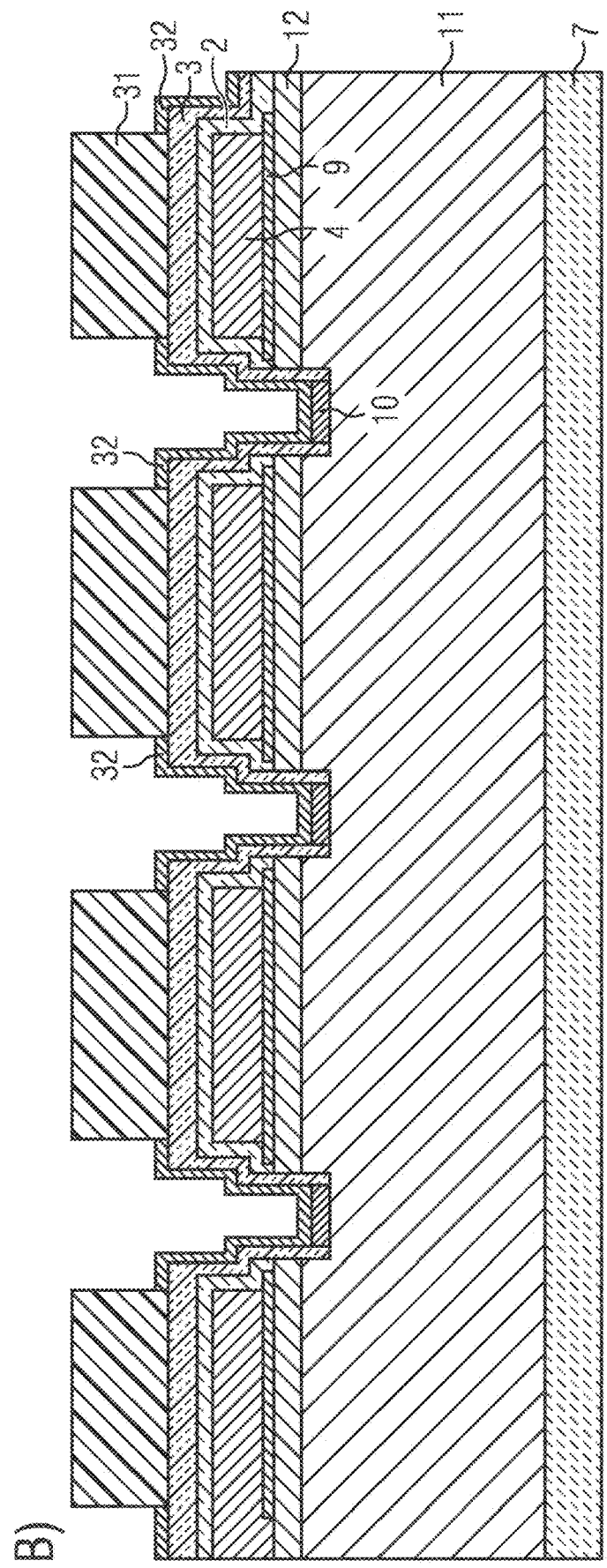

FIG 45
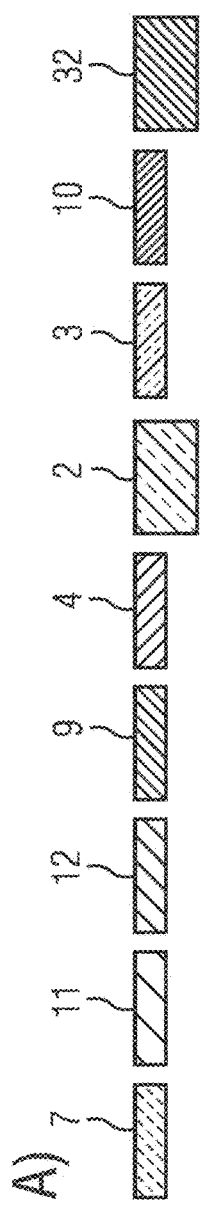
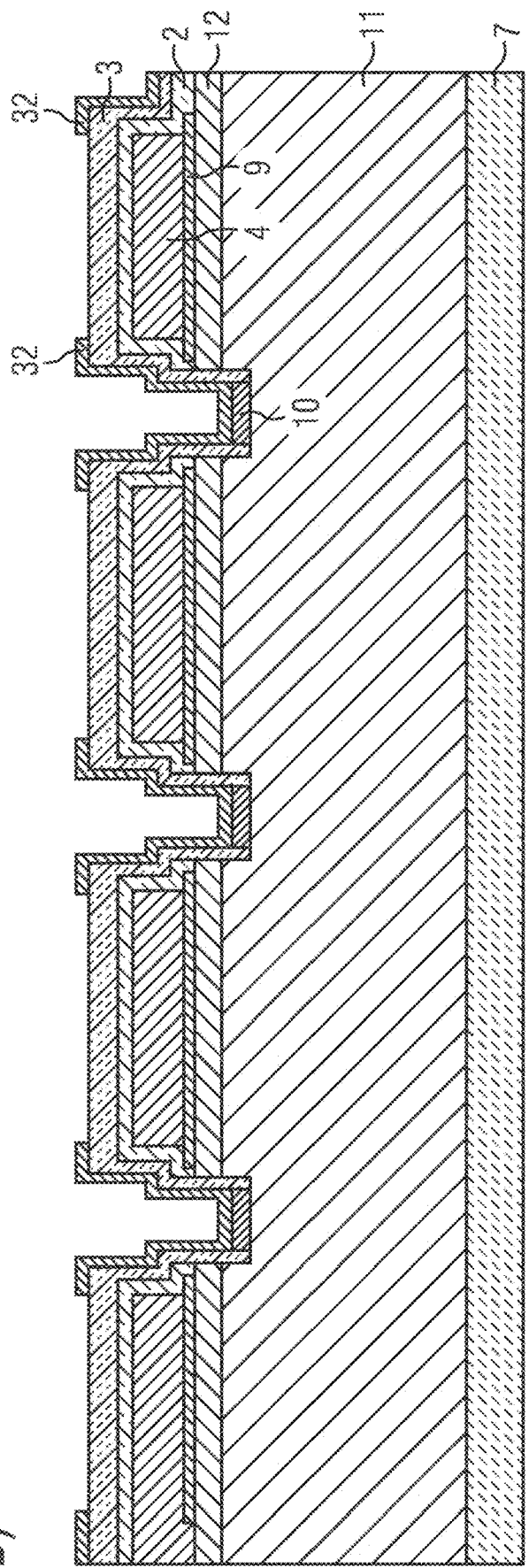

FIG 46
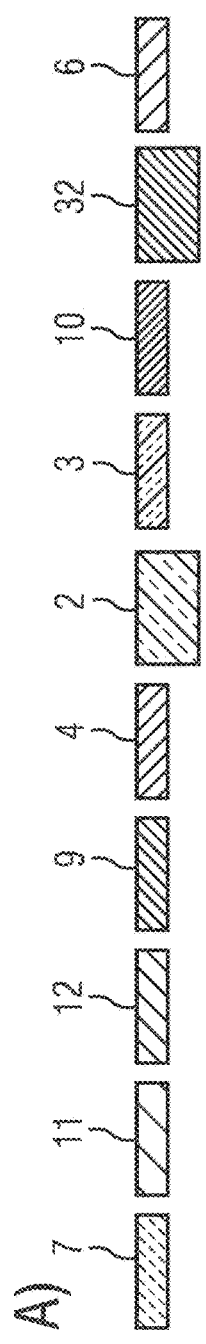
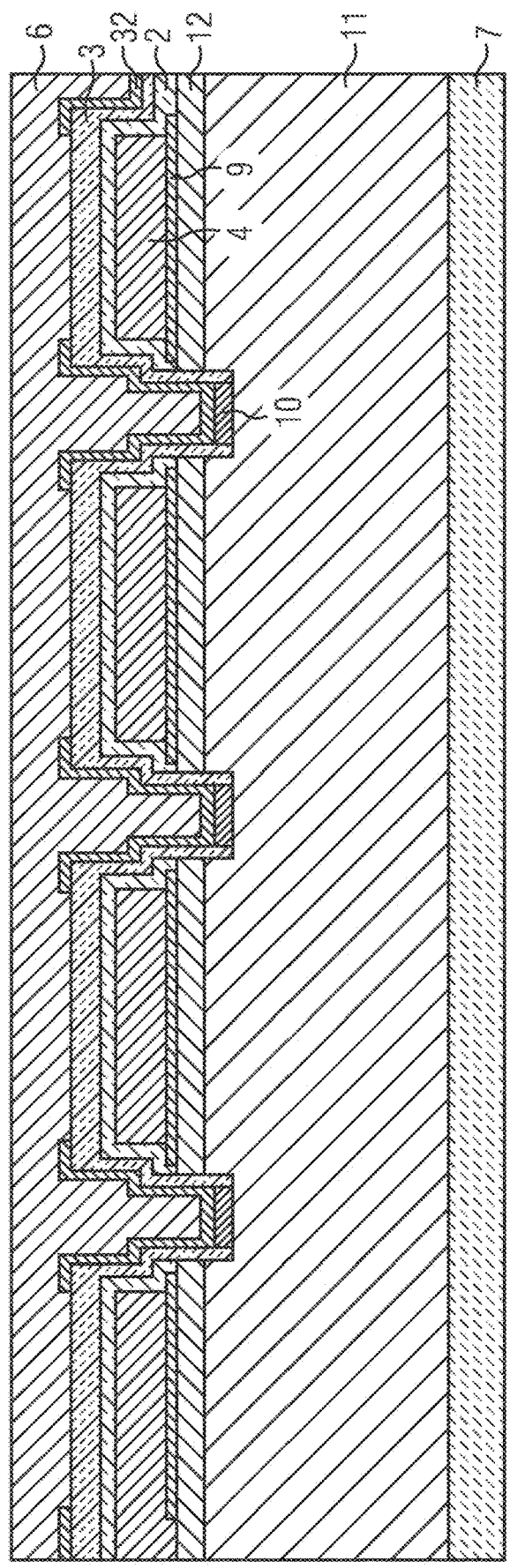

FIG 50
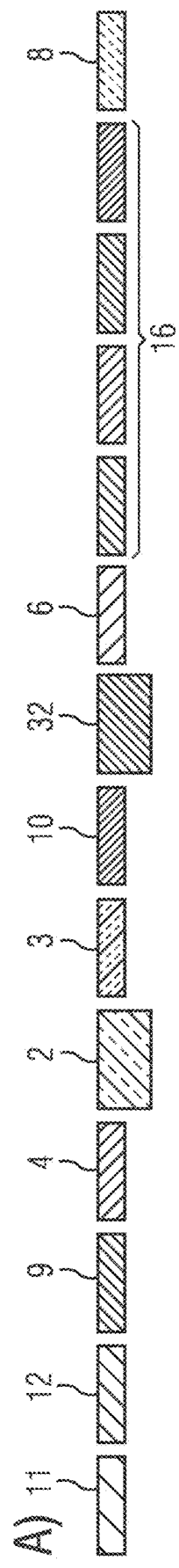
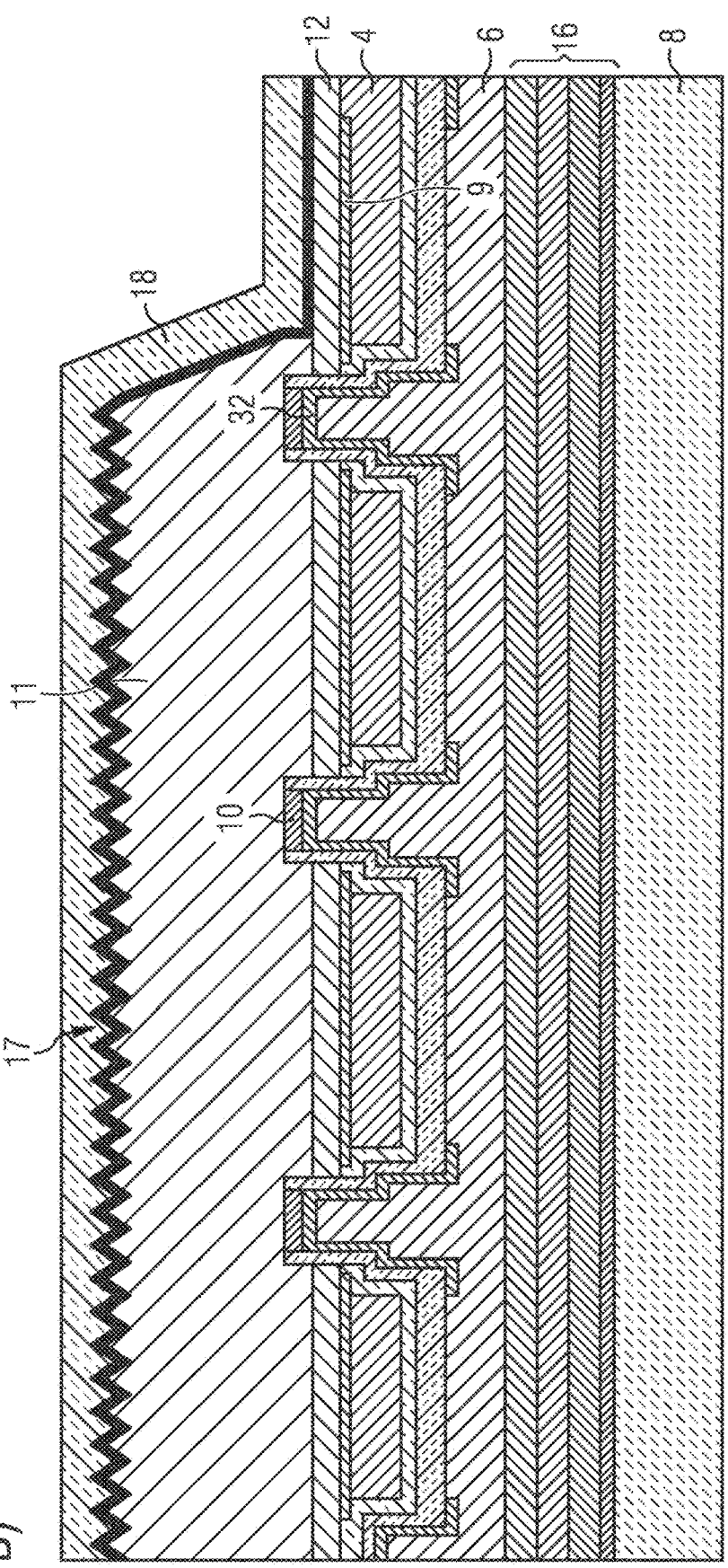

METHOD FOR PRODUCING AN OPTOELECTRONIC COMPONENT, AND OPTOELECTRONIC COMPONENT

CROSS-REFERENCE TO RELATED APPLICATIONS

The present application is a national stage entry according to 35 U.S.C. § 371 of PCT application No.: PCT/EP2018/068270 filed on Jul. 5, 2018; which claims priority to German Patent Application Serial No.: 10 2017 117 414.1, which was filed on Aug. 1, 2017; which is incorporated herein by reference in its entirety and for all purposes.

TECHNICAL FIELD

The invention relates to a method for producing an optoelectronic component. Furthermore, the invention relates to an optoelectronic component, which is produced using the method described here.

BACKGROUND

One object to be achieved is to provide a method for producing an optoelectronic component and an optoelectronic component, which can be produced easily and cost-effectively.

SUMMARY

In at least one embodiment, the method for producing an optoelectronic component includes steps A) to F), in particular in the sequence specified here:

A) Providing a semiconductor layer sequence. The semiconductor layer sequence is provided on an auxiliary carrier. The semiconductor layer sequence includes at least one n-doped semiconductor layer, at least one p-doped semiconductor layer, and an active layer arranged between the p-doped and n-doped semiconductor layers.

B) Applying a first insulation layer. The first insulation layer is applied over the entire surface to the n-doped semiconductor layer.

C) Structuring the first insulation layer.

D) Applying a first metallization. The first metallization is used for contacting the p-doped semiconductor layer. Simultaneously or subsequently to or before the application of the first metallization, the application of a second metallization is performed. The second metallization is used for contacting the n-doped semiconductor layer. The first and/or second metallization is applied over the entire surface to the n-doped semiconductor layer, so that the first and second metallization are connected to one another. In particular, the metallizations are electrically and/or mechanically connected to one another.

E) Chemical-mechanical polishing of the first and the second metallization, so that a planar surface is created and the two metallizations are spatially separated from one another. In particular, the two metallizations are electrically and/or mechanically separated from one another.

F) Applying a second insulation layer for the electrical insulation of the first and second metallization. The second insulation layer can subsequently be structured.

According to at least one embodiment, the method includes a step A), providing a semiconductor layer sequence. The semiconductor layer sequence includes at least one n-doped semiconductor layer, at least one p-doped semiconductor layer, and active layers arranged between the n-doped and p-doped semiconductor layer. The semiconductor layers are based on a III-V compound semiconductor material. "Based on a nitride compound semiconductor material" means in the present context that the semiconductor layer sequence or at least one layer thereof includes a III-nitride compound semiconductor material, such as $In_xAl_yGa_{1-x-y}N$, wherein $0 \leq x \leq 1$, $0 \leq y \leq 1$, and $x+y \leq 1$. In this case, this material does not necessarily have to have a mathematically exact composition according to the above formula. Rather, it may include one or more dopants and additional components which essentially do not change the characteristic physical properties of the $In_xAl_yGa_{1-x-y}N$ material. For the sake of simplicity, however, the above formula only includes the essential components of the crystal lattice (In, Al, Ga, N), even if they can be partially replaced by small quantities of further materials.

The semiconductor layer sequence contains an active layer having at least one p-n transition and/or having one or having multiple quantum well structures. In operation of the component, electromagnetic radiation is generated in the active layer. A wavelength of the radiation is in the ultraviolet and/or visible range, in particular at wavelengths between 420 nm inclusive and 680 nm inclusive, for example, between 440 nm inclusive and 480 nm inclusive.

According to at least one embodiment, the optoelectronic component is a light-emitting diode, abbreviated LED. The component is then configured to emit blue, yellow, green, red, orange, and/or white light.

According to at least one embodiment, the semiconductor layer sequence is applied to an auxiliary carrier. Sapphire can be used as the auxiliary carrier, for example. Alternatively, the auxiliary carrier may include, for example, silicon, silicon carbide, or gallium nitride.

The auxiliary carrier can be removed again in subsequent method steps. The auxiliary carrier is removed and a carrier which, for example, consists of silicon or contains silicon, is integrated into the optoelectronic component.

According to at least one embodiment, the method includes a step B), applying a first insulation layer over the entire surface to the n-doped semiconductor layer. The first insulation layer is structured in method step C).

According to at least one embodiment, step A1), applying an, in particular dielectric, layer to the p-doped semiconductor layer, is performed after step A) and before step B). In particular, the, in particular dielectric, layer is applied in direct mechanical and/or electrical contact to the p-doped semiconductor layer. The, in particular dielectric, layer is formed from ITO or contains ITO. The, in particular dielectric, layer can also be formed from other oxides or contain other oxides. The, in particular dielectric, layer contains a transparent conductive oxide (TCO). The, in particular dielectric, layer can also be formed as electrically conductive in this case.

Transparent electrically conductive oxides (TCO) are transparent electrically conductive materials, generally metal oxides, for example, zinc oxide, tin oxide, cadmium oxide, titanium oxide, indium oxide, indium tin oxide (ITO), or aluminum zinc oxide (AZO). In addition to binary metal oxygen compounds such as, for example, ZnO, $SnO_2$, or $In_2O_3$ ternary metal oxygen compounds such as, for example, $Zn_2SnO_4$, $CdSnO_3$, $ZnSnO_3$, $MgIn_2O_4$, $GaInO_3$, $Zn_2In_2O_5$, or $In_4Sn_3O_{12}$ or mixtures of different transparent conductive oxides are also among the group of the TCOs. Furthermore, the TCOs do not necessarily correspond to a stoichiometric composition and can also be p-doped or n-doped.

The, in particular dielectric, layer protects the p-doped semiconductor layer, which is p-GaN in particular, from subsequent photoetching and plasma etching processes. In particular, the dielectric layer is formed as a thin film layer. This means here that the layer thickness is between 10 and 100 nm.

Moreover, the, in particular dielectric, layer can be used in a later method step as a starting layer for the first mirror element (p-mirror layer stack).

According to at least one embodiment, step A2), structuring of the p-doped semiconductor layer, is performed after step A1) and before step B), so that the n-doped semiconductor layer is exposed, wherein the exposure of the n-doped semiconductor layer is optionally performed by means of a first mask, in particular a photomask, and plasma etching. The plasma etching is performed after application of the first mask. Alternatively or additionally, the first mask can subsequently be removed by means of a lift-off method. For example, the so-called drawing off (resist strip) or the lifting off by means of a wet chemical process (lift-off process) can be used as the lift-off method.

According to at least one embodiment, the first insulation layer is applied to the structured p-doped semiconductor layer.

According to at least one embodiment, the component includes a second insulation layer. The first and/or second insulation layer are formed as a distributed Bragg reflector (DBR) having an alternative layer sequence. For example, an alternating arrangement of one layer made of silicon dioxide and one layer made of titanium dioxide or an alternating layer sequence of silicon dioxide and niobium oxide can be used as the layer sequence. In particular, the final distributed Bragg reflector is dependent on the final wavelength of the semiconductor layer sequence. The first and/or second insulation layer can be used to protect the so-called combination metal—for example, a subsequent layer, which contains silver or consists of silver—for the n-contact or to implement a structure without combination metal.

The first and/or second insulation layer can be produced using routine production methods, for example sputtering, chemical vapor deposition (CVD), PE-CVD, atomic layer deposition (ALD), or spin-on. These methods are sufficiently known to a person skilled in the art and will therefore not be explained in greater detail at this point.

For example, the alternating layer sequence can consist of or include at least two layer pairs made of titanium dioxide and silicon dioxide or niobium oxide and silicon dioxide.

According to at least one embodiment, the method includes a step C), structuring the first insulation layer. The structuring of the first insulation layer is performed in step C) between adjacent structured regions of the p-doped semiconductor layer.

Alternatively or additionally, the first insulation layer is structured in a ring shape.

Alternatively, the first insulation layer can be structured in a double ring shape, so that a core of the first insulation layer is produced, which is enclosed in a ring shape by the second metallization.

According to at least one embodiment, the structuring of the first insulation layer is performed by means of a plasma process.

According to at least one embodiment, after step C), a first mirror element for the p-doped semiconductor layer and/or a second mirror element for the n-doped semiconductor layer is applied. The first mirror element can firstly be applied and subsequently the second mirror element or vice versa, i.e., firstly the second mirror element and subsequently the first mirror element, to the structured regions of the p-doped semiconductor layer. In particular, the first mirror element is arranged directly on the, in particular dielectric, layer. The second dielectric mirror element is arranged directly on the first mirror element. In addition, the second dielectric mirror element can extend over the regions of the first insulation layer which are arranged between adjacent p-doped semiconductor layer regions.

According to at least one embodiment, the method includes a step D), applying a first metallization. The first metallization is used for electrically contacting the p-doped semiconductor layer. A second metallization can additionally or alternatively be applied. The second metallization is used for contacting the n-doped semiconductor layer. The first and/or the second metallization can be applied over the entire surface to the n-doped semiconductor layer, so that the first and second metallization are mechanically and/or electrically connected to one another.

According to at least one embodiment, the first and the second metallization are produced simultaneously. In other words, the contacts of both the p-doped semiconductor layer and the n-doped semiconductor layer can be produced in one process step here. This saves time, material, and costs.

According to at least one embodiment, the first mirror element is formed from or using silver. The first mirror element can additionally include zinc oxide. The proportion of the silver in the first mirror element is in particular greater than the proportion of the zinc oxide. Alternatively or additionally, the second mirror element includes silver. In addition, the second mirror element may include zinc oxide. The proportion of the silver in the second mirror element can be less than the proportion of the zinc oxide.

According to at least one embodiment, the second mirror element is applied over the entire surface to the n-doped semiconductor layer.

According to at least one embodiment, the first and/or second metallization is applied by means of sputtering, PVD, PE-CVD, or plating. Alternatively or additionally, the first and/or second metallization includes platinum, gold, and titanium or the individual metals separately.

According to at least one embodiment, the method includes a step E), chemical-mechanical polishing of the first and the second metallization, so that a planar surface is produced. In addition, the two metallizations are spatially separated from one another by the chemical-mechanical polishing.

The chemical-mechanical polishing, also referred to as chemical-mechanical planarization (CMP), is a polishing method in wafer processing, in order to remove thin layers uniformly. The process is known per se to a person skilled in the art, but not in a process flow as described here. Therefore, a more detailed explanation will not be made of the actual method.

According to at least one embodiment, the method includes a step F), applying a second insulation layer. The second insulation layer is used for the electrical insulation of the first and/or second metallization. The second insulation layer can be structured in a subsequent method.

According to at least one embodiment, a step G), application of a third metallization, is performed after step F).

According to at least one embodiment, a step H), application of a contact metallization, is performed alternatively or additionally after step G).

According to at least one embodiment, a step I), re-bonding of the arrangement produced in step H) to a carrier, is performed after step H), wherein the carrier optionally includes silicon. The auxiliary carrier is removed in particular.

According to at least one embodiment, a step J), introduction of a trench, in particular a mesa trench, at least in the one doped semiconductor layer, is performed after step I). The trench extends in the n-doped semiconductor layer. In addition, the trench can also extend from the n-doped semiconductor layer into the active layer. Additionally or alternatively, the trench can extend from the n-doped semiconductor layer via the active layer into the p-doped semiconductor layer.

According to at least one embodiment, the method includes a step K), roughening of the semiconductor layer sequence on the side opposite to the carrier, after step J). The roughening can be performed by different methods, wherein the wet-chemical process by means of KOH is the most widespread. Alternatively, however, a combination of lithography and plasma etching is also conceivable.

Subsequently, a passivation layer can be applied to the n-doped semiconductor layer. For example, silicon dioxide can be used as the passivation layer or aluminum oxide or a combination of both.

According to at least one embodiment, the method includes a step L), structuring or opening of the passivation layer, after step K), so that the p-doped semiconductor layer is opened at least in a small region for application of a contact pad. A metal can subsequently be introduced as a contact pad. For example, a platinum-gold double layer, in particular having thin platinum, can be used as the metal.

The optoelectronic component described here can be produced using the method described here. In this case, all statements and definitions made for the method apply to the optoelectronic component and vice versa.

According to at least one embodiment, the optoelectronic component includes a semiconductor layer sequence. The semiconductor layer sequence includes at least one n-doped semiconductor layer, at least one p-doped semiconductor layer, and an active layer arranged between the p-doped and n-doped semiconductor layers. The component includes a plurality of passages, i.e., at least two passages. The passages extend through the p-doped semiconductor layer to the n-doped semiconductor layer. The passages are formed ring-shaped or double ring-shaped observed in a top view. Observed in the lateral cross section, the passages are arranged laterally in relation to the p-doped semiconductor layer at least in regions. The p-doped semiconductor layer is formed structured in this case, and thus has regions of p-doped semiconductor layers. The passages include side walls. The side walls are covered by a first insulation layer. In the case of the double ring-shaped design, a core of the first insulation layer is arranged inside the passages. Observed in the lateral cross section, a second metallization for contacting the n-doped semiconductor layer is arranged between the core of the first insulation layer and the first insulation layer covering the side walls of the passages. Observed in a top view, the second metallization thus encloses the core of the first insulation layer in a ring shape.

According to at least one embodiment, the optoelectronic component can be obtained according to a method described here.

The inventors have recognized that the different heights of the individual previously applied layers or elements can be removed by step E) described here, i.e., the chemical-mechanical polishing of the first and second metallization, and the surface can thus be planarized.

The method described here differs from conventional methods in some process steps and in particular in the arrangement of the sequence of the process steps. Firstly, a p-doped semiconductor layer, in particular made of p-GaN, can be structured and subsequently a first insulation layer can be vertically applied. This can be produced by so-called photo processes. An insulation can thus be produced between the p-doped and n-doped semiconductor layer, in particular the p-GaN and n-GaN. The first insulation layer can be formed ring-shaped or double ring-shaped. Alternatively, insulation layers which are not formed ring-shaped, and which are arranged in the region of the adjacent p-doped semiconductor layer sequence, can also be used. The first insulation layers formed ring-shaped or double ring-shaped increase the brightness by increasing the reflective area. Moreover, the first and second metallization, i.e., the contacts for the n-doped and p-doped semiconductor layer, can be applied at the same time, which again is performed in multiple process steps in comparison to the incorporation of a single step E). Step E), i.e., the chemical-mechanical polishing, is required to planarize the component and to electrically insulate the first and second metallization from one another or to separate them, so that a short circuit is avoided in operation. Using the method described here, at least two photostructuring steps and various lift-off methods can be saved in comparison to conventional described processes.

The first insulation layer can be formed, for example, from silicon dioxide. Alternatively, the first insulation layer can also be formed from a distributed Bragg reflector. The first insulation layer is arranged vertically when observed in lateral cross section. Moreover, a so-called combination mirror can be used on the upper side of the n-contact. In particular, however, a so-called combination mirror is entirely omitted here. The second insulation layer can be applied in a planar manner to the arrangement and thus the adhesion to the n-metal can be monitored. This can be performed, for example, by plasma treatment, for example, using oxygen flow, wherein the layers located underneath are not influenced thereby.

Overall, the inventors have recognized that the method described here increases the so-called performance, saves costs, and results in an easy process flow. Moreover, fewer defects occur during the production of the bonding and also other process steps are saved. The inventors have recognized that by way of the use of the chemical-mechanical polishing for planarization of the first and second metallization, a planar surface can be produced which is maintained until the application of the bond structures. Moreover, the first insulation layer is formed vertically when observed in lateral cross section, so that it is used for insulating the p-doped and n-doped semiconductor layer. The first and second metallization are moreover applied simultaneously. The first and second mirror element can consist of silver or include it. Alternatively or additionally, zinc oxide or alternatively other materials can be added, which protect the p-doped semiconductor layer during further process steps, such as photo steps or structuring steps. The mirror elements may include a layer structure made of ITO/silicon dioxide/ITO/silver. The, in particular dielectric, layer can be used as a protective layer for the p-doped semiconductor layer during the process flow. The ITO is used here as a p-contact surface. The $SiO_2$ located above it is used as a dielectric mirror, i.e., a part of the light is already reflected here. The second ITO layer is necessary since silver does not adhere to $SiO_2$, i.e., it is primarily used as an adhesion promoter.

Alternatively to ITO as a material for the, in particular dielectric, layer, other so-called TCOs can also be used. The first and second insulation layer can also consist of a single layer or alternatively of a so-called DBR. The DBR as a vertical p-n insulation includes a combination of silicon dioxide with other materials such as titanium dioxide, tantalum oxide, magnesium fluoride, or a combination thereof. The ring-shaped or double ring-shaped design of the first insulation layer moreover reduces the absorption losses of the light. In particular, no DBR remains standing in the center and the metallization corresponds to a cylinder and not a ring.

The metallizations can be applied, for example, by means of PVD or PE-CVD or plating. Alternatively, a nucleation layer can also be used for electroplating. Due to the new process flow, the combination mirror can be omitted if the first or second insulation layer is a DBR. In this case, light hardly comes to the top and thus cannot be absorbed at or in the second metallization. If a small part possibly still comes through, the combination mirror can also be provided, however.

The inventors have recognized that the photostructuring steps can be reduced from seven to five by the method described here. Moreover, the lift-off methods can also be reduced from seven to three or five. Moreover, it is possible that the so-called combination mirror is not used. A plasma-based lift-off can also be performed alternatively to the lift-off method, in particular to the wet chemical lift-off. The method described here produces fewer fractures and holes during the bonding, less lift-off during the bonding as a result of the planarization of the first and second metallization. A better surface and adhesion monitoring is thus produced.

The method described here displays the following further advantages:

The process flow described here including chemical-mechanical polishing produces flat structures for the post-metallization. Moreover, in particular the first and second metallizations are produced at the same time. The p-doped semiconductor layer is etched as the first process step. A novel type of the first mirror element made of ITO/silicon oxide/ITO/silver is used. The, in particular dielectric, layer can be used as a protective layer for the p-doped semiconductor layer during the production. Moreover, a DBR can be used as p-n insulation in the horizontal direction. In addition to the standard-cylindrical VIA shape, in which a round contact is formed, a ring-shaped VIA can also be produced in the corresponding photostructuring step. The effective contact area can thus be reduced. This is possible because the current flow within the cylindrical standard VIA primarily occurs at the edge.

The so-called p-n metallization is applied simultaneously in addition to the sputtering and the PVD processes. Moreover, the chemical plating can be integrated easily into these process flows. Instead of chemical plating, electroplating or electroless plating can also be used. The use of a combination mirror does not necessarily have to be applied, since the DBR of the first insulation layer and/or second insulation layer displays sufficient reflection. The planarization enables a homogeneous metallization and bond metal layer application. Fewer fractures and holes are thus produced during the process. Furthermore, a flat surface enables a better adhesion within the layers, which ensures a reduction of layer detachments and/or lift-offs. The yield of the optoelectronic components is thus increased.

BRIEF DESCRIPTION OF THE DRAWINGS

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

FIGS. 1A to 26B each show a method for producing an optoelectronic component according to one embodiment and FIGS. 27A to 52 show a method for producing an optoelectronic component according to one comparative example.

DETAILED DESCRIPTION

Figure 5:
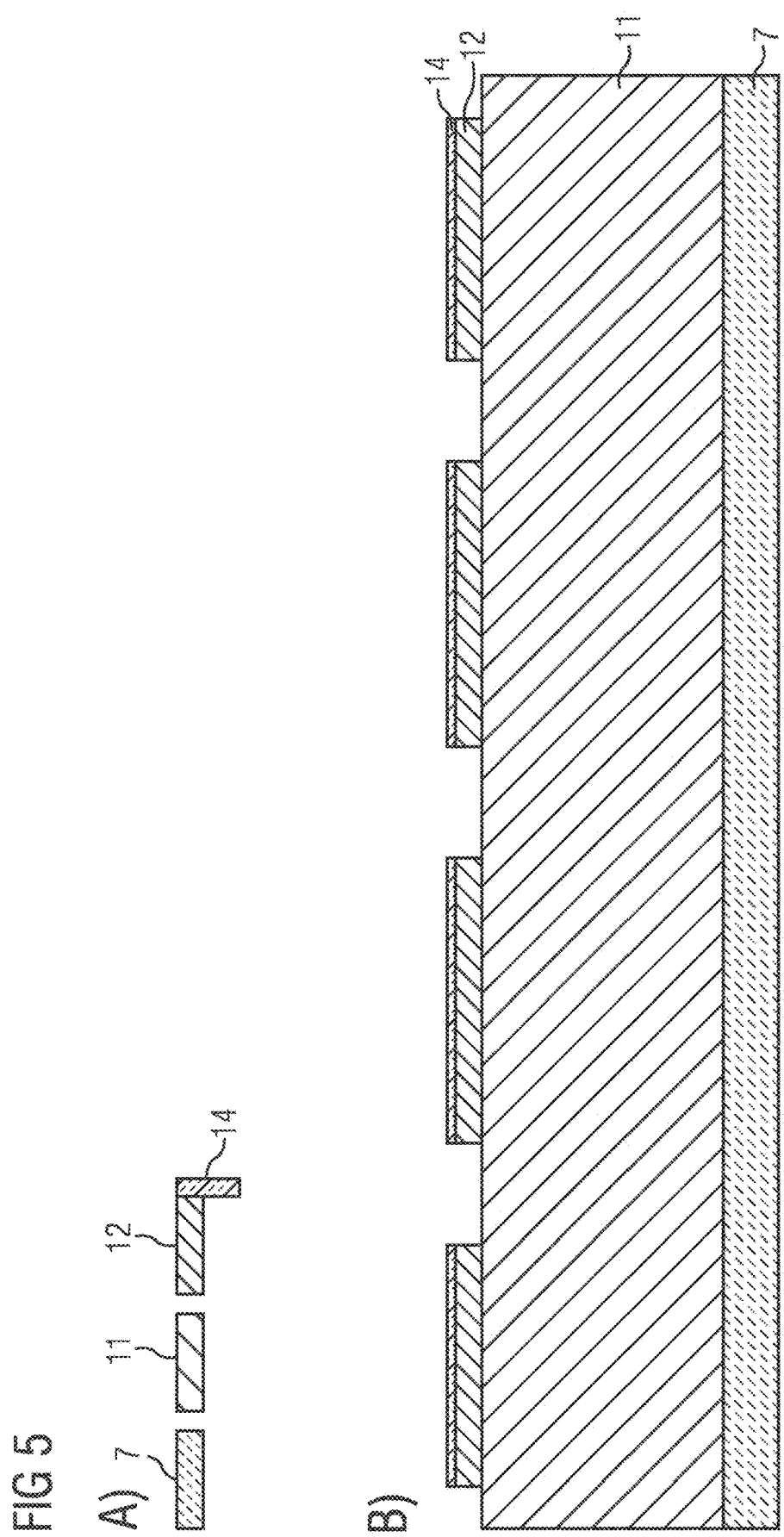

FIG. 1A shows the arrangement of the respective layers or elements, in particular the arrangement of an auxiliary carrier 7, on which an n-doped semiconductor layer 11, for example, made of n-GaN, and arranged thereon a p-doped semiconductor layer 12, for example, made of p-GaN, is applied. The auxiliary carrier 7 can be formed from sapphire, for example.

FIG. 1B shows the associated lateral cross section.

In the subsequent method step, as shown in FIGS. 2A and 2B, an, in particular dielectric, layer 14 can be applied over the entire surface to the p-doped semiconductor layer 12. The, in particular dielectric, layer 14 is formed from ITO. The, in particular dielectric, layer 14 is used for protecting the p-doped semiconductor layer 12 for further process steps, in particular photoetching and plasma etching processes, which occur later. The, in particular dielectric, layer 14 is formed as a thin layer. The, in particular dielectric, layer 14 can be used in a subsequent method step as a starting layer for the first mirror element (p-mirror layer sequence). FIG. 2B shows the associated lateral cross section.

As shown in FIGS. 3A and 3B, a first mask, photomask, 19 can subsequently be applied to the, in particular dielectric, layer 14. The first mask 19 is applied in a structured manner. In this case, all commercially available positive or negative resists can be used. These materials are sufficiently known to a person skilled in the art and are therefore not explained in greater detail at this point.

Subsequently, as shown in FIGS. 4A and 4B, the, in particular dielectric, layer 14 and the p-doped semiconductor layer 12 can be structured. The structuring 20 can be performed, for example, by means of plasma etching. The n-doped semiconductor layer 11 can thus be exposed.

As shown in FIG. 4B, the p-doped semiconductor layer 12 is no longer arranged over the entire surface on the n-doped semiconductor layer 11, but rather forms regions which are laterally spaced apart from one another.

In a subsequent method step, the photoresist mask or the first mask 19 can be removed by means of a lift-off method, for example, resist strip or wet chemical lift-off (FIGS. 5A and 5B). Subsequently, as shown in FIGS. 6A and 6B, the first insulation layer 12 can be applied over the entire surface to the n-doped semiconductor layer 11. The first insulation layer 2 encloses the p-doped semiconductor layer 12 and the, in particular dielectric, layer 14 like a frame and is thus in direct mechanical and/or electrical contact with the n-doped semiconductor layer 11, the p-doped semiconductor layer 12, and/or the, in particular dielectric, layer 14.

The first insulation layer 2 can be applied as a distributed Bragg reflector having an alternating layer sequence, as shown in FIG. 6C. Layers made of silicon dioxide and titanium dioxide or silicon dioxide and niobium dioxide or silicon dioxide and tantalum dioxide can be applied as alternating layers.

The first insulation layer 2 can be applied, for example, by means of routine methods, such as sputtering, CVD, PE-CVD, ALD, or spin-on. A so-called combination mirror or a combination metal for the n-contacting can be omitted due to the design of the first insulation layer 2 as a DBR.

A second photomask 23 can subsequently be applied to the first insulation layer 2. The photomask 23 or the second mask 23 can be applied in such a way that subsequently the first insulation layer 2 is structured in a ring shape 35 (see top view in FIG. 7C).

Alternatively or additionally, the first insulation layer 2 can be structured in a double ring shape 34 (see top view in FIG. 7D) and can additionally include a core of the first insulation layer 102 (FIG. 7D).

FIGS. 7C and 7D each show a top view of an optoelectronic component, FIG. 7A shows a schematic arrangement of the layer sequence, and FIG. 7B shows a schematic side view of an optoelectronic component during the production.

Subsequently, as shown in FIGS. 8A and 8B, the first insulation layer 2 can be structured 24 in the region between adjacent p-doped semiconductor layer regions 12 and passages 36 can thus be produced. The first insulation layer 2 thus includes side walls 101 and a core 102.

FIGS. 9A and 9B show the removal of the second mask 23. The removal can be performed by means of lift-off methods, such as resist strip or wet-chemical lift-off. The use of the, in particular dielectric, layer 14, in particular made of ITO, can protect the p-doped semiconductor layer 12 during the plasma processes and can moreover be the first layer for the first mirror element 9. If the insulation layer is a DBR layer, the dry etching process can be monitored very accurately via the endpoint definition in the etching process. It is precisely definable by the layer sequence when the last layer is etched before reaching the ITO. A special application protective of the ITO is thus possible.

In the next process step, as shown in FIGS. 10A and 10B, a third mask 25 can be applied in the region of the structured first insulation layer 2. This process step is optional and can also be omitted. Moreover, this application of the third mask 25 is used for protection of the first insulation layer 2, so that the first and/or second mirror element 9, 10 can be applied unobstructed.

The application of the first mirror element 9 can be optional. The first mirror element 9 can firstly be applied and subsequently the second mirror element 10. Alternatively, the second mirror element 10 can also firstly be applied and then the first mirror element 9. Alternatively, only the second mirror element 10 can also be arranged on the, in particular dielectric, layer 14.

FIGS. 11A and 11B show the application of the first mirror element 9. The first mirror element 9 is used for the p-doped semiconductor layer 12. The first mirror element 9 may include silver. In addition, the first mirror element 9 may include zinc oxide. The proportion of the silver in the first mirror element is greater than the proportion of the zinc oxide. The first mirror element 9 is the so-called mirror for the p-doped semiconductor layer 12 and can also include ITO/silicon dioxide/ITO/silver/zinc oxide by a so-called curing step. The layer structure is subject to the following function. The first ITO layer is used for current distribution. The silicon oxide is used as the first reflector and is supposed to reflect a majority of the incident light. The second ITO layer is necessary so that the silver adheres. Silver adheres very poorly to pure silicon oxide and therefore requires a so-called adhesion promoter.

Subsequently, as shown in FIGS. 12A and 12B, the third mask 25 can be removed again.

Figure 13:
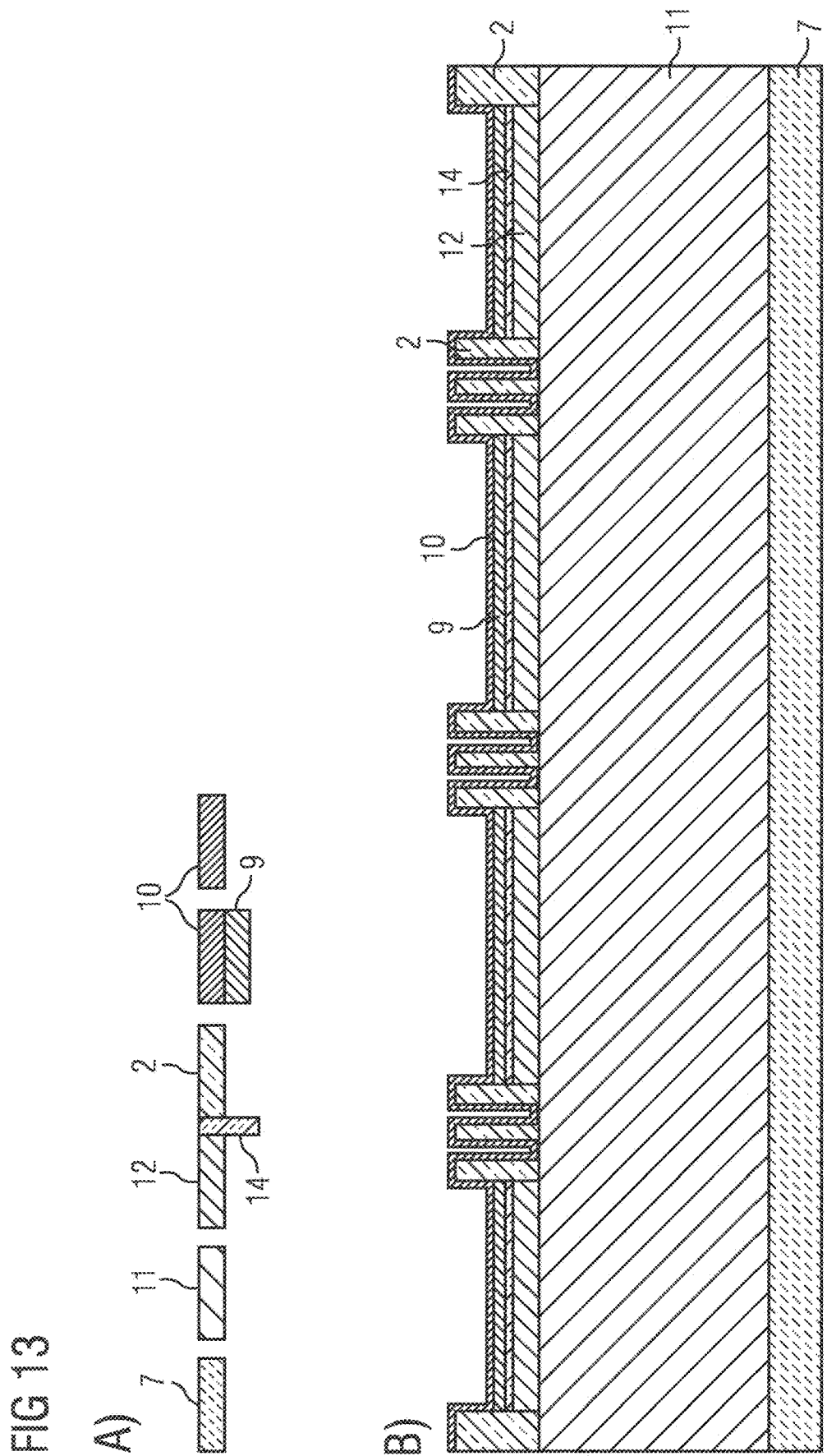

Subsequently, as shown in FIGS. 13A and 13B, the second mirror element 10 can be applied. The second mirror element 10 can be arranged over the entire surface on the n-doped semiconductor layer 11. The second mirror element 10 covers both the structured first insulation layer 2 and the first mirror element 9. The second mirror element 10 includes zinc oxide and silver. The proportion of the zinc oxide in the second mirror element 10 is greater than the proportion of the silver. The second mirror element 10 can also be applied to the upper side of the so-called p-contact pad, without negatively influencing it, one photostructuring step can thus be saved.

In the subsequent method step, as shown in FIGS. 14A and 14B, the first and second metallization 4, 5 can be applied. The first and/or second metallization 4, 5 are applied over the entire surface to the n-doped semiconductor layer 11. All possible technologies can be used for this purpose, such as sputtering, PVD, PE-CVD, or plating.

In the subsequent method step, as shown in FIGS. 15A and 15B, the first and second metallization 4, 5 or the metals which later form the first and second metallization 4, 5 can be chemically-mechanically polished 26 (CMP), so that a planar surface 261 is produced and the two metallizations 4, 5 are spatially separated from one another. Platinum, gold, copper, aluminum, and titanium can be used as the material for the first and second metallization 4, 5. The first and second metallization 4, 5 can be removed by means of CMP at a removal rate of a few nanometers per minute up to 100 nm per minute or more. In the case of the use of non-inert metals such as copper, it is to be ensured that an in-situ reduction step is performed before the subsequent process, deposition of a second insulation layer. In this case, a reducing gas, for example, hydrogen or ammonia, is introduced into the deposition chamber before the deposition of the insulation.

In further method step F), as claimed in claim 1 and as shown in FIGS. 16A and 16B, a second insulation layer 3 can be applied over the entire surface for the electrical insulation of the first and second metallization 4, 5. The second insulation layer 3 is applied horizontally when observed in the lateral cross section.

The second insulation layer 3 may include the same embodiments as the first insulation layer 2. In particular, the second insulation layer 3 can be formed as a DBR having an alternating layer sequence of silicon dioxide, titanium dioxide or silicon dioxide and niobium oxide.

If the vertical insulation 2 is sufficient for the light reflection and light absorption, it is not critical. Moreover, a new insulation material can be used, for example, silicon dioxide, silicon nitride, silicon oxycarbide, silicon carbonitride, or organo-silicon compounds. The second insulation layer 3 can be applied, for example, by means of sputtering, CVD, PE-CVD, ALD, or spin-on.

Subsequently, as shown in FIGS. 17A and 17B, a further mask 27 (fourth mask) can be applied. The fourth mask 27 is arranged in a structured manner on the second insulation layer 3.

As shown in FIGS. 18A and 18B, the second insulation layer 3 can subsequently be structured. In particular, the second insulation layer 3 is structured 28 in regions above adjacent p-doped semiconductor layer regions 12.

In the subsequent method step, as shown in FIGS. 19A and 19B, the fourth mask 27 can be removed again.

A third metallization 6 can subsequently be applied over the entire surface to the arrangement. The third metallization 6 may include, for example, titanium, platinum, gold, nickel, or a combination thereof. The third metallization 6 is used for contacting the n-doped semiconductor layer 11.

Figure 21:
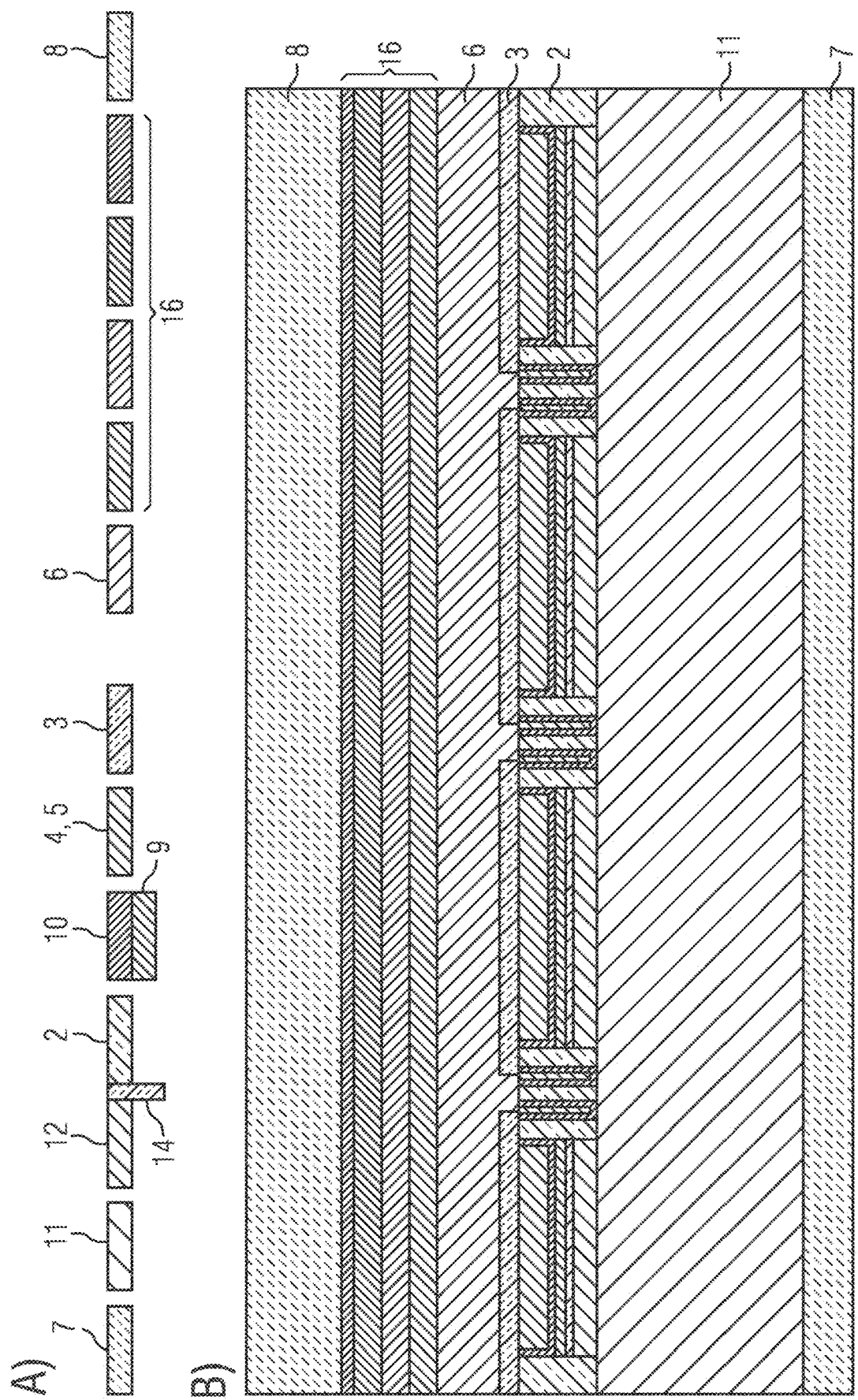

In a subsequent method step, as shown in FIGS. 21A and 21B, a contact metallization 16 can be applied. The contact metallization 16 is used for the bond pad metallization.

The contact metallization 16 includes a layer sequence. The layer sequence may include a layer, such as titanium, nickel, tin, titanium-gold, or a combination thereof. Subsequently, a layer made of titanium tungsten nitride, subsequently a layer made of gold, and subsequently a layer made of platinum can be arranged.

The contact metallization 16 can be arranged after a carrier 8, in particular made of silicon.

Figure 22:
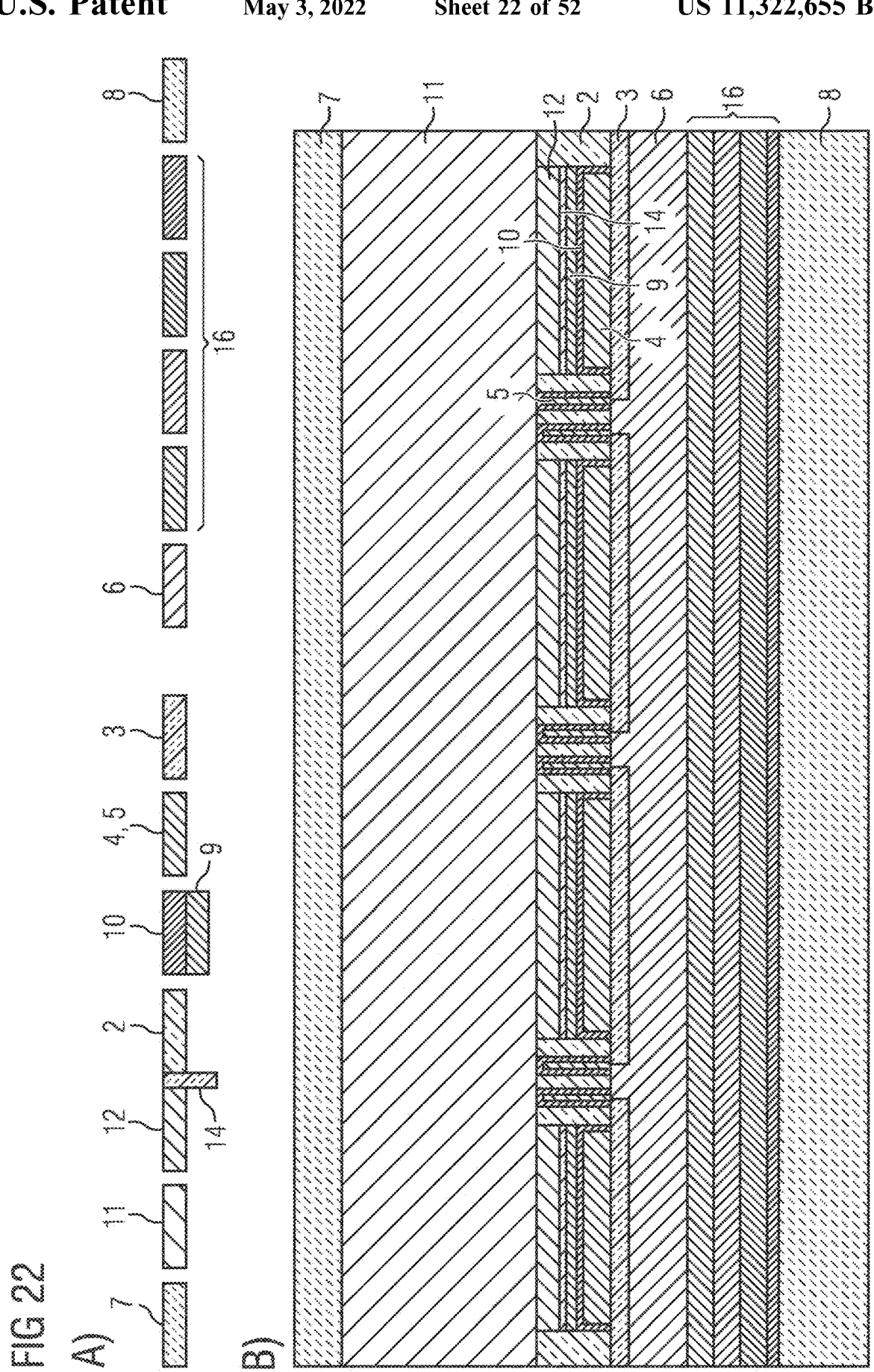

In the subsequent method step, as shown in FIGS. 22A and 22B, the component can be turned and the auxiliary carrier 7 can be removed and the carrier 8 can be arranged. The carrier 8 can be made of silicon and the auxiliary carrier 7 of sapphire.

Figure 23:
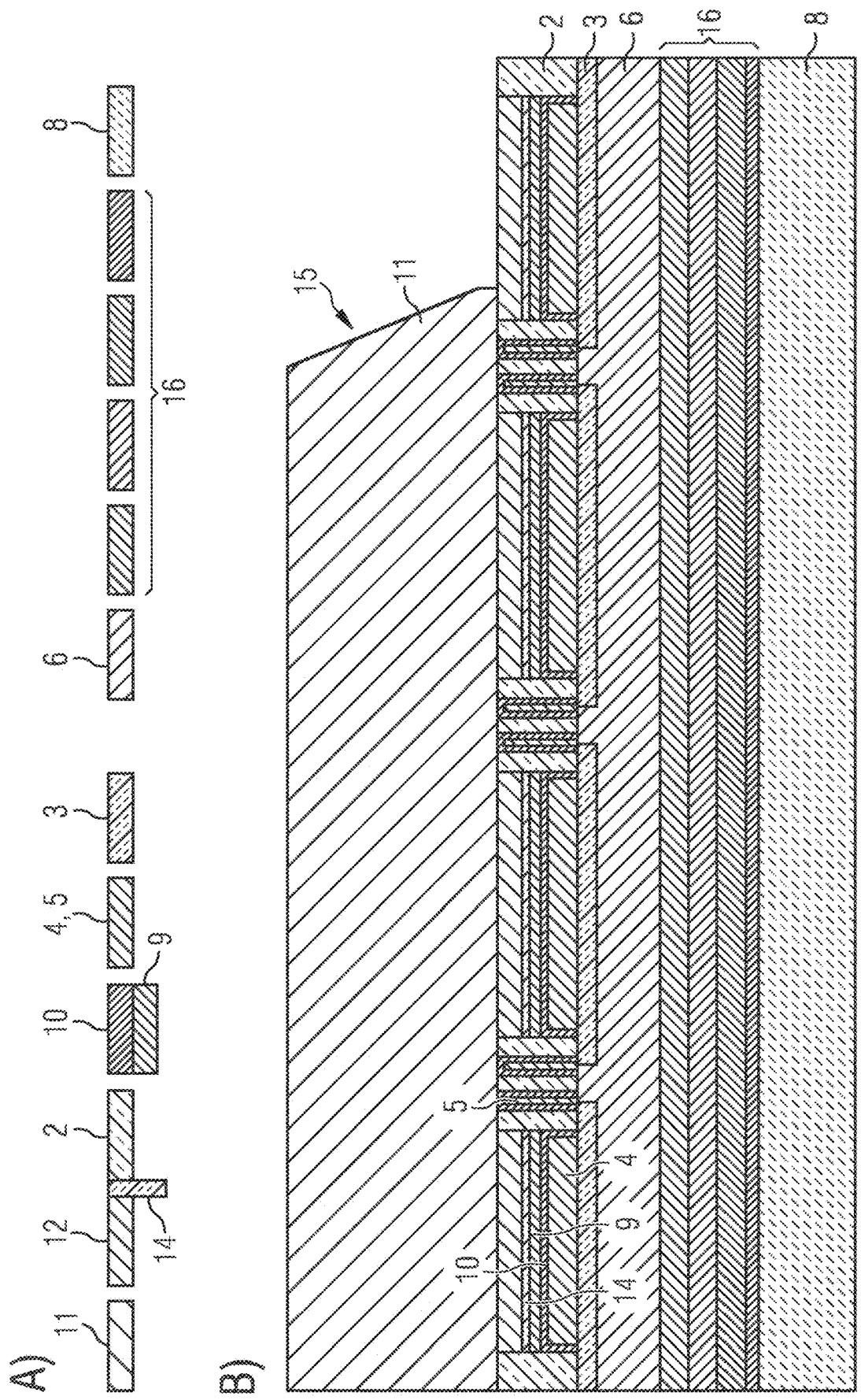

In a subsequent method step, a trench 15 can be introduced within the n-doped semiconductor layer 11, as shown in FIGS. 23A and 23B. In particular, the trench 15 extends through the entire n-doped semiconductor layer 11 up to the p-doped semiconductor layer 12.

Figure 24:
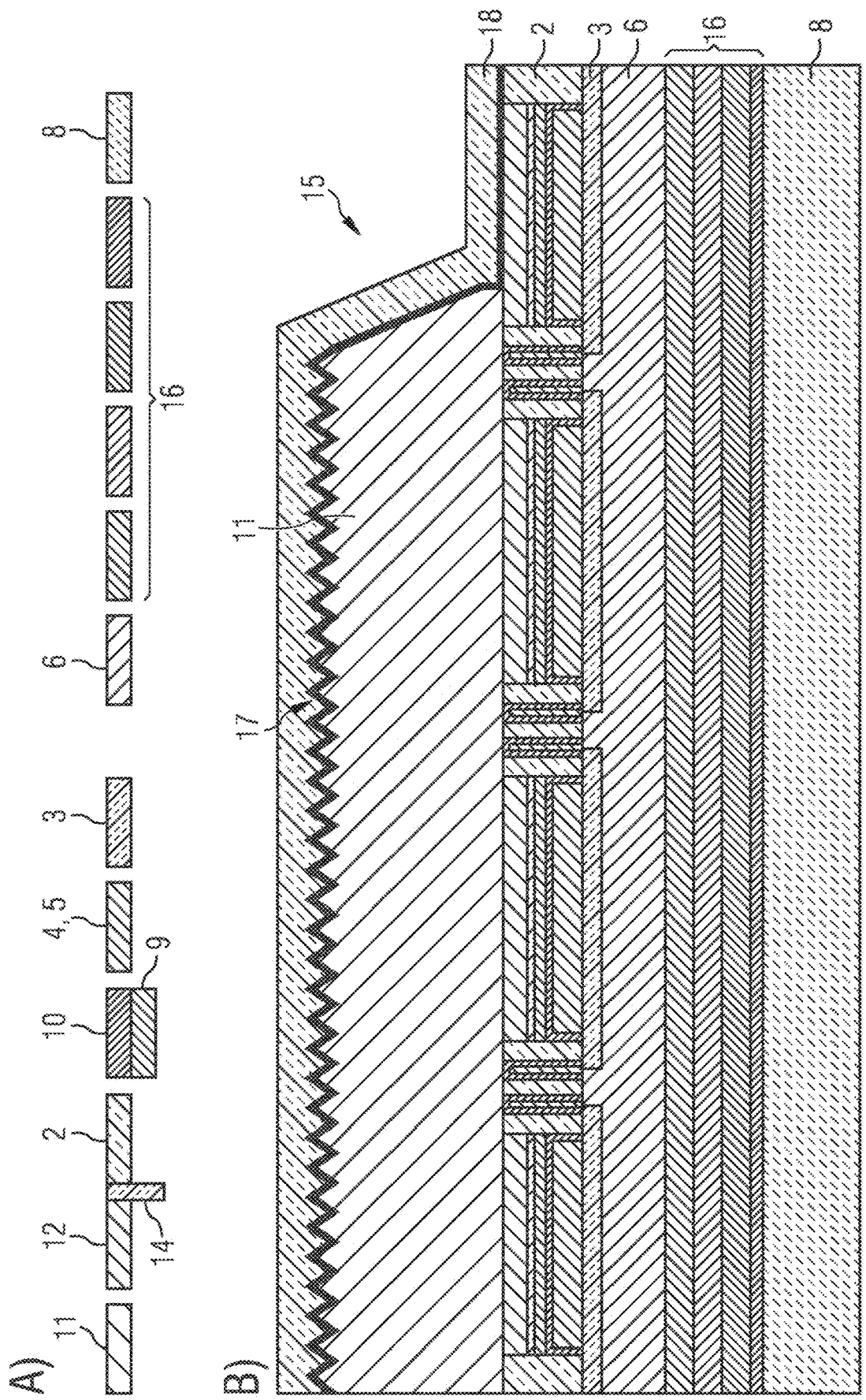

In the subsequent method step, as shown in FIGS. 24A and 24B, the n-doped semiconductor layer 11 can be roughened 17. A passivation layer 18 can be applied as the final layer. The passivation layer can be formed, for example, of silicon dioxide, aluminum dioxide, of another optically transparent material, or a combination of different materials or can consist thereof.

Figure 25:
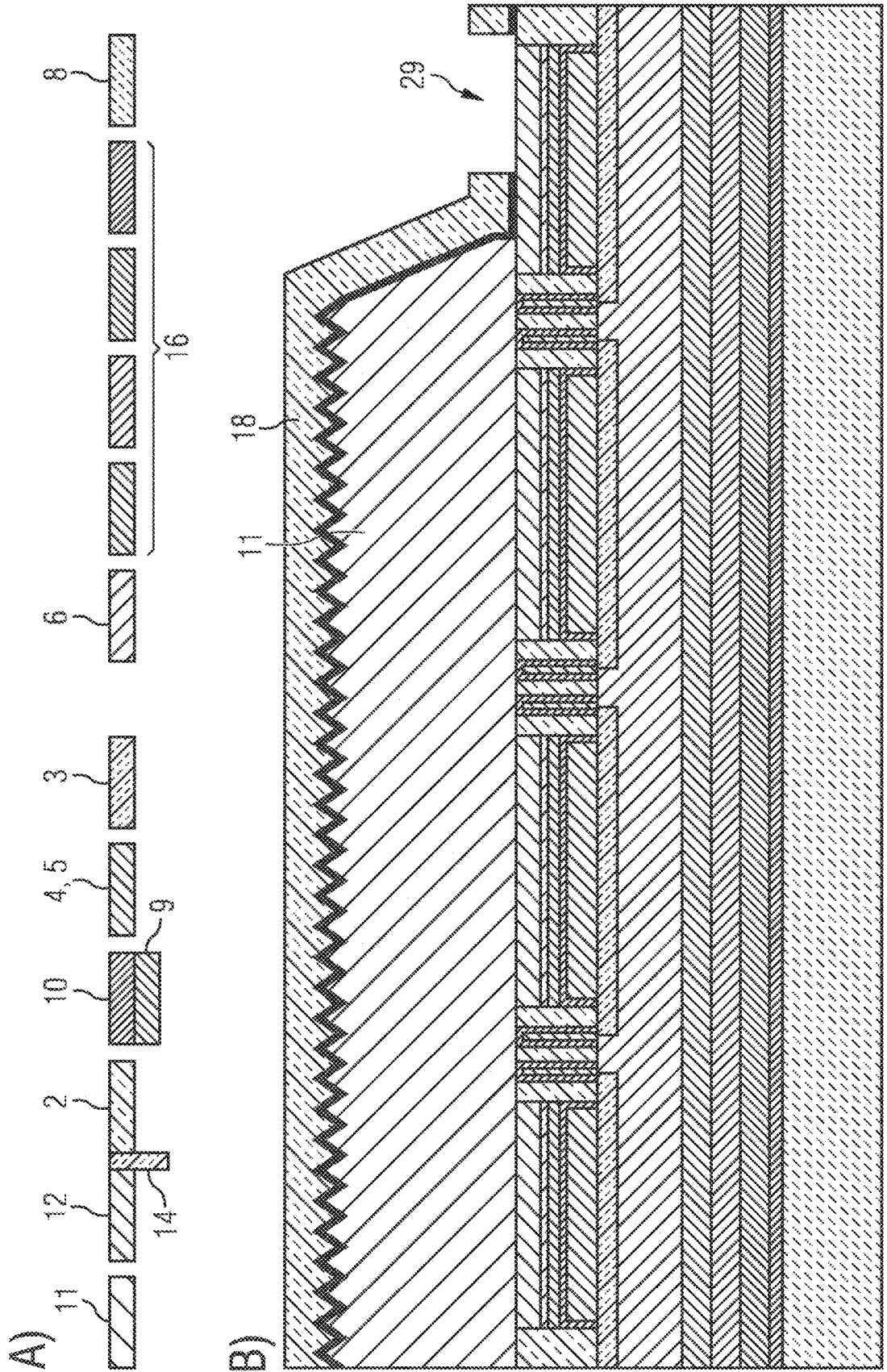

Subsequently, as shown in FIGS. 25A and 25B, an opening 29 can be introduced up to the p-doped semiconductor layer 12 in the passivation layer 18. This opening is used for contacting the p-doped semiconductor layer 12.

Figure 26:
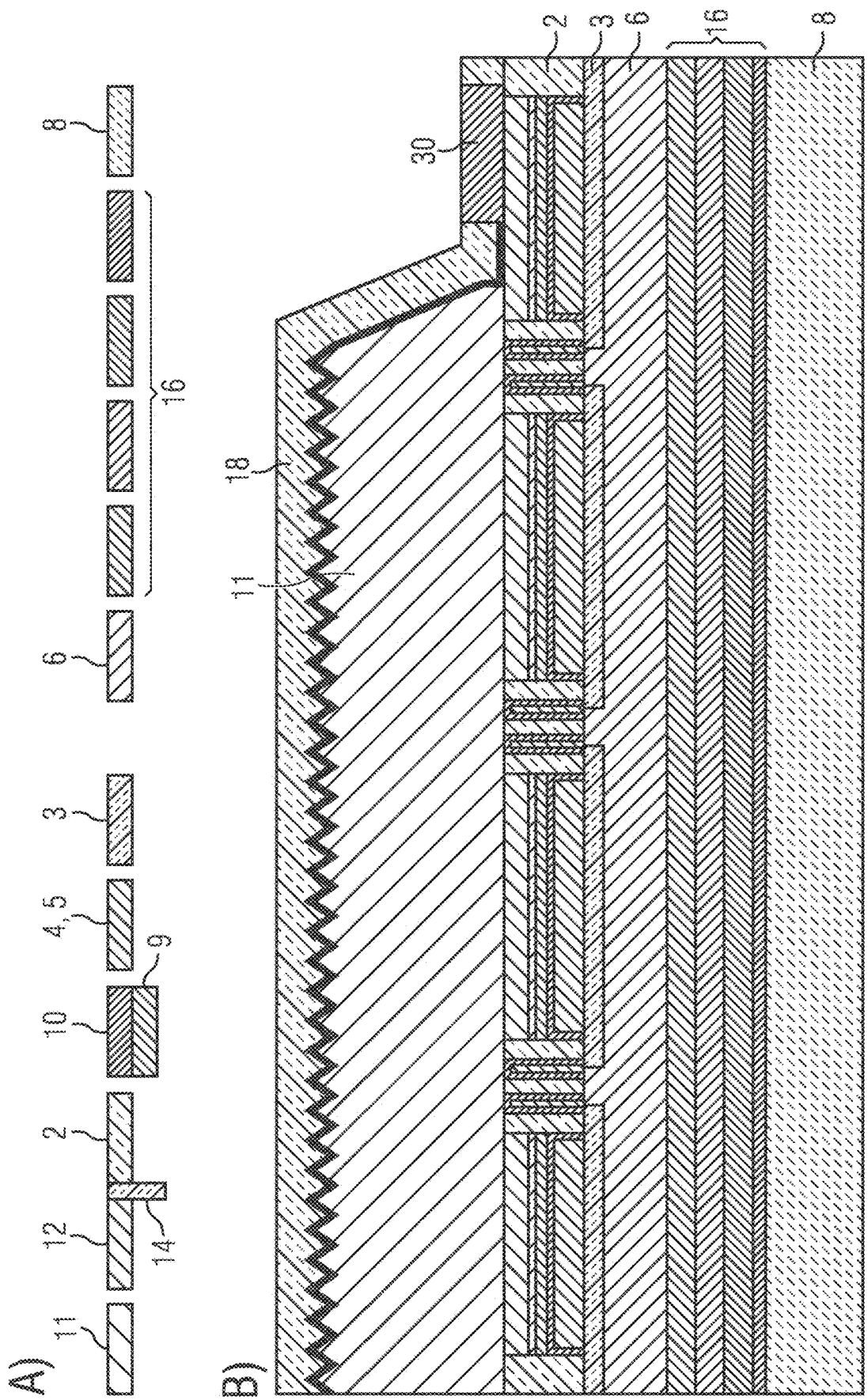
Figure 31:
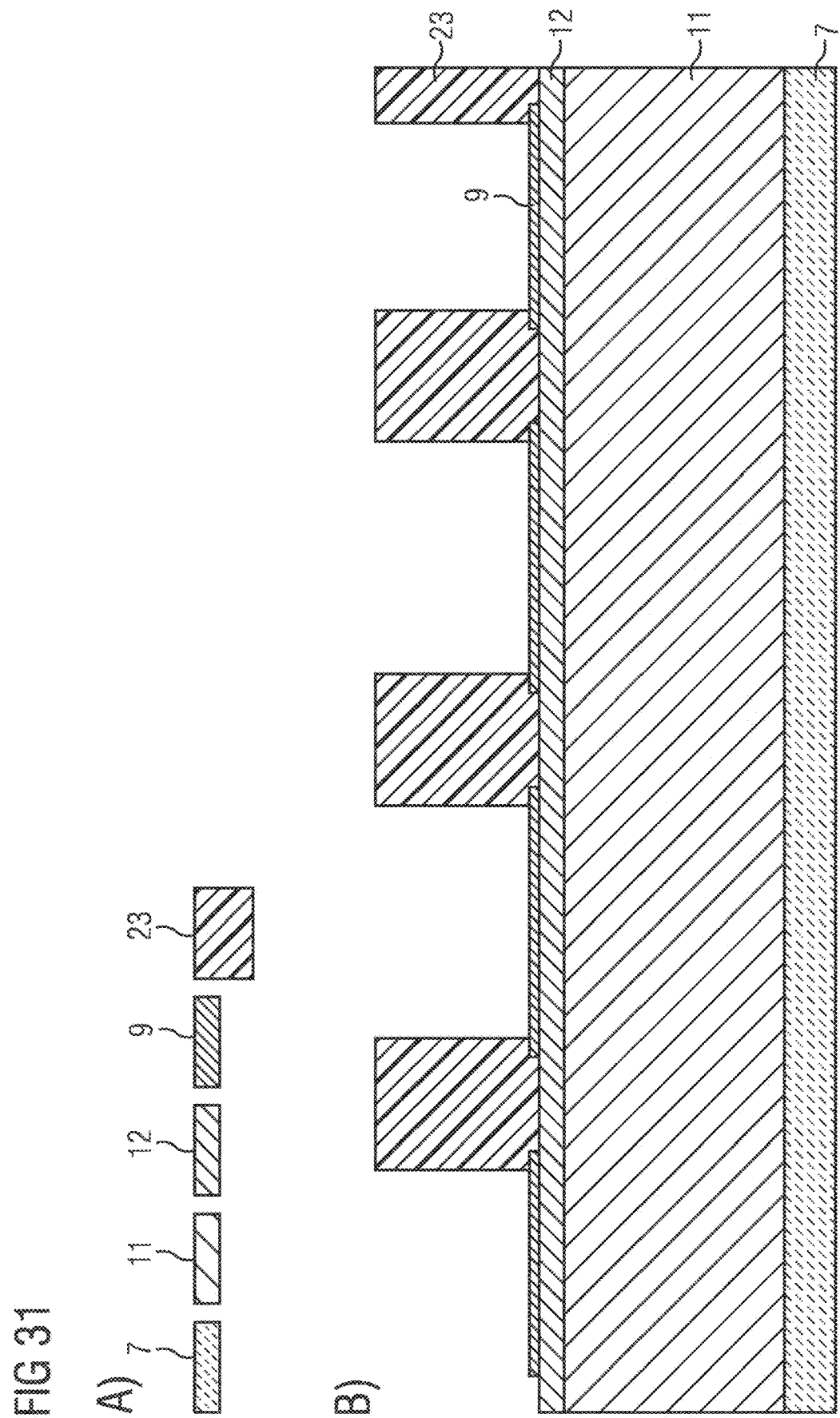
Figure 42:
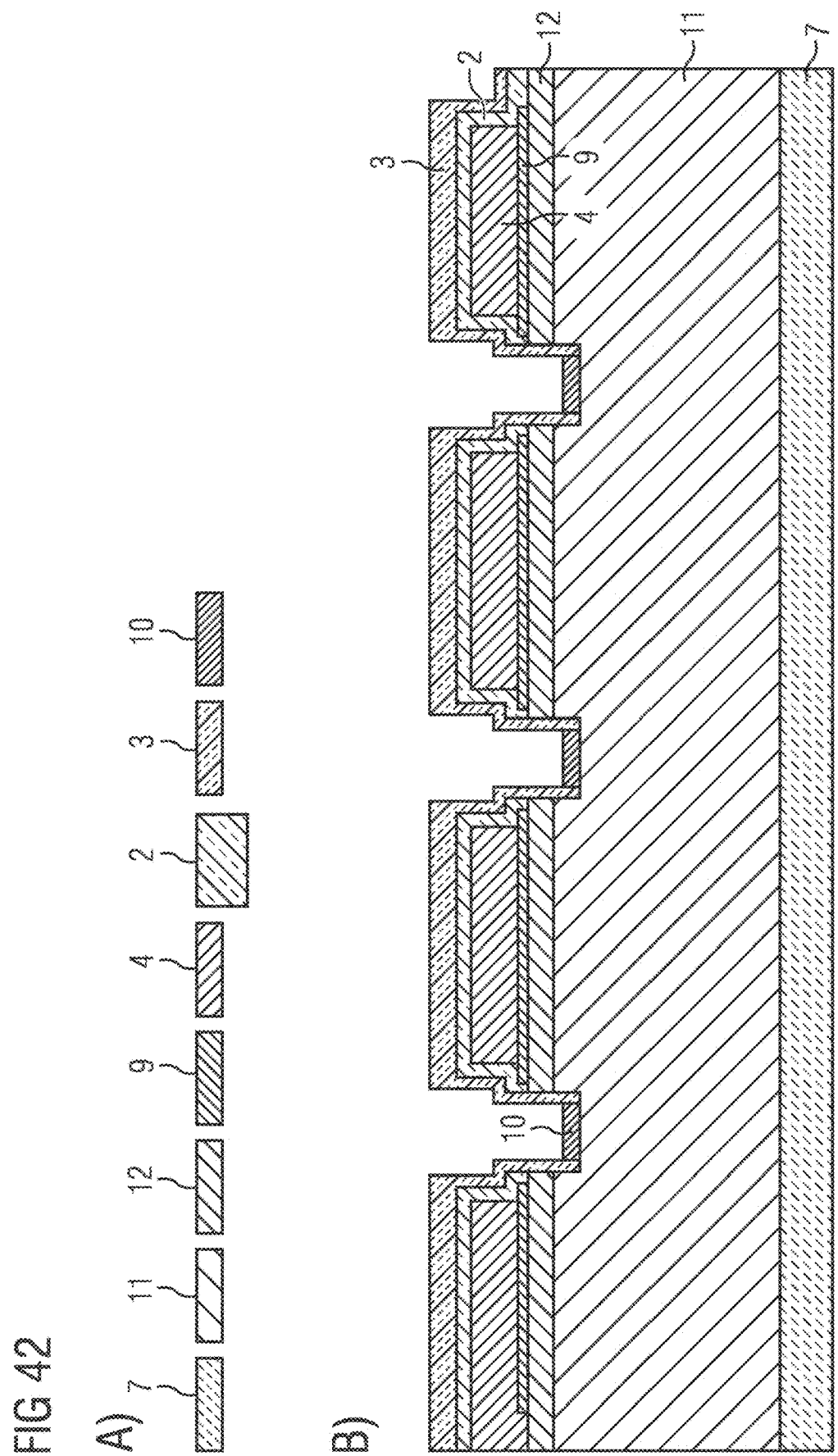
Figure 43:
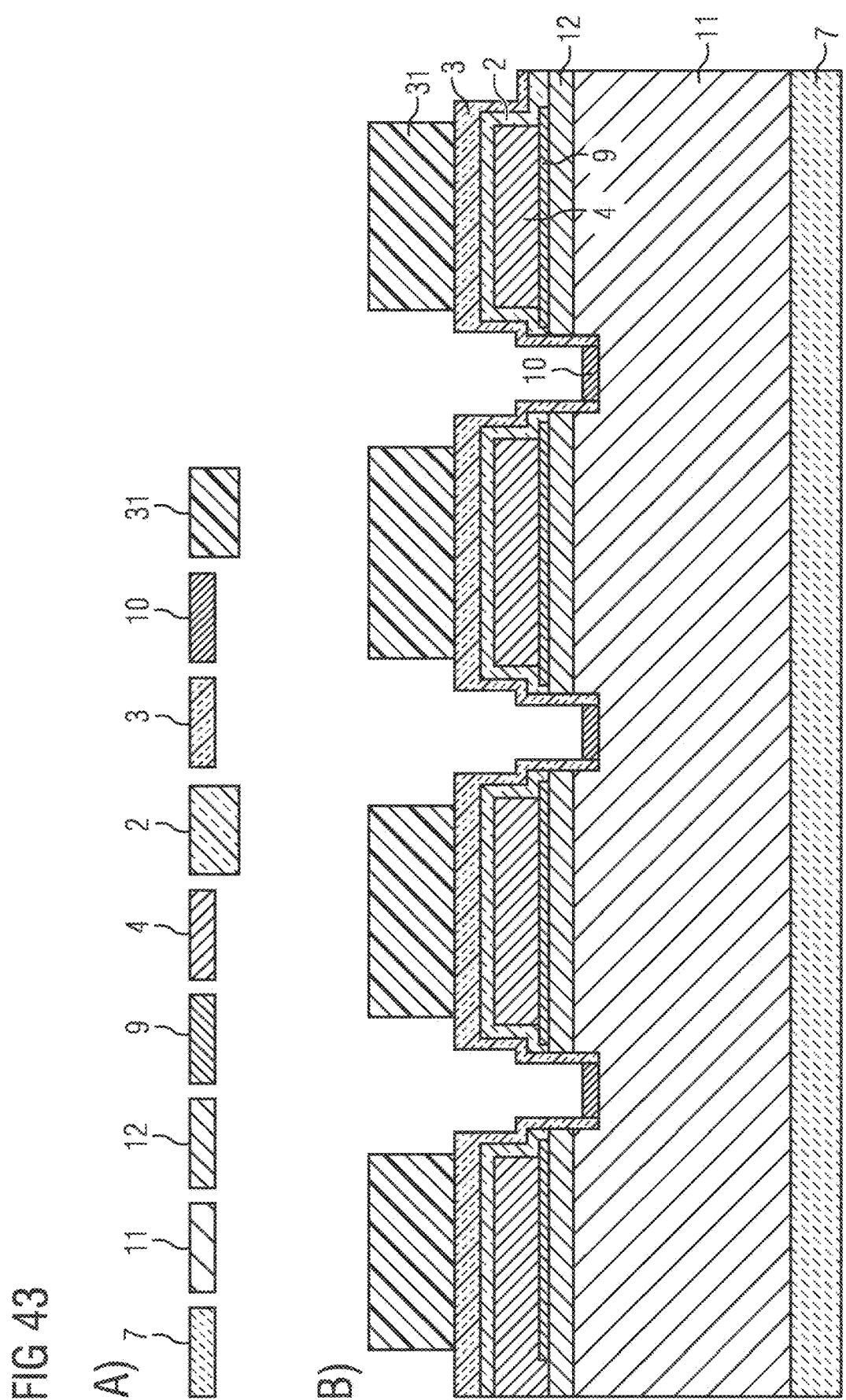
Figure 47:
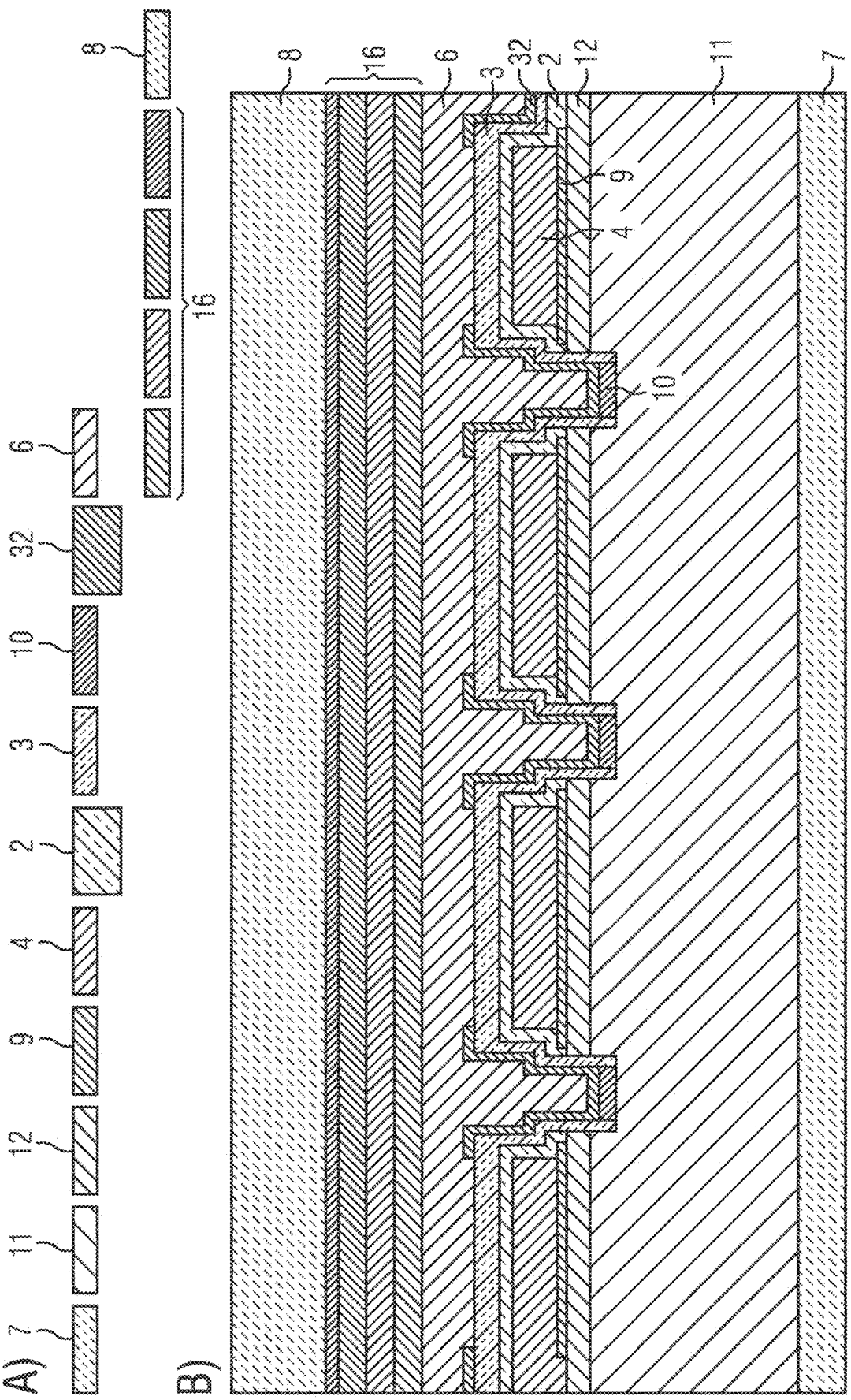
Figure 48:
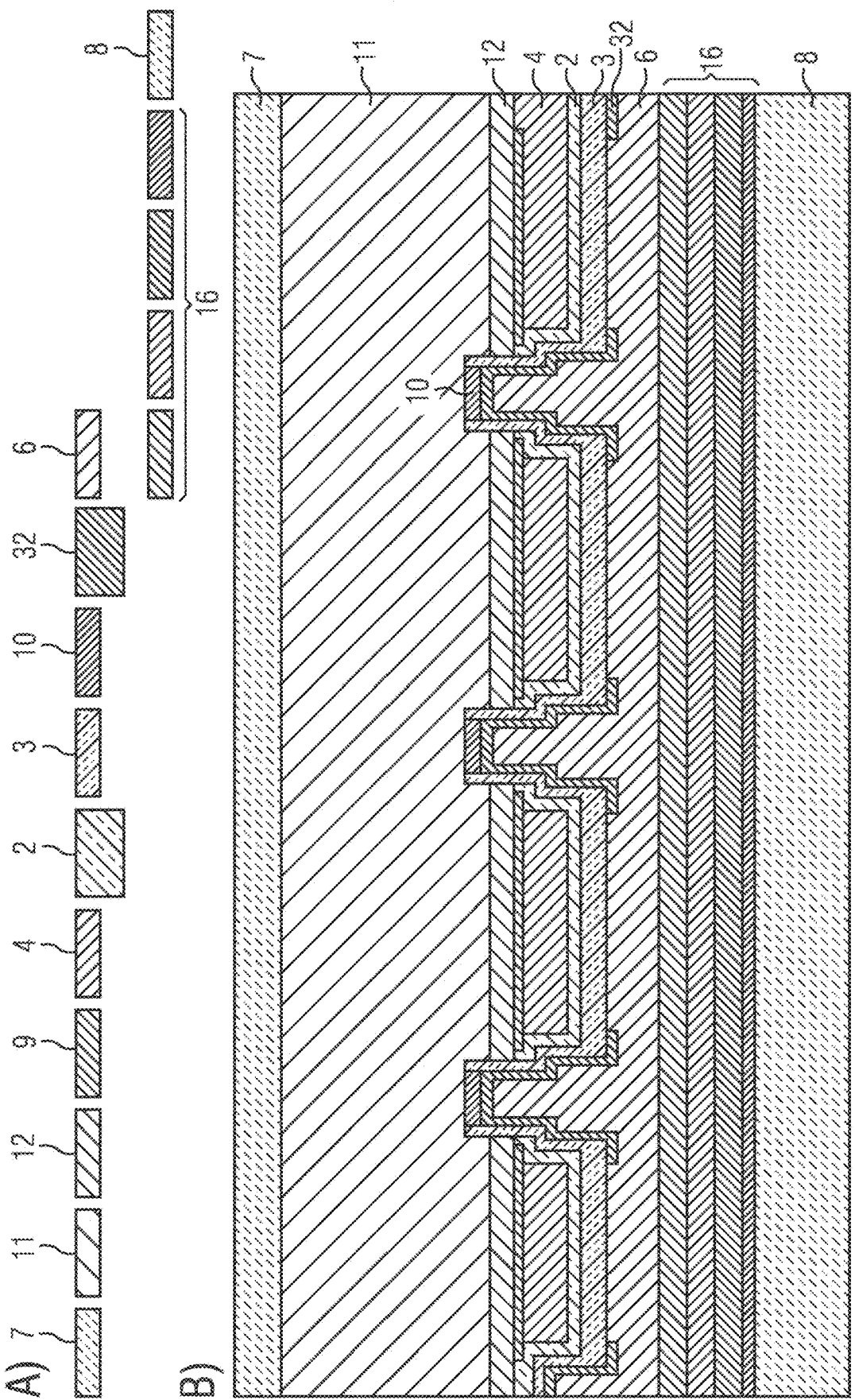
Figure 49:
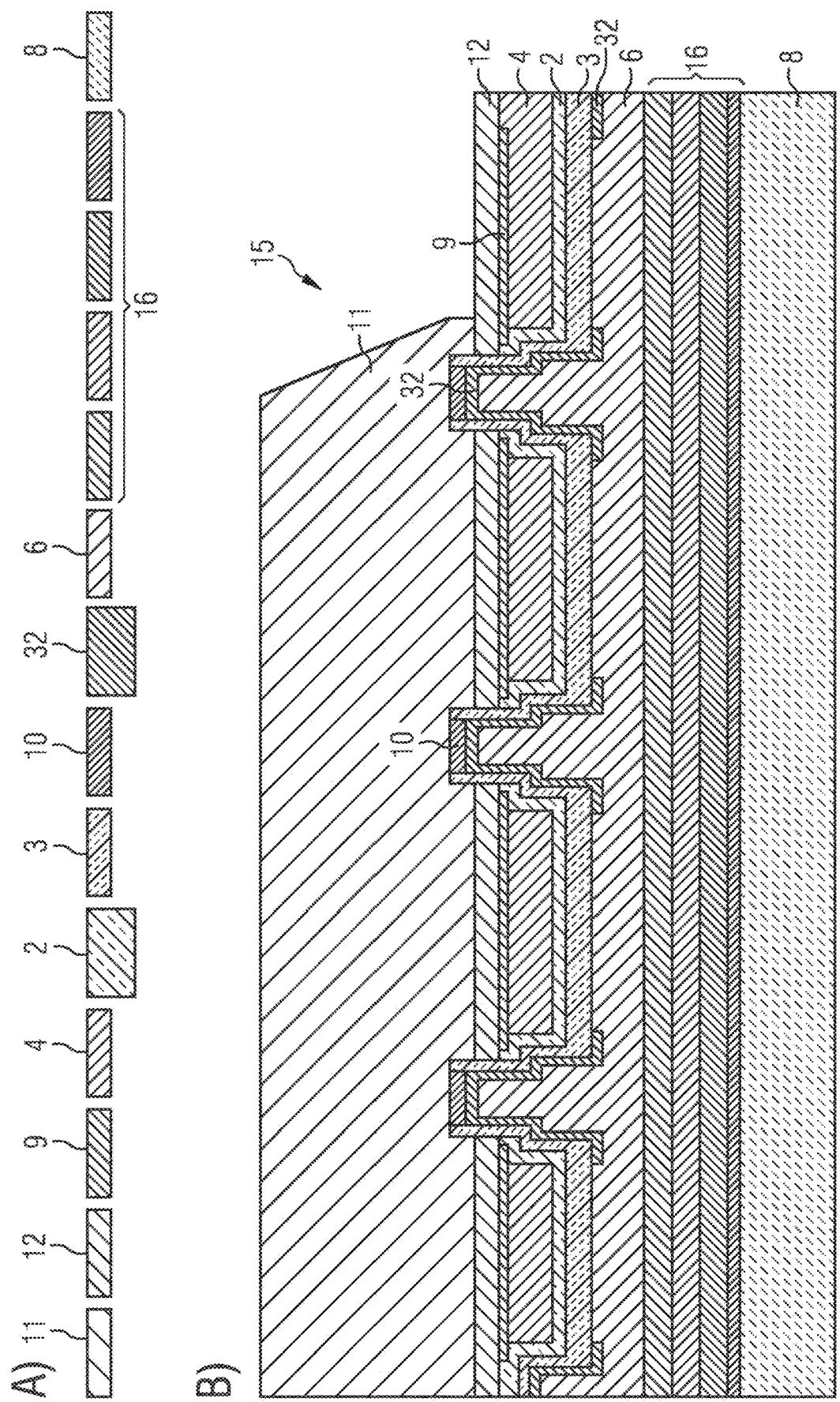
Figure 51:
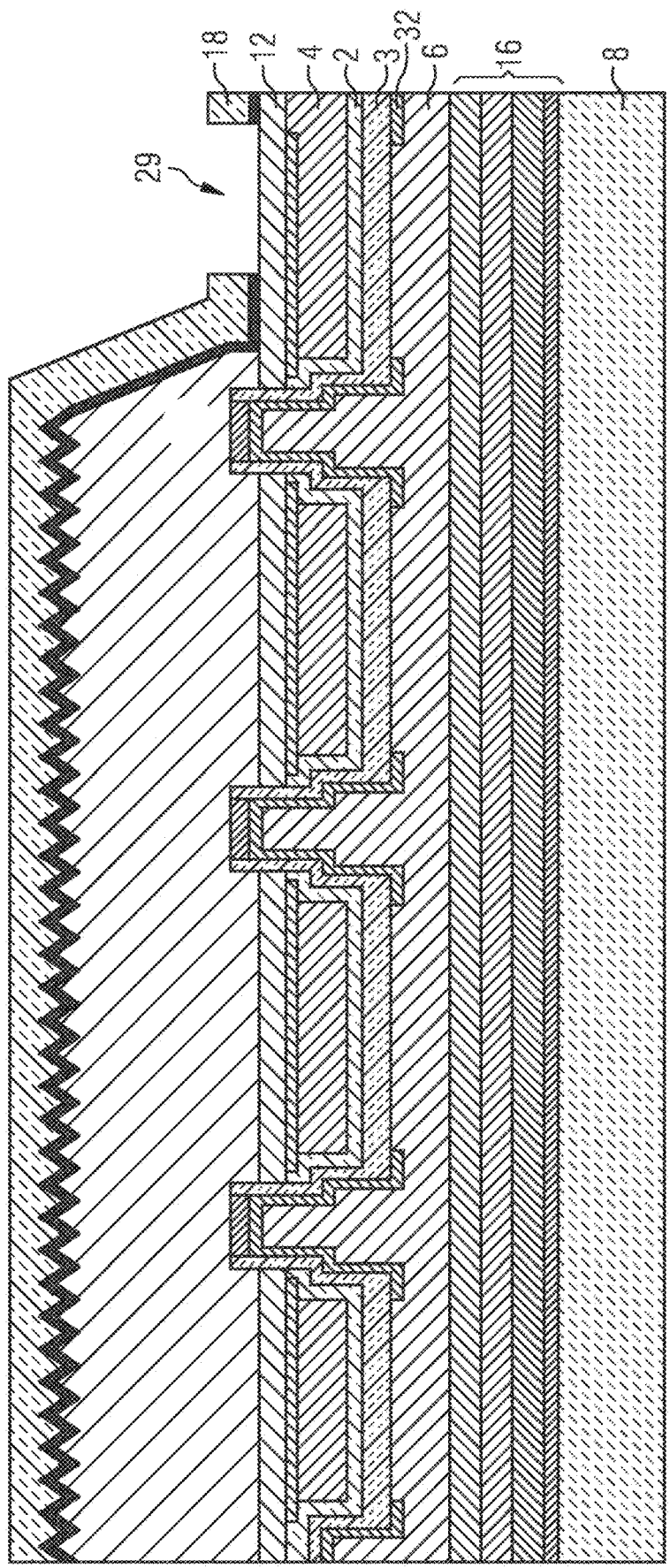

In a subsequent method step, as shown in FIGS. 26A and 26B, a metallization 30 can be introduced into the opening as a contact pad. The remaining resist of the lithography step is subsequently removed with the aid of a plasma-based or a wet-chemical-based process in a so-called lift-off process (LOP).

The process steps indicated in FIGS. 1A to 26B are to be carried out in particular in the sequence indicated here. Alternatively, individual process steps can also be omitted or the sequence can be exchanged.

The inventors have recognized that the method described here includes various novel process steps. The method includes a process step of chemical-mechanical polishing. A vertical first insulation layer 2 can thus be produced, which is used for separating the first and second metallization 4, 5. Moreover, the CMP can be ended when the two metallizations 4, 5 are separated from one another.

A mesa trench can moreover be produced in an earlier process step. To prevent damage to the p-doped semiconductor layer, an, in particular dielectric, layer is arranged as a protective layer on the p-doped semiconductor layer, which can subsequently be removed again. In the method described here, the, in particular dielectric, layer is still in the component, but alternatively can also be removed again.

The mirror elements can be completely or partially applied. The mirror elements may include silver and/or zinc oxide or ITO and/or silicon dioxide or other dielectric materials after the mesa etching. The, in particular dielectric, layer or insulation layer may include materials which have sufficient insulation and moreover reduce the light absorption. A DBR can be used, which includes a combination of repeating units of layers made of silicon dioxide with titanium dioxide, niobium oxide, tantalum oxide, or magnesium fluoride. Moreover, the insulation layers can also be formed from single layers, such as silicon dioxide. After application of the, in particular dielectric, layer, plasma structuring can be performed to be able to apply the first and second metallization simultaneously in a later method step. In this step, the horizontal insulation layer is structured to produce a vertical separation between the p-spreader and the n-VIA. The structuring can be performed differently. A later structuring of the first and second mirror element can be performed. The deposition of the mirror (for p-GaN and n-GaN) can take place in different forms. The following scenarios are conceivable in dependence on the respective material. The p-GaN mirror is deposited firstly and completely. The p-GaN mirror is deposited firstly but incompletely. This is possible if the material of the last layer is the same as what is used in the first layer of the n-mirror. Alternatively, however, the n-GaN mirror can also be deposited first. The same as indicated for the p-GaN mirror applies here. If the last layer is identical to the first layer of the following step (p-GaN mirror) with respect to material, the mirror can be incompletely deposited. The sequence and the material combination are very flexible depending on the mirror material.

The metallization can be applied by means of sputtering or PVD or PE-CVD or other methods, such as plating. Gold, silver, or copper or alloys thereof can be used as the metallization. The metallizations are produced in particular after the CMP step, which results in an electrical separation of the first and second metallization and the planarization of the wafer. The CMP is to be stopped at the latest at the step at which the vertical insulation is arranged.

After completion of the CMP, the second insulation layer can be applied horizontally. The application can be performed, for example, by means of CVD, sputtering, PE-CVD, or spin-on, ALD. The second insulation layer may include a material made of silicon dioxide or silicon nitride and can also be formed as a DBR. After the second insulation layer is applied, an opening can be produced in the region of the "n". For this purpose, a photoprocess can be used for the structuring, wherein this photomask is removed again in subsequent process steps. Any metals, for example, gold and silver, can be used as the metallization. A combination metal is typically used, which can be omitted here, however, by using a DBR. This saves further process steps and costs. The semiconductor component can subsequently be treated using further process steps which are known to a person skilled in the art. For example, flipping, laser lift-off (LLO), surface roughening, introduction of mesa trenches, passivation, contact structuring, and metallization.

FIGS. 27A to 52 show a method for producing an optoelectronic component according to a comparative example.

FIGS. 27A and 27B show the provision of a semiconductor layer sequence including a p-doped semiconductor layer 12, an n-doped semiconductor layer 11, an active layer (not shown here) on an auxiliary carrier 7, which is formed from sapphire, for example.

A photostructuring can subsequently be performed using a first mask 19, as shown in FIGS. 28A and 28B. In this case, as shown in FIGS. 29A and 29B, a first mirror element 9 can subsequently be applied in regions which are not covered by the first mask 19 on the p-doped semiconductor layer 12.

In the subsequent method step, as shown in FIGS. 30A and 30B, the first mask 19 can be removed by means of lift-off methods, such as resist strip or wet-chemical lift-off.

Subsequently, as shown in FIGS. 31A and 31B, a second photomask 23 can be applied. The second photomask 23 is to be used to produce the first metallization 4 (p-metallization).

FIGS. 32A and 32B show the application of the first metallization 4, which may include in particular platinum, gold, and titanium. The first metallization 4 is applied between the second mask 23 on the first mirror element 9.

In a subsequent method step, as shown in FIGS. 33A and 33B, the second mask 23 can be removed by means of lift-off methods, such as resist strip and wet-chemical lift-off.

Subsequently, as shown in FIGS. 34A and 34B, a first insulation layer 2 can be applied over the entire surface to the p-doped semiconductor layer 12. The first insulation layer 2 typically corresponds here to a double layer consisting of two insulation materials, such as silicon oxide and silicon nitride.

A next photostructuring step can subsequently be performed. A further third mask 25 can be applied for this purpose, as shown in FIGS. 35A and 35B.

Subsequently, the regions which are not covered by the third photomask 25 and are shown in FIGS. 36A and 36B can be removed. Therefore, the p-doped semiconductor layer 12 and the n-doped semiconductor layer 11 are exposed by means of plasma etching. The third mask 25 can subsequently be removed by means of lift-off methods, such as resist strip or wet-chemical lift-off (see FIGS. 37A and 37B).

FIG. 37C shows a top view of an optoelectronic component according to one comparative example. In this case, the openings which are produced by the structuring are formed ring-shaped.

In contrast to the method according to the embodiment, the openings described here do not include a core of the insulation layer 101.

A second insulation layer 3 can subsequently be applied over the entire surface, as shown in FIGS. 38A and 38B. The second insulation layer 3 can be in multilayered form of three layer pairs made of SiN and $SiO_2$.

FIGS. 39A and 39B show that subsequently a further photo structuring step is performed. A fourth photomask 27 can be applied for this purpose. It is used for producing the second mirror element 10 for the n-doped semiconductor layer 11.

FIGS. 40A and 40B show the structuring step by means of etching and FIGS. 41A and 41B show the application of the second mirror element 10 in the previously structured regions.

The second mirror element 10 can be formed, for example, from zinc oxide and silver.

Subsequently, as shown in FIGS. 42A and 42B, the fourth mask 27 can be removed again.

Subsequently, as shown in FIGS. 43A and 43B, a further photo structuring step can be performed by means of a fifth mask 31. This structuring step is used for applying a so-called combination mirror 32 (see FIGS. 44A and 44B).

The combination mirror 32 can be made, for example, of titanium, silver, platinum, and/or titanium. The combination mirror 32 is applied in the previously structured regions to the second mirror element 10.

Subsequently, as shown in FIGS. 45A and 45B, the fifth mask can be removed by means of lift-off methods, such as resist strip or wet-chemical lift-off.

In a subsequent method step, as shown in FIGS. 46A and 46B, the third metallization 6 for contacting the n-doped semiconductor layer 11 can be applied over the entire surface. The third metallization 6 may include titanium, platinum, gold, and nickel.

The contact metallization 16, as already described with respect to the method according to the exemplary embodiment and to which reference is made here, can subsequently be applied.

The carrier 8 can also subsequently be applied and the auxiliary carrier 7 can be removed. The carrier 8 can be made of silicon (see FIGS. 47A to 48B).

FIGS. 49A and 49B show the introduction or etching of a mesa trench 15 within the n-doped semiconductor layer 11 similarly to the method as was described according to the exemplary embodiment.

Figure 52:
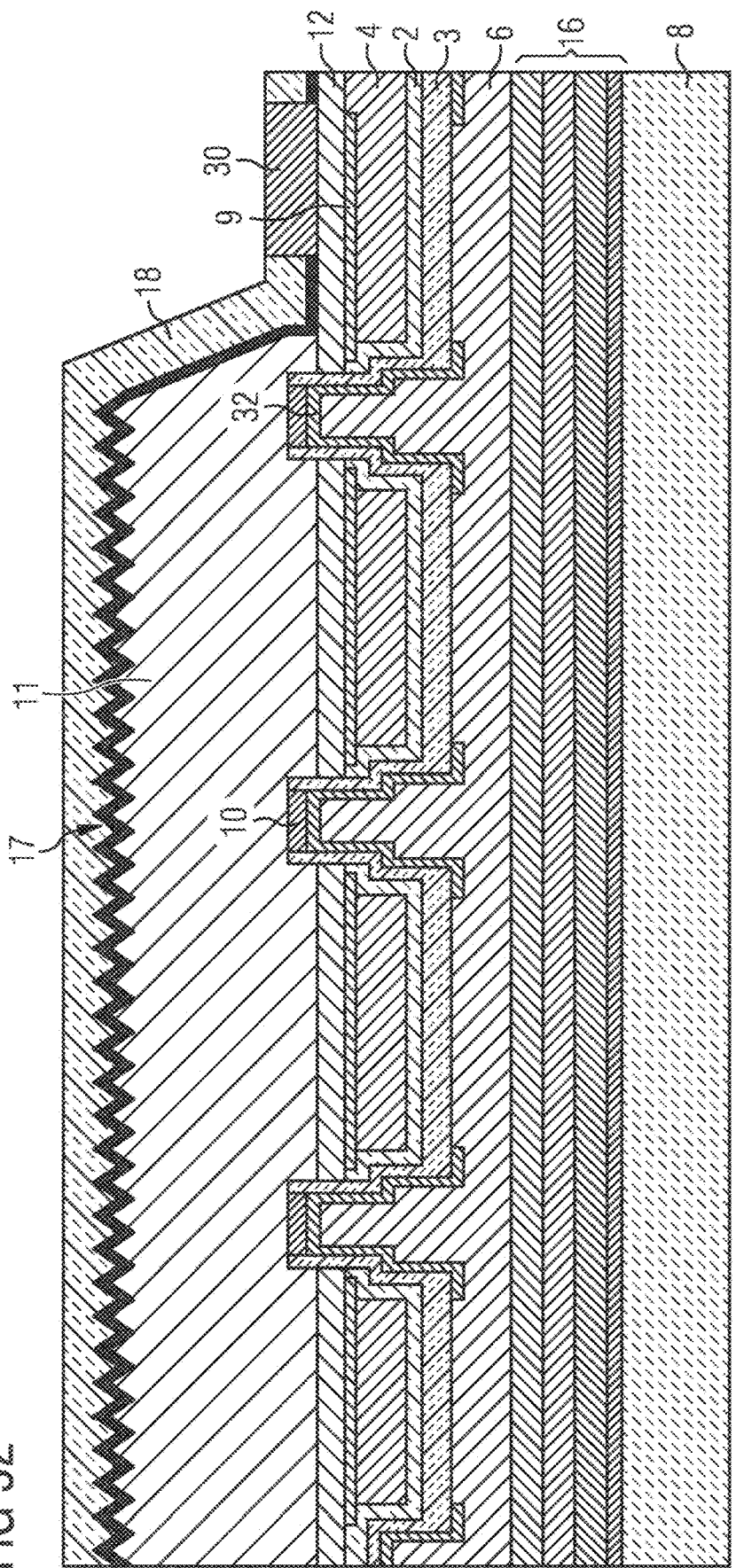

Subsequently, as shown in FIGS. 50A and 50B, the n-doped semiconductor layer 11 can be roughened 17 and a passivation layer 18 can be applied. The passivation layer 18 can be opened again (FIG. 51) to introduce a contact pad 30 (FIG. 52).

A component results which is also known as a so-called UX3 chip. In comparison to the method described here, no chemical-mechanical polishing is performed here according to one embodiment. Moreover the first metallization and second metallization are also not applied in one step, in particular simultaneously in time.

According to at least one embodiment, the first metallization and the second metallization 4, 5 include the same material or the same material composition. Moreover, the component described here may include a structured insulation layer formed as a double ring, which includes a core of the first insulation layer, wherein the second metallization 5 encloses the core of the first insulation layer 102 in a ring shape.

The exemplary embodiments described in conjunction with the figures and the features thereof can also be combined with one another according to further exemplary embodiments, even if such combinations are not explicitly shown in the figures. Furthermore, the exemplary embodiments described in conjunction with the figures may include additional or alternative features according to the description in the general part.

The invention is not restricted thereto by the description on the basis of the exemplary embodiments. Rather, the invention includes any novel feature and any combination of features which includes in particular any combination of features in the patent claims, even if this feature or this combination itself is not explicitly specified in the patent claims or exemplary embodiments.

This patent application claims the priority of German patent application 10 2017 117 414.1, the content of the disclosure of which is hereby incorporated by reference.

LIST OF REFERENCE SIGNS 100 optoelectronic component
1 semiconductor layer sequence
11 n-doped semiconductor layer
12 p-doped semiconductor layer
13 active layer
2 first insulation layer
21 first layer of the first insulation layer
22 second layer of the second insulation layer
101 side walls of the first insulation layer
102 core of the first insulation layer
3 second insulation layer
4 first metallization (p-metallization)
5 second metallization (n-metallization)

6 third metallization
7 auxiliary carrier
8 carrier
9 first mirror element
10 second mirror element
14 in particular dielectric layer
15 trench
16 contact metallization
17 roughening
18 passivation layer
19 first mask
20 first structuring
23 second mask
24 second structuring
25 third mask
26 CMP (chemical-mechanical polishing)
261 planar surface
27 fourth mask
28 fourth structuring
29 structuring
31 fifth mask
32 combination mirror
33 passages
330 side walls
30 pad metallization
34 double ring-shaped
35 ring-shaped

The invention claimed is:

1. A method for producing an optoelectronic component comprising:
providing a semiconductor layer sequence on an auxiliary carrier, wherein the semiconductor layer sequence comprises at least one n-doped semiconductor layer, at least one p-doped semiconductor layer, and an active layer arranged between the p-doped and n-doped semiconductor layers;
applying a first insulation layer over an entire surface of the n-doped semiconductor layer;
structuring the first insulation layer; wherein the structuring of the first insulation layer is performed between adjacent structured regions of the p-doped semiconductor layer, wherein the first insulation layer is structured in a ring shape or wherein the first insulation layer is structured in a double ring shape such that a core of the first insulation layer is produced, which is enclosed in a ring shape by a second metallization;
applying a first metallization for contacting the p-doped semiconductor layer and the second metallization for contacting the n-doped semiconductor layer over the entire surface of the n-doped semiconductor layer, so that the first metallization and the second metallization are connected to one another;
chemically-mechanically polishing the first metallization and the second metallization, so that a planar surface is produced and the first metallization and the second metallization are spatially separated from one another; and
applying a second insulation layer for the electrical insulation of the first metallization and the second metallization and subsequently structuring the second insulation layer.

2. The method as claimed in claim 1,
wherein the first metallization and the second metallization are produced simultaneously.

3. The method as claimed in claim 1 further comprising applying a dielectric layer to the p-doped semiconductor layer.

4. The method as claimed in claim 3, further comprising structuring the p-doped semiconductor layer such that the n-doped semiconductor layer is exposed, wherein the exposure of the n-doped semiconductor layer is performed by means of a first mask and plasma etching.

5. The method as claimed in claim 1,
wherein the first insulation layer and/or the second insulation layer is applied as a distributed Bragg reflector having an alternating layer sequence made of silicon dioxide and titanium dioxide or silicon dioxide and niobium oxide.

6. The method as claimed in claim 1,
further comprising applying a first mirror element to the p-doped semiconductor layer and/or a second mirror element for the n-doped semiconductor layer.

7. The method as claimed in claim 6,
wherein the first mirror element comprises silver and zinc oxide, wherein the proportion of the silver in the first mirror element is greater than the proportion of the zinc oxide or wherein the second mirror element comprises silver and zinc oxide, wherein the proportion of the silver in the second mirror element is less than the proportion of the zinc oxide.

8. The method as claimed in claim 1,
wherein the second mirror element is applied over the entire surface of the n-doped semiconductor layer.

9. The method as claimed in claim 1,
wherein the first metallization and/or the second metallization is applied by sputtering, PVD, PE-CVD, or plating, and/or wherein the first metallization and/or the second metallization comprises platinum, gold, titanium, or combinations thereof.

10. The method as claimed in claim 1, further comprising applying a third metallization; and/or
applying a contact metallization.

11. The method as claimed in claim 10, further comprising re-bonding the arrangement on a carrier, wherein the carrier comprises silicon.

12. The method as claimed in claim 11, further comprising introducing a trench at least into the one n-doped semiconductor layer.

13. The method as claimed in claim 1, further comprising roughening the semiconductor layer sequence on the side opposite to the carrier and applying a passivation layer to the n-doped semiconductor layer.

14. An optoelectronic component comprising:
a semiconductor layer sequence, wherein the semiconductor layer sequence comprises at least one n-doped semiconductor layer, at least one p-doped semiconductor layer, and an active layer arranged between the p-doped and n-doped semiconductor layers,
a plurality of passages, which extend through the p-doped semiconductor layer to the n-doped semiconductor layer, wherein the passages are formed in the shape of a double ring observed in a top view and are arranged laterally in relation to the p-doped semiconductor layer at least in regions observed in lateral cross section, wherein the passages comprise side walls covered by a first insulation layer, wherein a core of the first insulation layer is arranged inside the passages, wherein a second metallization for contacting the n-doped semiconductor layer, which encloses the core of the first insulation layer in a ring shape observed in a top view, is arranged between the core of the first insulation layer and the first insulation layer covering the side walls of the passages observed in lateral cross section.

15. The optoelectronic component as claimed in claim 14, wherein the first insulation layer is a distributed Bragg reflector having an alternating layer sequence made of silicon dioxide and titanium dioxide or silicon dioxide and niobium oxide.

16. The optoelectronic component as claimed in claim 14, wherein a first mirror element is arranged over the p-doped semiconductor layer and/or a second mirror element is arranged over the n-doped semiconductor layer.

17. A method for producing an optoelectronic component comprising:
- providing a semiconductor layer sequence on an auxiliary carrier, wherein the semiconductor layer sequence comprises at least one n-doped semiconductor layer, at least one p-doped semiconductor layer, and an active layer arranged between the p-doped and n-doped semiconductor layers;
- applying a first insulation layer over an entire surface of the n-doped semiconductor layer;
- structuring the first insulation layer;
- applying a first metallization for contacting the p-doped semiconductor layer and a second metallization for contacting the n-doped semiconductor layer over the entire surface of the n-doped semiconductor layer, so that the first metallization and the second metallization are connected to one another;
- chemically-mechanically polishing the first metallization and the second metallization, so that a planar surface is produced and the first metallization and the second metallization are spatially separated from one another;
- applying a second insulation layer for the electrical insulation of the first metallization and the second metallization and subsequently structuring the second insulation layer; and
- applying a first mirror element to the p-doped semiconductor layer and/or a second mirror element for the n-doped semiconductor layer.

\* \* \* \* \*